United States Patent [19]

Saylor

[11] 4,129,748

[45] Dec. 12, 1978

[54] PHASE LOCKED LOOP FOR PROVIDING CONTINUOUS CLOCK PHASE CORRECTION

[75] Inventor: Richard Saylor, Monsey, N.Y.

[73] Assignee: IDR, Inc., Farmingdale, N.Y.

[21] Appl. No.: 679,701

[22] Filed: Apr. 23, 1976

Related U.S. Application Data

[63] Continuation-in-part of Ser. No. 611,843, Sep. 10, 1975, Pat. No. 4,042,958.

[51] Int. Cl.² ............................................. H04L 7/00
[52] U.S. Cl. .................................. 178/69.1; 358/83; 358/141
[58] Field of Search .................... 178/69.1; 358/83, 35, 358/141, 142

[56] References Cited

U.S. PATENT DOCUMENTS

| 3,033,928 | 5/1962 | Biggam et al. | 179/69.1 |
| 3,141,930 | 7/1964 | Krauss | 178/69.1 |
| 3,550,132 | 12/1970 | Kurth et al. | 178/69.1 |

*Primary Examiner*—Richard Murray
*Attorney, Agent, or Firm*—Hubbell, Cohen, Stiefel & Gross

[57] ABSTRACT

A phase locked loop apparatus for providing a continuous output digital clock signal having first and second states which is continuously phase locked to a reference digital data signal, which digital data signal comprises at least one data transition, utilizes every data transition to continuously correct the clock phase. For pseudo video scan lines, such as utilized for row grabbing, when such scan lines contain a start bit, the phase locked loop makes a single correction each empty or non-data line utilizing the start bit to insure that phase lock exists at the beginning of the first non-empty or digital data containing scan line. The phase locked loop contains a voltage controlled oscillator operating in conjunction with a flip-flop functioning as a phase detector, with the state of the flip-flop being dependent on the phase condition between the digital data signal and the digital clock signal.

20 Claims, 34 Drawing Figures

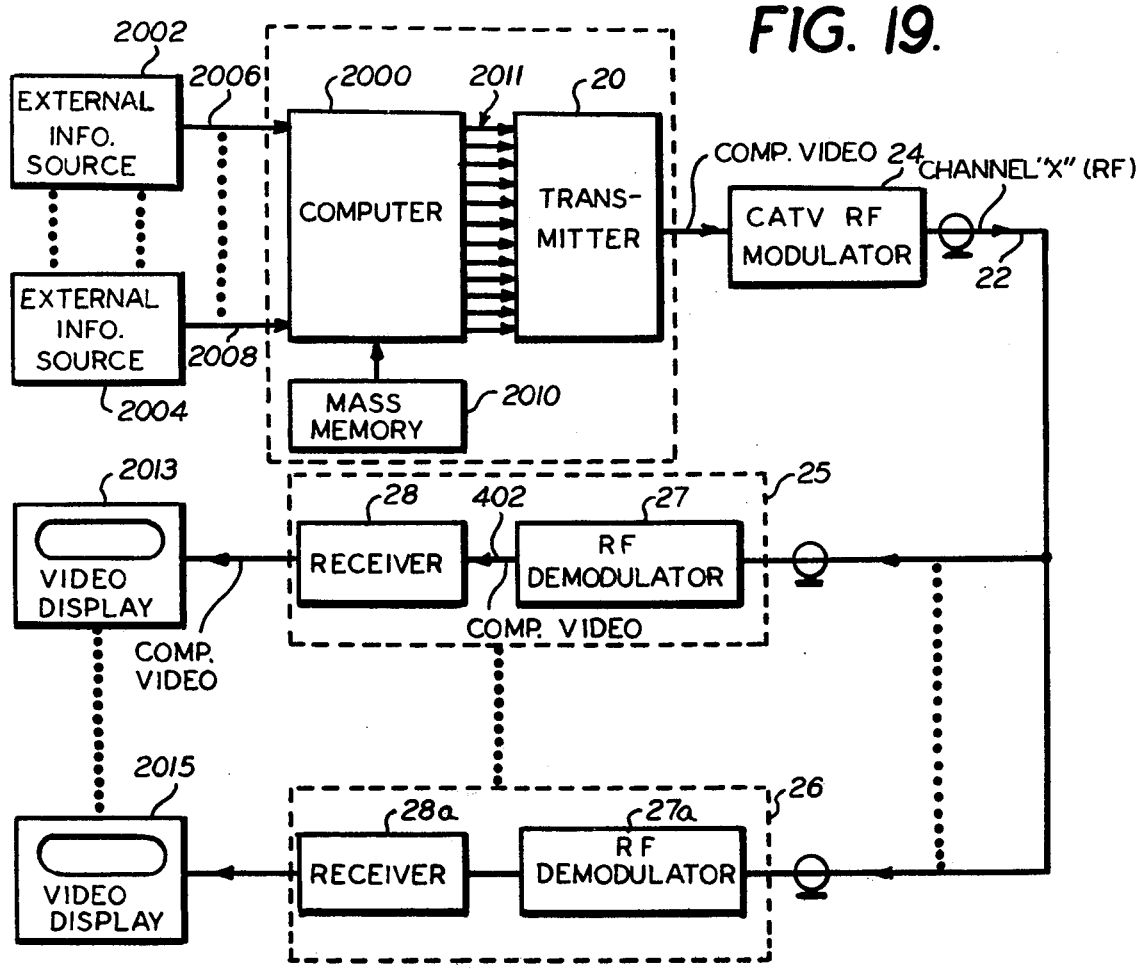
FIG. 19.
FIG. 21A. ORIGINAL UNDISTORTED TRANSMISSION
FIG. 21B. RECEIVED SIGNAL (INPUT TO 111)
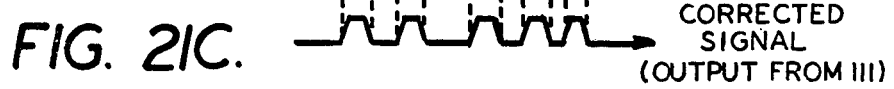
FIG. 21C. CORRECTED SIGNAL (OUTPUT FROM 111)

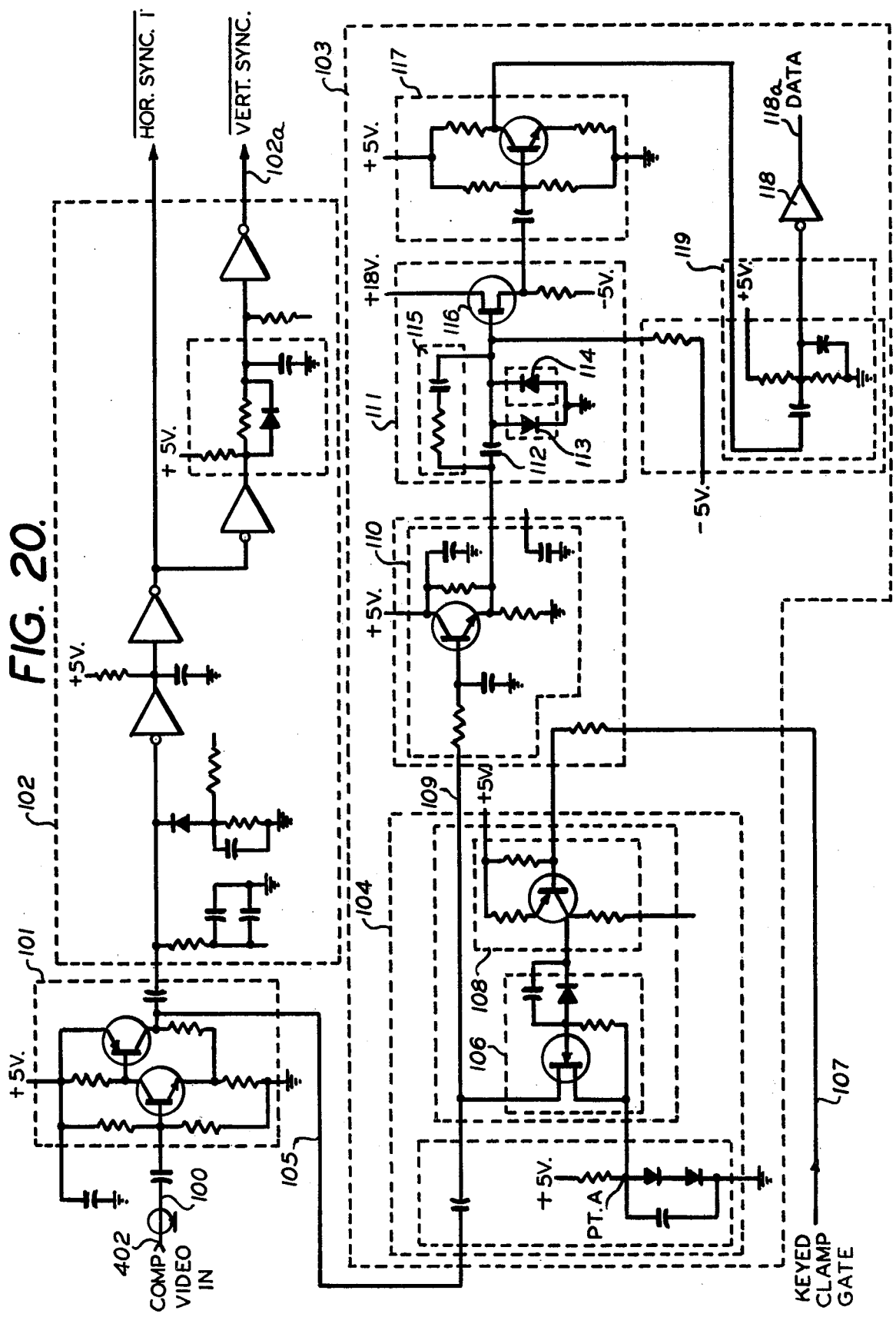

PHASE LOCKED LOOP FOR PROVIDING CONTINUOUS CLOCK PHASE CORRECTION

CROSS-REFERENCE TO RELATED APPLICATIONS

This application is a continuation-in-part of a copending U.S. patent application entitled "Improved Row Grabbing System," filed Sept. 10, 1975, and bearing U.S. Ser. No. 611,843, now Pat. No. 4,042,958, and is related to the following: U.S. Pat. No. 3,889,054, issued June 10, 1975; and the commonly owned copending U.S. patent application of Robert H. Nagel entitled "Information Retrieval System Having Selectable Purpose Variable Function Terminal," filed Sept. 10, 1975, and bearing U.S. Ser. No. 611,937; my commonly owned copending U.S. patent application entitled "Interface For Enabling Continuous High Speed Row Grabbing Video Display With Real Time Hard Copy Print Out Thereof," filed Apr. 23, 1976 and bearing U.S. Ser. No. 679,907; the commonly owned copending U.S. patent application of Leonard Wintfeld and Robert H. Nagel entitled "Row Grabbing Video Display Terminal Having Local Programmable Control Thereof," filed Apr. 23, 1976 and bearing U.S. Ser. No. 679,558; and my commonly owned copending U.S. patent application entitled "Digital Video Signal Processor With Distortion Correction," filed Apr. 23, 1976 and bearing U.S. Ser. No. 679,909, the contents all of which are specifically incorporated by reference herein.

BACKGROUND OF THE INVENTION

The present invention relates to digital signal communication systems such as such systems in which a digital video signal is processed for providing video communication.

DESCRIPTION OF THE PRIOR ART

Video communication systems in which individual frames may be grabbed for video display are well known, such as the system disclosed in U.S. Pat. No. 3,740,465, or a system employing the Hitachi frame grabbing disc. These prior art systems such as the one disclosed in U.S. Pat. No. 3,746,780 are normally two-way request response systems requiring the user to request information by the dialing of a specific digital code which is uniquely assigned to each frame. However, such systems normally grab a group of frames for storage and then subsequently select the individual frame for display out of the group of grabbed frames as opposed to instantaneously selecting a single frame in real time. Furthermore, such prior art systems do not provide for real time updating of the grabbed video frame. Furthermore, some such prior art frame grabbing systems, such as the type dislcosed in U.S. Pat. No. 3,397,283, are normally capable of only grabbing the next immediate signal in response to the provision of a starter signal or, as disclosed in U.S. Pat. No. 3,051,777, utilize a counter for frame location which must be reset to the beginning of a tape for video tape supplied information in order to locate a selected frame to be grabbed. These systems are not applicable in a real time frame grabbing environment. Similarly, other typical prior art frame grabbing systems, such as disclosed in U.S. Pat. Nos. 3,695,565; 2,955,197; 3,509,274; 3,511,929 and 3,582,651, cannot be utilized in a real time frame grabbing environment, such as one in which the video information associated with the grabbed frame is capable of being continuously updated. Accordingly, presently available prior art frame grabbing systems familiar to the Inventor are not capable of easily locating a frame to be grabbed in real time nor of being able to continuously update such a grabbed frame in real time.

Video communication systems in which the signal being transmitted is digitized are also well known. For example, U.S. Pat. No. 3,743,767 discloses a video communication system for the transmission of digital data over standard television channels wherein the digital data is transmitted in a conventional television scan line format through conventional television distribution equipment. However, such a prior art communication system merely digitizes one television scan line at a time for distribution to a video display terminal on a bit-by-bit basis in a line, 84 bits of information being provided per television scan line. Furthermore, such a prior art system is not transmission selectable by every display terminal nor is the data for a displayable video row packed into a self-contained pseudo video scan line information packet. Thus, there is no significant increase in the data transmission rate resulting from such a prior art video communication system. Similarly, U.S. Pat. Nos. 3,061,672 and 3,569,617 and German Pat. No. 2,307,414 are examples of other prior art video communication systems in which television signals are digitized without any significant resultant compression in data transmission time. Furthermore, these other prior art systems require special distribution circuitry. In addition, prior art video communication systems in which a digital television signal is transmitted do not sufficiently isolate the individual rows comprising a frame so as to provide satisfactory noise immunity between these rows nor is there satisfactory data compression in the transmission time of the video information in such prior art systems nor satisfactory distortion compensation.

Moreover, in such prior art video communication systems known to the Inventor, the logic data extracted from the digital input data may contain significant signal distortions, such as signal distortions resulting from use of a conventional vestigal sideband modulation scheme for transmission as well as from phase delay distortion in the cable transmission system used to transmit the signal and the bandwidth limitations inherent in the FCC channel allocations for conventional video transmission. These distortions occur in any TV transmission and are not generally compensated for due to low required levels of fidelity. However, when high levels of fidelity are required, the prior art systems known to the Inventor do not adequately compensate for both one-to-zero and zero-to-one transition distortions which manifest themselves in the zeros and ones comprising the input digital signal not always returning to the same level, thus providing unsatisfactory results.

Furthermore, in such prior art video communication systems known to the Inventor, as well as such prior art digital communication systems, precise enough control of the phasing between the clock signal and a reference digital data signal, such as a signal being processed, is not provided where the phase locked loop utilized for maintaining such phasing does not correct for clock phase every data transition in the digital data signal. Thus, in a system requiring such precise control, such intermitent clock phase correction is not satisfactory. These disadvantages of the prior art are overcome by the present invention.

SUMMARY OF THE INVENTION

A phase locked loop apparatus is provided for providing a continuous output digital clock signal having first and second states which is continually phase locked to a reference digital data signal, such as a pseudo video scan line. The digital data signal preferably comprising at least one data transition although where such signal contains a plurality of data transitions, the phase locked loop utilizes every data transition to continuously correct the clock phase. The phase locked loop comprises variable voltage controlled oscillator means having a predetermined variable nominal frequency with the output digital clock signal being provided at the output of the oscillator. Bistable phase detection means, such as a D type flip-flop, having a pair of inputs for varying the state of the bistable phase detection means between the first and second state, such as between a set and reset state, is also provided with the bistable means having a first control signal output in the first state thereof and a second control signal output in the second state thereof. One of the inputs of the bistable means, such as the D input of a D type flip-flop, is connected in parallel to the voltage controlled oscillator output for detecting the clock signal output. The other input of the bistable means, such as the clock input of a D type flip-flop, is connected to substantially simultaneously detect the reference digital data signal. The bistable phase detection means is responsive to the state of the clock signal and the occurrence of the data transition in the substantially simultaneously detected digital data signal for varying the bistable means state. The bistable means is in the first state in response to the substantially simultaneous detection of the clock signal first state and the digital data transition and in the second state in response to the substantially simultaneous detection of the clock signal second state and digital data transition for providing a change in the bistable means control signal output only when the phasing of the clock signal changes with respect to the phasing of the data signal. The first bistable means output control signal is indicative of a phase lead condition between the clock signal and the data signal and the second bistable means output control signal is indicative of a phase lag condition between the clock signal and the data signal. Means, such as capacitive means, are operatively connected between the bistable means first and second control signal outputs and the oscillator means input for providing a control voltage signal to the oscillator means input to vary the nominal frequency thereof in response to the bistable means provided control signal output for maintaining the continuous phase lock. The aforementioned capacitive means has a variable voltage signal output therefrom and is responsive to one of the control signal outputs for charging to increase its voltage signal output in response thereto and is responsive to the other one of the control signal outputs for discharging to decrease its voltage signal output in response thereto. The respective charging and discharging of the capacitive means to vary the voltage signal output thereof occurs as long as the phase condition associated with the respective control signal output remains. Diode means are preferably operatively connected between the capacitive means and the bistable means control signal outputs for providing respective charge and discharge paths for the capacitive means in response to the respective first and second control signal outputs. In addition, if the digital data signal has a valid data duration defining the period during which valid data is transmitted, the phase locked loop may include a gating means operatively connected between the bistable means control signal output and the diode means for gating the respective bistable means first and second control signal outputs to the diode means only during the valid data duration.

The phase locked loop may comprise part of an improved real time frame grabbing video display terminal for substantially instantaneously providing a continuous direct video display of a selectable predetermined video frame of information on a video display means from continuously receivable information remotely provided over a transmission media wherein the continuously receivable information comprises a plurality of pseudo video scan lines, such as a terminal comprising microcomputer means for controlling the operation thereof and selection means operatively connected to the microcomputer means for variably selecting the predetermined video frame to be continuously displayed. Furthermore, the aforementioned improved terminal may be comprised in an improved real time frame grabbing system for substantially instantaneously providing a continuous video display of a selectable predetermined video frame of information on a video display means from continuously transmittable video information, wherein the improved system comprises means for transmitting this information as a plurality of pseudo video scan lines which each contain a horizontal sync signal as a record separator between adjacent pseudo video scan lines and in which a vertical sync signal is transmitted after a predetermined plurality of pseudo video scan lines with the pseudo video scan line being a composite video signal, such improved system further comprising television signal distribution means, such as comprising coaxial cable, for distributing the transmitted composite pseudo video scan line signals to the video display means for providing the continuous video display with the aforementioned improved receiver or terminal being operatively connected between the television signal distribution means and the video display means for processing the distributed composite video scan line signals for providing a displayable video row signal to the video display means from each of the pseudo video scan line signals pertaining to the selected frame for providing a continuous video display. In such an improved system, more precise control is maintained by utilizing every data transition to continuously correct the clock phase. In the case of a series of empty lines being transmitted, the improved phase locked loop in such a system will make a single correction each pseudo video scan line utilizing the start bit contained in such a scan line with this correction being adequate to insure that phase lock exists at the beginning of the first non-empty or data containing line. Thus, precise control is maintained over the processing of the pseudo video scan lines to provide the continuous video display.

BRIEF DESCRIPTION OF DRAWINGS

FIG. 19 is a functional block diagram of the preferred embodiment of the improved row grabbing system of the present invention;

FIG. 20 is a schematic diagram of the video processor portion of the improved preferred receiver of the present invention illustrated in FIG. 5, illustrating the preferred signal distortion compensating apparatus forming a part thereof;

FIGS. 21A, 21B and 21C are graphic illustrations of the various waveforms present throughout the video processor of FIG. 20 which illustrate the operation of the signal distortion compensating apparatus of FIG. 20 therein;

DETAILED DESCRIPTION OF THE PREFERRED EMBODIMENTS

General System Description

Figure 1:
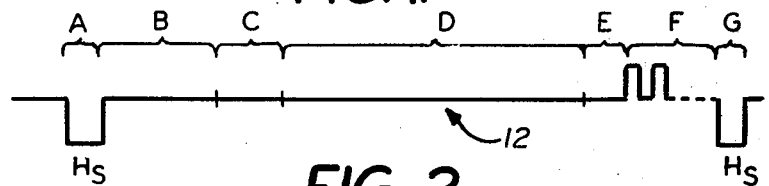
FIG. 1 is a diagrammatic illustration of a typical pseudo video scan line format in accordance with my previous U.S. Pat. No. 3,889,054.

Referring now to the drawings in detail and initially to FIG. 19 thereof, the preferred embodiment of the row grabbing system, generally referred to by the reference numeral 10, described in our previously issued U.S. Pat. No. 3,889,054, of which the foregoing invention is an improvement thereon is shown. As shall be described in greater detail hereinafter, the general system description of the present invention is essentially similar to that previously given in the aforementioned U.S. Pat. No. 3,889,054 with the exception that the present improved row grabbing system preferably utilizes a microcomputer control in the receiver portion in place of some of the hard-wiring control functions performed by the row grabbing system described in U.S. Pat. No. 3,889,054. For purposes of clarity, where applicable, the appropriate pertinent portions of the row grabbing system described in our U.S. Pat. No. 3,889,054 will be reiterated herein, the balance of the applicable description therein being specifically incorporated by reference herein. The row grabbing system 10 of the present invention is preferably a one-way frame grabbing system in which continuously transmitted information or messages are transmitted via pseudo video scan lines 12a, illustrated in FIGS. 2 and 3, on a row-by-row basis, with the pseudo video scan line 12a preferably being identical in format to a conventional video scan line; that is, it is consistent with FCC and EIA standards for a video scan line signal format. However, this pseudo video scan line 12a actually contains a row of information such as approximately between 11 and 13 actual television video scan lines of information, with the transmission time of the pseudo video scan line 12a preferably being equal to the transmission time of a conventional TV video scan line, which is approximately 63 microseconds. The various portions of the pseudo video scan line 12a will be described in greater detail hereinafter with reference to FIGS. 2 and 3 and it should be noted at this time that the format for the preferred pseudo video scan line 12a of the present invention is similar, with certain exceptions to be described hereinafter, to the previously preferred format for the pseudo video scan line 12, illustrated in FIG. 1, which was described in our previously issued U.S. Pat. No. 3,889,054, with identical regions thereon being given the same reference designations. As was shown in that patent, in the row grabbing system 10 of the present invention, the information is updated on a row-by-row basis by transmission of a pseudo video scan line containing new information so that the frame being grabbed will effectively have this row containing new information updated when this row of information is updated in memory. In the preferred system 10 of the present invention, as well as in the system described in U.S. Pat. No. 3,899,054, continuously transmitted information or messages may be instantaneously "grabbed" in real time so as to repetitively provide a video display of a selected video frame of such information which may be updated on a row-by-row basis in real time.

Figure 15:
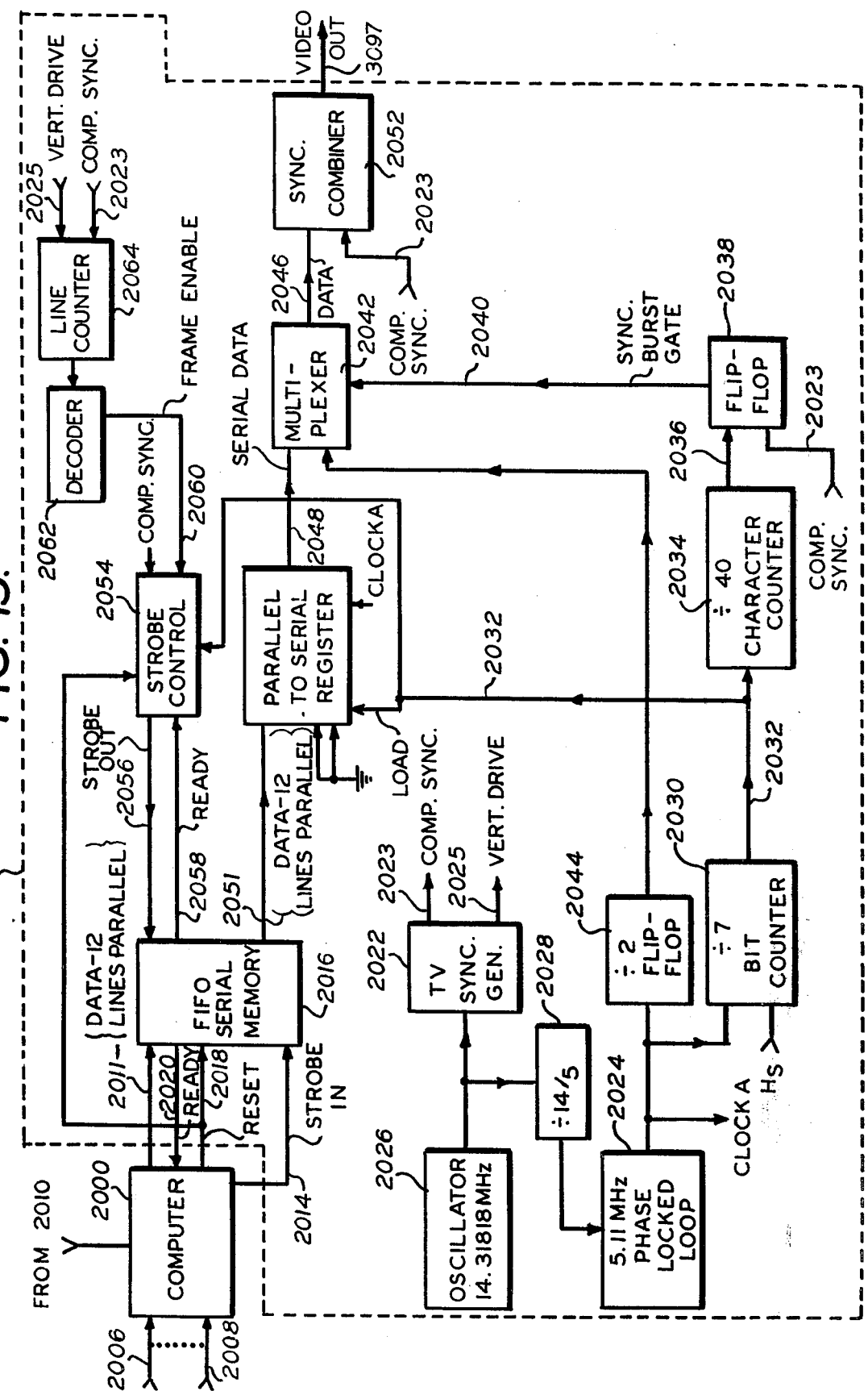
FIG. 15 is a block diagram of the preferred transmitter portion of the present invention.
Figure 16:
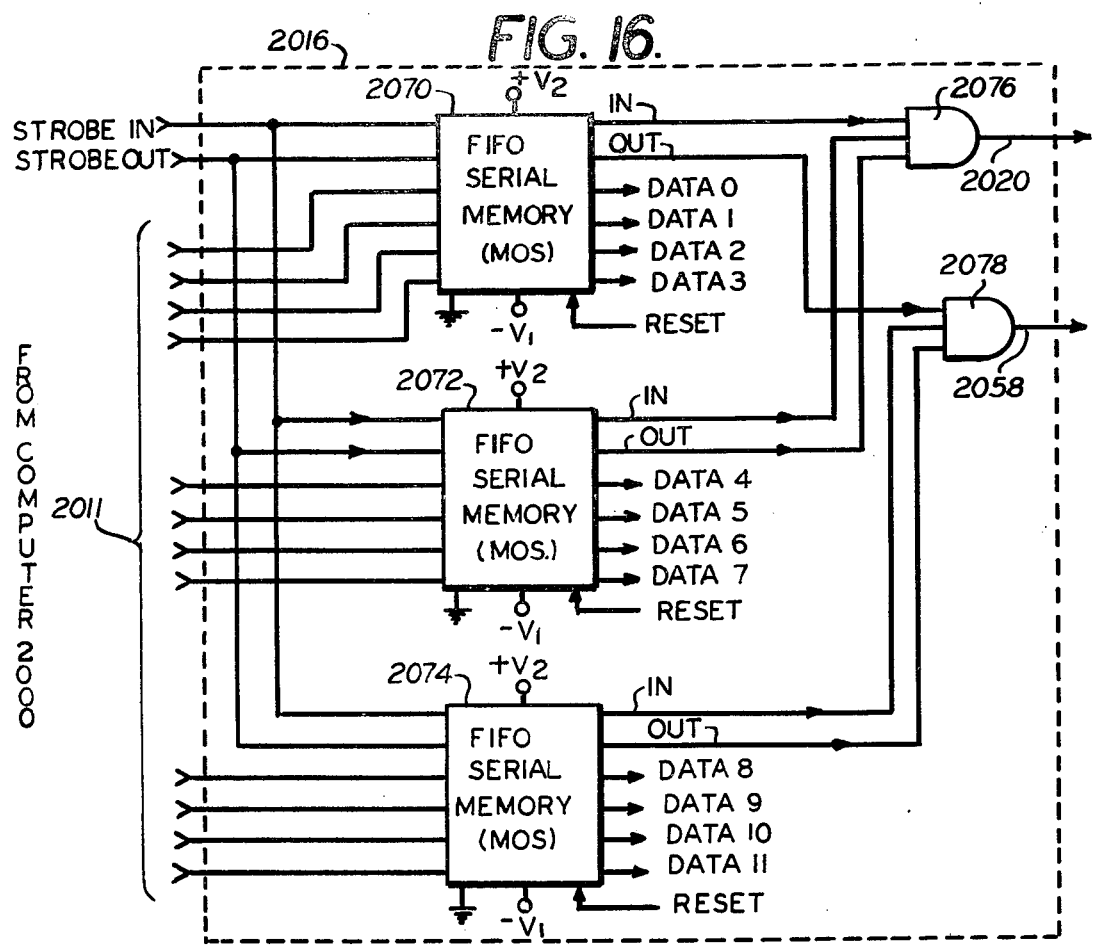
FIG. 16 is a logic diagram of the first in-first out memory portion of the transmitter portion illustrated in FIG. 15.
Figure 17:
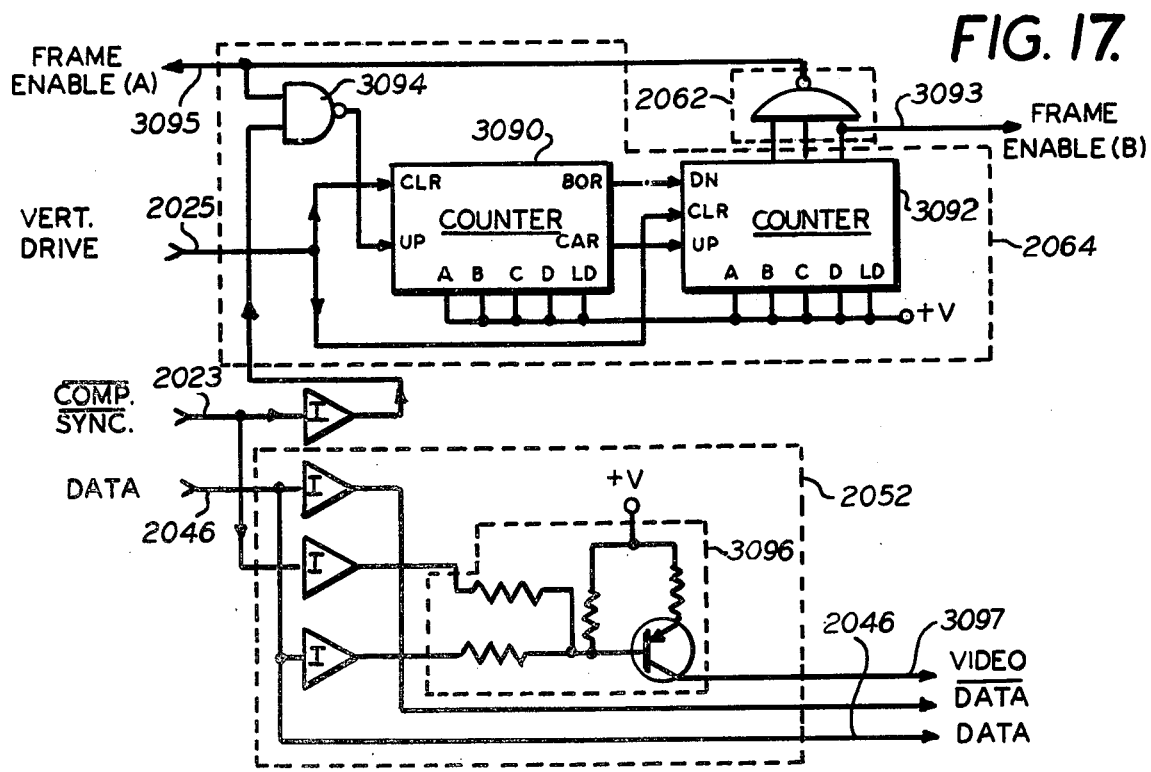
FIGS. 17 and 18 are logic diagrams, partially in schematic, of the transmitter portion illustrated in FIG. 15 except for the first in-first out memory portion illustrated in FIG. 16.
Figure 18:
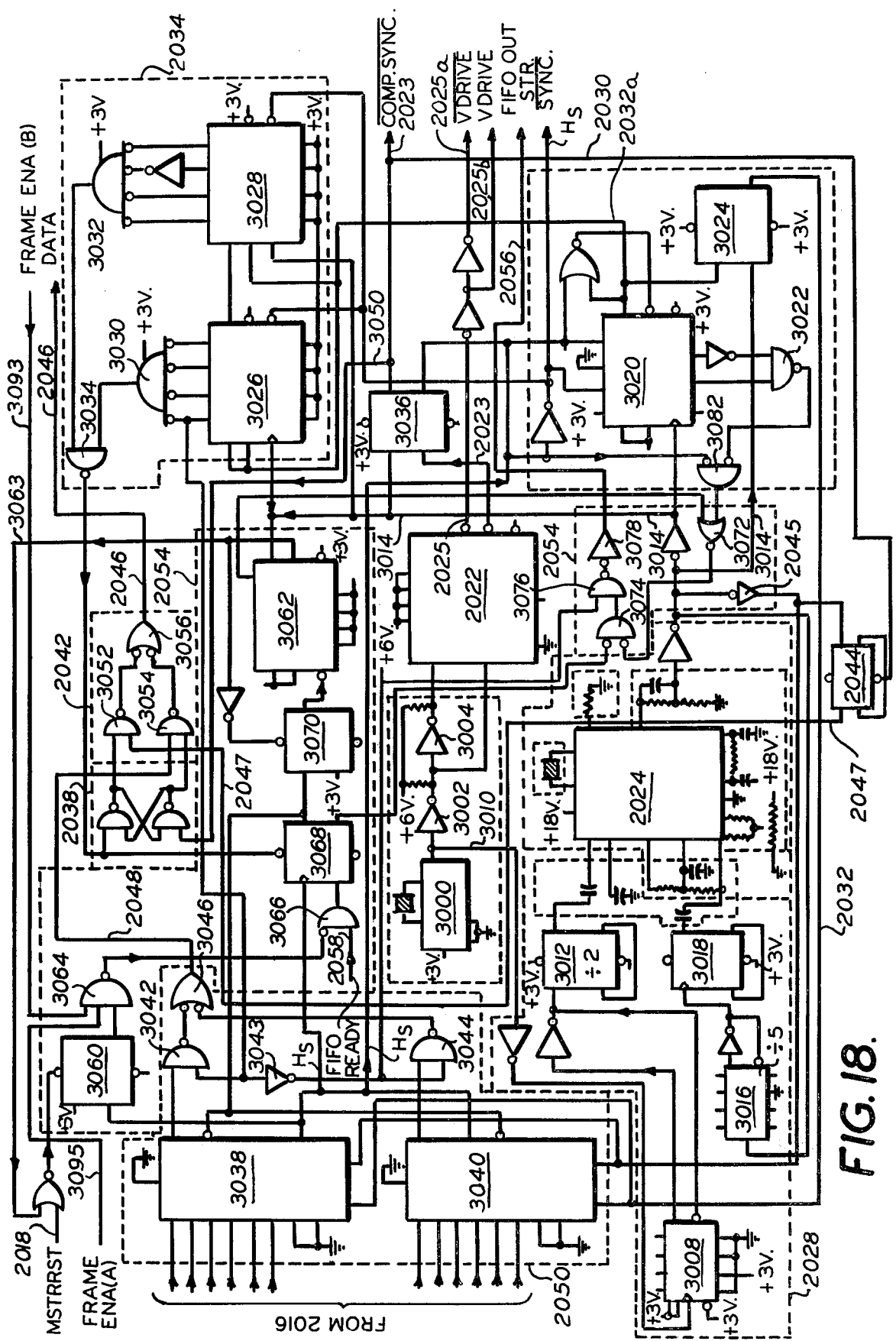

Video information may be of any conventional type, such as news information, money rate information, stock market information, local advertising, television program listings, weather information, consumer information, etc., which is conventionally supplied from conventional external information sources for such types of information, such as sources 2002 and 2004 shown by way of example. These conventional external information sources 2002 and 2004 preferably conventionally supply this information in a digital format such as from a ticker for news information or stock information, by way of example, through a conventional communication line 2006 or 2008 or a conventional local video terminal, preferably, to a conventional minicomputer 2000, such as a model No. PDP-8e manufactured by Digital Equipment Corp. Minicomputer 2000 preferably has an associated conventional mass memory 2010 for conventional storage of data. Computer 2000 stores this information in mass memory 2010, reformats it, such as by adding other information, and continuously provides this information as a 12 bit parallel output 2011 to a transmitter 20, to be described in greater detail hereinafter, which provides the pseudo video scan line 12a for transmission to the TV distribution network. It should be noted that at any time, the 12 bit parallel output of computer 2000 preferably presents two characters for one word. If desired, a 14 bit parallel output from the computer 2000 could be utilized to provide two 7 bit characters. The mass memory 2010 is preferably updated by the computer 2000 in conventional fashion at the optimum tranfer time for data which is, conventionally, not necesarily in the order of the reception of the external information from sources 2002 and 2004, this data being preferably continuously suppliable in real time to the computer 2000. In conventional fashion, information in computer 2000 is supplied to the transmitter 20 which, in turn, supplies this information to a CATV cable system 22 through a conventional RF modulator 24, composite video being supplied to modulator 24 from transmitter 20. One such modulator 24 is preferably provided for each television channel on which information is to be transmitted, only one such channel being illustrated in FIG. 15 by way of example. Preferably, the mass memory 2010 which is read in conventional fashion by computer 2000 to provide the requisite information via transmitter 20 to the CATV cable system 22, has sufficient storage capacity to store the entire page capacity of the system.

As used hereinafter throughout the specification and claims, the term "page" means one video frame of information, the term "group" means a predetermined number of pages, the term "row" is a displayable video row and means a portion of a page containing a plurality of conventional television video scan lines, the term "pseudo video scan line" means a signal which is identical in form to that of a conventional video scan line but which actually contains a row of information, such as approximately between 11 and 13 actual television video scan lines of information with the transmission time of the pseudo video scan line being equal to the transmission time of a conventional TV video scan line and with the pseudo video scan line being an entire packet of information necessary for video display of that row. The term conventional or television video scan line is used in the conventional manner.

As described in our previously issued U.S. Pat. No. 3,889,054, the mass memory 2010 can be any conventional mass memory storage device sufficient to store the requisite page capacity of the system, such as an RK-08 memory device manufactured by Digital Equipment Corp. The output of the computer 2000 is preferably conventionally transmitted from computer 2000 to the transmitter 20 via conventional data break of the computer 2000. All pages of information are preferably continuously being transmitted from the computer 2000 through transmitter 20 on a pseudo-video-scan-line-by-pseudo-video-scan-line basis, that is respectively on a row-by-row basis, through the appropriate RF modulator 24 for the video channel being utilized and therefrom, through the CATV cable system 22 to conventional video display terminals or devices 2013 and 2015, such as commercially available video monitors, two such devices being shown by way of example. It should be noted that the number of video display devices 2013 and 2015 preferably have no requisite correlation with the number of external information sources 2002 and 2004 and more such sources could be utilized than video display devices or vice versa if desired. In normal contemplated use, the number of video display devices 2013 and 2015 will normally exceed the number of external information sources 2002 and 2004, however, this need not be the case. The computer 2000 conventionally recirculates the data provided thereto in continuous fashion and, as previously mentioned, eventually updates the mass memory 2010 at the optimum transfer time for the data, which time is not necessarily in the order of reception of the external information from sources 2002 and 2004. The information from external sources 2002 and 2004, which is preferably being provided substantially continuously to the computer 2000 (as long as it is being generated from the external sources 2002 and 2004) is provided to the mass memory 2010 and instantaneously to the transmitter 20 which operates in a manner to be described in greater detail hereinafter to provide the pseudo video scan line 12a transmission of the information. Each video display device 2013 and 2015 preferably has an associated display control unit 25 and 26, respectively, which preferably functions to enable the real time frame grabbing or selection of a single page of continuously transmitted information for the instantaneous repetitive continuous video display, or frame grabbing thereof, this information being updatable on a row-by-row basis in real time. Preferably, each of the display control units 25 and 26 by way of example, one such display control unit preferably being associated with each video display terminal device, are identical in structure and operation. If desired, however, any display control unit 25–26 may be modified in a manner, such as described in U.S. Pat. No. 3,889,054, so as to prevent the reception of certain categories of information while enabling the reception of other categories of information. For purposes of clarity, only one such typical display control unit 25 will be described by way of example, the structure and operation previously mentioned, being identical with that of display control unit 26. Identical reference numerals, followed by the letter "a" will be utilized in FIG. 19 for elements of display control unit 26 which are identical in structure and operation with those of display control unit 25. In the overall system block diagram of FIG. 19, the display control unit 25 preferably contains a conventional RF demodulator 27, one such RF demodulator 27 being provided for each channel and a receiver 28, to be described in greater detail hereinafter, which receiver preferably includes a microcomputer and which receives the composite video demodulated by demodulator 27 and determines whether the user is correct, the user has permission to receive the pseudo video scan line information being transmitted at that time, whether the signal is error free, whether the page address of the pseudo video scan line is correct, and whether a direct address condition exists, and, preferably, assuming the pseudo video scan line signal passes all these tests, then the receiver processes this signal and provides a video signal corresponding to a displayable row of information on the video display device 2013.

Figure 2:
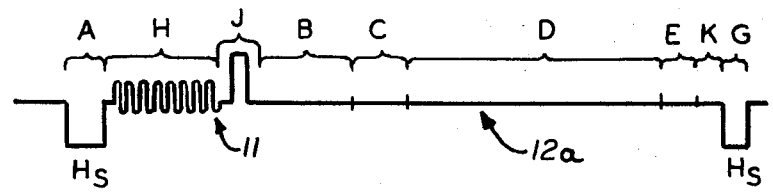
FIG. 2 is a diagrammatic illustration of a typical pseudo video scan line format in accordance with the present invention.

Referring now to FIGS. 4 through 14, 20 through 23, and once again to FIGS. 2 and 3, the preferred improved receiver portion 28 of the improved row grabbing system 10 of the present invention shall be described in greater detail. As will be described with reference to the preferred transmitter portion 20 of the row grabbing system 10 of the present invention, the transmitter 20 preferably provides the pseudo video scan line such as the type 12a illustrated in FIG. 2. This pseudo video scan line 12a, as was previously described, is identical in format to a conventional video scan line; that is, it is consistent with FCC and EIA standards for video scan line signal format; however this pseudo video scan line 12a actually contains a row of information, such as approximately between 11 and 13 actual television video scan lines of information with the transmission time of the pseudo video scan line 12a being equal to the transmission time of a conventional TV video scan line, which is approximately 63 microseconds. With respect to the pseudo video scan line 12a, the horizontal sync and vertical sync portions are preferably identical to a conventional video signal as is the format for the horizontal sync and the vertical sync as well as the horizontal sync amplitude. The time and amplitude envelope of the video region of the pseudo video scan line 12a, which region is defined as areas H, J, B, C, D, E, and K in FIG. 2, is identical with the format for a conventional video scan line as is the three dimensional frequency envelope. Thus, all of the above mentioned standard conditions for a conventional video scan line signal are met by the pseudo video scan line 12a provided by the transmitter portion 20 of the improved row grabbing system 10 of the present invention and received by the improved receiver portion 28. Accordingly, any equipment that can handle conventional video can handle the pseudo video scan line 12a of the present invention which can thus be transmitted and received through a conventional television distribution system with conventional television equipment.

Figure 3:
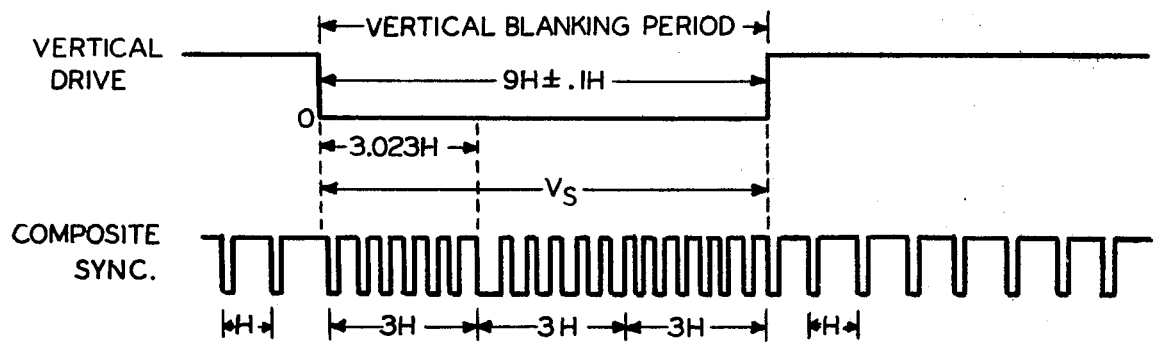
FIG. 3 is a graphical illustration of conventional vertical drive and composite sync signals illustrating the origin of the vertical sync signal in accordance with the present invention.

Returning once again to the pseudo video scan line 12a illustrated in FIG. 2, as is also true for the pseudo video scan line 12 illustrated in FIG. 1 which was previously described in our U.S. Pat. No. 3,899,054, the signal received by the receiver portion 28 and transmitted by transmitter 20 is in reality a digital signal which looks like a conventional video scan line to the receiver 28. Pseudo video scan line 12a, as will be described in greater detail hereinafter, however, preferably employs a start bit to provide timing and phase adjustment for the phase locked loop of the receiver terminal 28. In such an instance, region F which was previously contained in the pseudo video scan line 12 transmitted in the system of our U.S. Pat. No. 3,889,054, and which contained the clock synchronizing burst or pulse train at the bit rate (the frequency being equal to one-half the bit rate) and comprised a pulse train of ones and zeros for two character spaces or 14 bits, is not present and the sync burst information which was previously contained therein is not required for timing and phase adjustment in the improved row grabbing system of the present invention. Instead, region H, which preferably contains color burst information and region J which preferably contains one start bit are preferably inserted between regions A and B, with regions B, C, D, and E being electronically shifted down in position to be adjacent region G, only being separated therefrom by a region K, which region K merely represents the standard TV spacing for providing the front porch of the signal, the back porch of the signal being defined between region A and the leading edge of the start bit in region J. The color burst signal in region H preferably is the standard FCC eight cycle signal at 3.58 megahertz. Apart from the repositioning and deletion of certain regions of the pseudo video scan line 12 of FIG. 1, the contents of regions A, B, C, D, E and G in pseudo video scan line 12a of FIG. 2 is preferably identical with that previously described with reference to FIG. 1 in our U.S. Pat. No. 3,889,054 with respect to the transmission of a displayable row of data. Suffice it to say for purposes of clarity, that region A represents the horizontal sync signal which indicates the beginning of the pseudo video scan line from the beginning of the horizontal sweep for a conventional television scan line; and region B represents the pseudo video scan line 12a address which contains all the following information bit locations, a one preferably indicating the presence of a pulse and a zero preferably indicating the absence of a pulse, all of the following information bits preferably being present when data is transmitted: group, which is the section or chapter including a predetermined number, such as 1,000, of pages and is the most significant bit of the page address, page which represents one frame in a group, and row which occupies one character space which is preferably 7 bits and defines a portion of the page preferably containing approximately 11 to 13 scan lines which comprise one displayable character. The region B also preferably contains direct address information, which is the first transmitted bit preferably and is a zero unless a direct address condition exists which is a control condition for a selected terminal informing the terminal to supercede the requested page. This region B also preferably contains permission information which is a one bit position which is preferably a one only when the user is being given authority to receive one or more selected groups of information. It should be noted that preferably there is also an emergency override condition which provides control information to all terminals to override all requests including the permission request and preferably occurs on a page and group information bit location of zero, this condition preferably being utilized to display emergency information such as a civil defense warning. Region C is preferably a special character information region of 7 bits which is preferably utilized for optional functions to be performed by the individual receiver 28 or terminal. Region D preferably contains 32 characters of displayable information in digital form. Region E preferably contains error check information, as will be described in greater detail hereinafter. Region G is preferably the same as region A and represents the horizontal sync signal. As was previously mentioned, the vertical sync is preferably provided by generating a special sequence of horizontal sync pulses during the normal television blanking period, which is after approximately 236 horizontal sync pulses, which in the present invention as in U.S. Pat. No. 3,889,054 is after approximately 15 pages have been transmitted. Therefore, 15 pages are transmitted before each vertical sync. The sync signal looks like a conventional composite sync signal with a vertical sync interval comprising approximately nine normal horizontal sync pulse times as illustrated in FIG. 3 which is an illustration of conventional composite sync and vertical drive signals.

RECEIVER-VIDEO PROCESSOR PORTION

Now referring to FIGS. 4, 20, 21a through C, 22 and 23, the preferred embodiment of the video processor portion of the receiver 28 of the present invention which contains the preferred compensation circuit 111 (FIG. 20) therein shall be described hereinafter. Referred initially to FIG. 20, the composite video input signal via path 402 (FIG. 5) is provided to the preferred video processor 4000 via path 100 which is the video processor input therefor. This signal is conventionally amplified, such as by a conventional transistor amplifier 101 which drives both a conventional sync separator circuit 102 for providing the vertical sync and horizontal sync outputs therefrom in conventional fashion, and a preferred video processing circuit 103 to be described in greater detail hereinafter. The preferred video processing circuit 103 preferably extracts the correct logic data from the input data from the composite video input signal. This input data may contain significant distortions resulting from a conventional vestigal sideband modulation scheme utilized for transmission as well as from phase delay distortion in a cable transmission system and from the bandwidth limitations inherent in the FCC channel allocations. These distortions generally occur in any television transmission and are not normally compensated for due to the low level fidelity requirements of conventional television transmission and display. The nature of the aforementioned distortion is illustrated in FIGS. 21 A through 21 C. FIG. 21 A represents the original undistorted transmission; FIG. 21 B represents the received signal which is provided to the preferred distortion compensation circuit 111, to be described in greater detail hereinafter, which is preferably included in the preferred video processing circuit 103, this signal containing distortions as previously mentioned; and FIG. 21 C illustrates the corrected or distortion compensated signal output from preferred distortion compensation circuit 111. The nature of the distortion as illustrated in FIGS. 21 A through 21 C is such that zeros and ones do not always return to the same level, the level of each zero and one being dependent on the preceding few bits of data as illustrated in FIG. 21 B. It should be noted at this point that although the amplitudes of the signals in FIGS. 21 A and 21 C are different, if desired these amplitudes could be the same, the primary difference between the original undistorted transmission and the corrected signal output of preferred distortion compensator 111 being the sloping sides of the pulses present in the compensated or corrected signal of FIG. 21 C.

The received signal illustrated in FIG. 21 B which contains the aforementioned distortions is preferably provided to the preferred video processing circuit 103 via path 105 which provides this signal to a conventional synchronous clamp circuit 104. As shown and preferred in FIG. 20, this received signal provided via path 105 to synchronous clamp 104 is shorted through a reference voltage at a point A at the beginning of each horizontal scan line. This is preferably accomplished by field effect transistor 106 which acts as a fast switch. A gate pulse provided via path 107 (FIG. 22) which is termed the "keyed clamp gate" signal, turns field effect transistor 106 on through transistor driver 108 for a short part of the back porch of the signal, this interval being defined as after the color burst which is in region H and before the start bit which is the pulse in region J (FIG. 2). As a result, the DC level of the data line, represented by path 109, is the same at the start of each horizontal scan line. Without the presence of this synchronous clamp 104, the DC level would change from line to line depending on the relative number of ones and zeros defining the data content of each line. Synchronous clamp 104 insures that the receiver terminal 28 will respond properly to the first data line that follows a group of empty or no data lines. The output of synchronous clamp 104 via data line 109 is preferably provided to preferred distortion compensation circuit 111 through a conventional isolation amplifier 110 whose input is the data line 109, with isolation amplifier 110 preferably having a high input impedance which prevents any average change of DC level during a horizontal scan line period. As illustrated in FIG. 21 B, when distortion is present in the received signal, there is a significant peak-to-peak change although the value of the location of the peaks may differ. Preferred distortion compensation circuit 111 preferably responds to the one-to-zero or zero-to-one transitions in the signal. When the transition is a zero-to-one transition, as shown and preferred in FIG. 20, the right side or output side of capacitor 112 rises positively tracking the transition up to a predetermined voltage, such as preferably the normal threshold voltage of the silicon diodes 113 and 114 utilized in the preferred distortion compensation circuit 111, this voltage preferably being by way of example 0.7 volts. At that time, this diode 113, which as previously mentioned is preferably a silicon diode, conducts clamping the voltage at this predetermined value of 0.7 volts even though the input data may continue to rise in voltage value. This predetermined voltage is maintained until a one-to-zero transition occurs. As soon as the input voltage reverses direction, as caused by a one-tozero transition, silicon diode 113 cuts off and the voltage at the right side or output side of capacitor 112 falls tracking the input change until, preferably, it reaches the negative equivalent of this predetermined preferred voltage which, in the example given, is −0.7 volts. At that time silicon diode 114 which preferably has the same threshold level as silicon diode 113, conducts clamping the voltage at this predetermined level, which by way of example is −0.7 volts, until a zero-to-one transition occurs at which point silicon diode 114 cuts off and the aforementioned cycle repeats. In this manner a signal is produced which has all ones and all zeros of the same respective levels as illustrated in FIG. 21 C. For a string of unchanged ones or unchanged zeros, that is where no transition occurs, the clamped voltage output due to silicon diodes 113 and 114 which is provided to the gate of output field effect transistor 116 of preferred distortion compensation circuit 111 would normally tend to decay as a result of capacitor 112 discharging. In order to compensate for this, an RC network 115 is connected in parallel across the capicator 112-diode 113-114 network to provide a reverse tilt or compensating charge voltage to this decaying voltage to the gate of field effect transistor 116 in order to compensate for the decay. This field effect transistor 116 buffers the clamped output signal and supplies it to a conventional output amplifier 117 whose output is in turn coupled to a conventional logic inverter 118 through a conventional biasing network 119 to provide a true digital data signal at the output of logic inverter 118 which is equivalent to the original transmitted signal as illustrated in FIG. 21 C, amplifier 117 amplifying the amplitude of the signal illustrated in FIG. 21 C to the amplitude of the signal level illustrated in FIG. 21 A. Biasing network 119 preferably insures that the switching of logic inverter 118 occurs about midway on the clamped signal transition, the output of logic inverter 118 being digital data.

Figure 22:
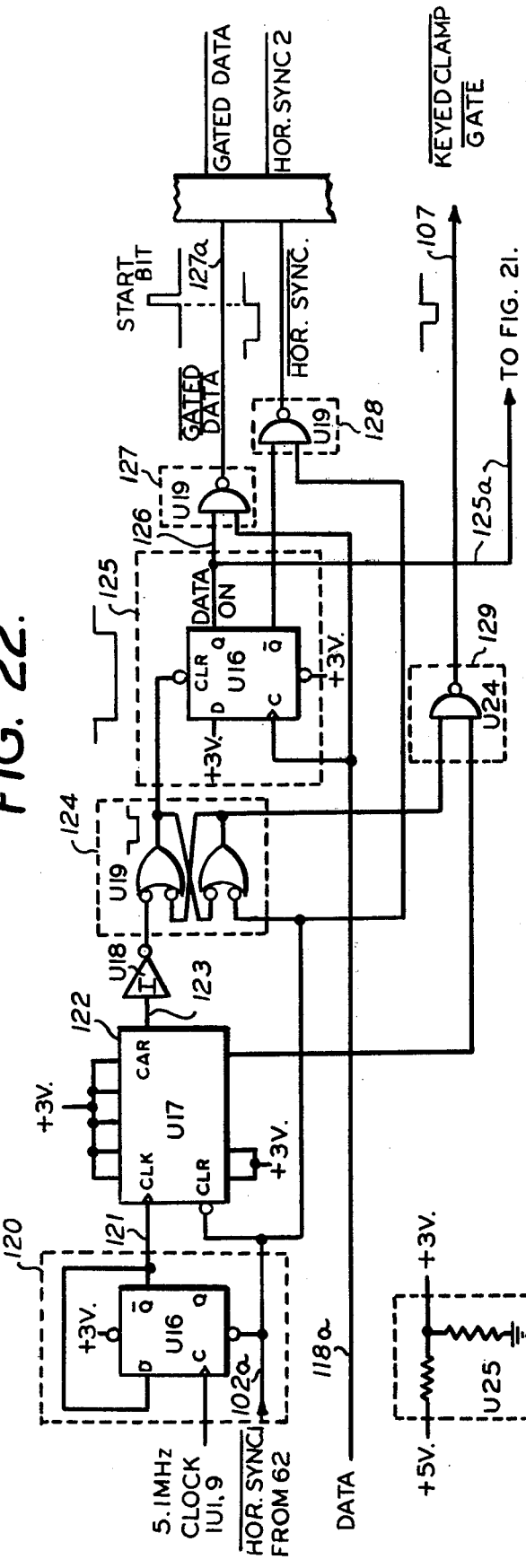
FIG. 22 is a logic diagram, partially in schematic, of another portion of the video processor portion of the improved receiver illustrated in FIGS. 5 and 20.
Figure 22A:
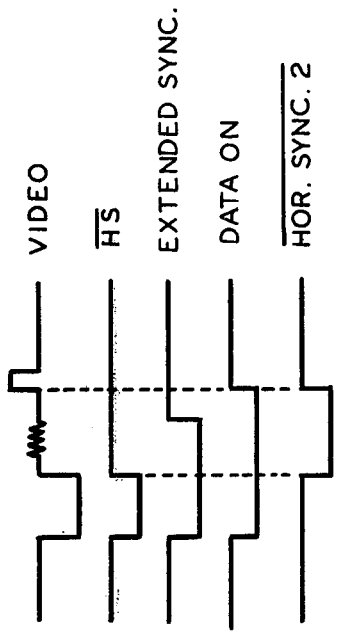
FIG. 22A is a graphic illustration of the various waveforms present in the video processor portion illustrated in FIG. 22.
Figure 23:
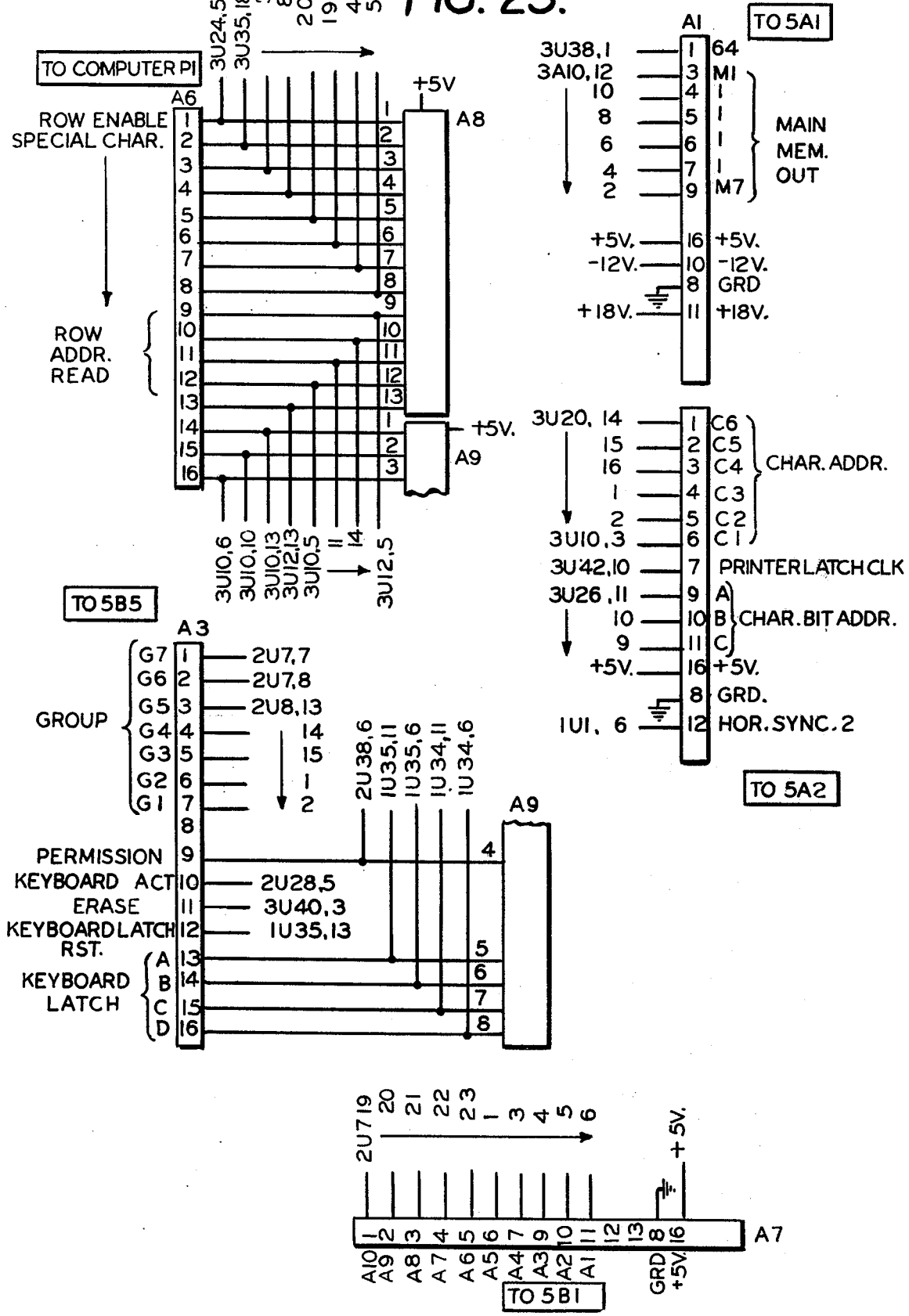
FIG. 23 is a block diagram of the various interconnections or interfacings of the video processor of FIGS. 20 and 22 with the balance of the circuitry in the preferrred improved receiver of the present invention.

Referring now to FIG. 22, another portion of the preferred video processing circuit 4000 is shown. Preferably, the digital data output of logic inverter 118 still contains the color burst which was present in region H of the signal and would normally remain in the transmitted signal if a color TV receiver was being utilized for the display terminal. However, when a monochromatic digital TV terminal is utilized, the color burst signal must preferably be omitted or gated out. It should be noted that, if desired, if only monochromatic TV terminals are to be utilized, then the color burst may be omitted all together from the transmitted signal although preferably color burst is present to allow for color TV display. The color burst removal circuit illustrated in FIG. 22, as shown and preferred, includes a conventional separator D-type-divide-by-2 flip-flop 120 which preferably receives a 5.1 megahertz clock input and is preferably cleared by the horizontal sync provided from sync separator circuit 102 via path 102a (FIG. 20). Flip-flop 120 is preferably connected in a toggle mode so that its output, which is provided via path 121, is a series of 2.55 megahertz pulses, in the example given, that start at the completion of the horizontal sync pulse. A conventional decade counter 122 is preferably connected so as to receive these pulses and count these pulses so as to generate an output at the tenth pulse which output is provided via path 123, inverted and then provided to another conventional flip-flop 124 which is initially set by the horizontal sync pulse provided via path 102a and reset by the output signal provided via line 123. The output of flip-flop 124 is preferably a pulse which starts with the beginning of the horizontal sync pulse and ends at the completion of the count of the tenth clock pulse as indicated by the presence of a signal via path 123. The width of this pulse output of flip-flop 124 is preferably such so as to continue beyond the color burst present in region H but to end prior to the initiation of the start bit in region J. This pulse clears a conventional flip-flop 125 whose clear input is connected to the output of flip-flop 124 and whose clock input is preferably clocked by the data input provided from logic inverter 118 via path 118a (FIG. 20). As a result, the output of flip-flop 125 which is provided via path 126 is preferably low during the horizontal sync and color burst periods and is clocked high by the start bit of region J contained in the logic inverter 118 output provided via path 118a. The signal which is present on path 126 enables a conventional NAND gate 127 which has two inputs, with the other input being connected to the output of logic inverter 118 via path 118a. As a result, the output of NAND gate 127 is gated data which includes the start bit and subsequent data, such as present in regions B through K, but excludes the color burst. A second conventional two input NAND gate preferably receives the horizontal sync signal provided via path 102a as one input and the inverted gate signal from flip-flop 125 as its other input. As a result, NAND gate 128 preferably generates a pulse which starts at the trailing edge of the horizontal sync signal and terminates with the start bit. This output signal from gate 128 is preferably utilized as a delayed horizontal sync signal for use by other circuits in the receiver terminal 28 as will be described in greater detail hereinafter. It should be noted that the delayed horizontal sync output of gate 128 which is preferably terminated with the start bit essentially makes the system insensitive to any jitter or noise that might be present in the original horizontal sync signal provided via path 102a. As shown and preferred, the aforementioned keyed clamp gate signal provided via path 107 through preferred video processing circuit 103 is preferably provided as the output of a third conventional two input NAND gate 129 whose inputs are the non-inverted output of flip-flop 124, which is the extended sync signal (FIG. 22 A), and an output from counter 122 which is preferably high after counting eight pulses as opposed to the tenth pulse count output provided via path 123 to flip-flop 124. As a result, the output of gate 129 is a pulse that starts eight clock pulses after the end of the horizontal sync and ends after the tenth clock pulse; in other words, the gate output pulse via path 107 occurs between the eighth and tenth counts of counter 122. This pulse defines the aforementioned unused region on the back porch between the end of the color burst in region H and the start of the start bit in region J, this area being designated by reference numeral 11 in FIG. 2.

It should be noted that the aforementioned conventional sync separator circuit 102 is preferably identical with that previously described in our U.S. Pat. No. 3,889,054 which description is specifically incorporated by reference herein.

RECEIVER-PHASE LOCKED LOOP PORTION

Figure 4:
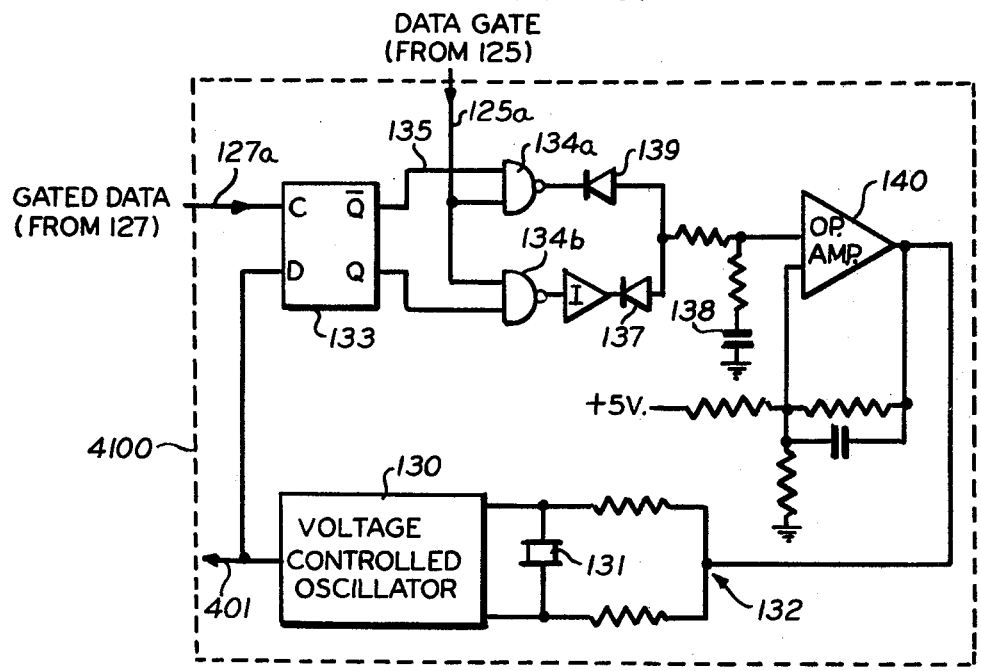
FIG. 4 is a block diagram of the preferred phase locked loop portion of the present invention.

Referring now to FIG. 4, the improved phase locked loop 4100 (FIG. 5) of the preferred synchronization timing portion of the receiver portion 28 of the row grabbing system 10 of the present invention is shown, this phase locked loop 4100 preferably being utilized in place of the phase locked loop arrangement described in our previous U.S. Pat. No. 3,889,054. Phase locked loop 4100 preferably includes a conventional voltage controlled crystal oscillator 130 whose nominal frequency, which is preferably by way of example 5.1136 megahertz, is set by a conventional crystal 131. This frequency can preferably be varied over a small range by adjusting the voltage present at input 132. The output of voltage controlled oscillator 130 is preferably fed back to a conventional D-type flip-flop 133 at the D input as well as being provided via path 401. The gated data ouput from gate 127 (FIG. 22), which is preferably provided via path 127a, is preferably provided to the clock input of flip-flop 133 which flip-flop preferably acts as a phase detector. Preferably, whenever a zero-to-one data transition occurs while the clock is high, flip-flop 133 is in a set state. If it occurs when the clock is low, flip-flop 133 is preferably then in the reset state. Thus, a change in the output of flip-flop 133 occurs only when the phasing of the clock changes with respect to the phasing of the data. It should be noted that preferably the voltage controlled oscillator 130 is the same as the voltage controlled oscillator forming part of the phase locked loop described in our previous U.S. Pat. No. 3,889,054. As shown and preferred, a pair of conventional two input NAND gates 134a and 134b connect the output of the phase detector 133 to the oscillator control circuits only during the valid data period which is preferably defined as the time of the horizontal scan line including the start bit when data can be present. One input to gates 134a and 134b, which input is connected in parallel thereto, is the data gate output from flip-flop 25 provided via path 125a (FIG. 22). The other input to gate 134a provided via path 135 is the inverted output of flip-flop 133 while the other input provided via path 136 to gate 134b is the non-inverted output of flip-flop 133. If path 135 is high, it denotes that the clock leads the data in phase whereas if path 136 is high it denotes that the clock lags the data in phase. When path 136 is high, a diode 137, which is preferably connected to the ouput of gate 134b through an inverter, charges a capacitor 138 connected to the output thereof in a positive going direction. As long as the phase lag condition remains, the voltage continues to rise. In the leading phase condition, that is with path 135 high, this preferably causes capacitor 138 to discharge through a diode 139 connected to the output of gate 134a. In the normal closed loop condition, the phase varies between a very small leading and very small lagging angle, such as by way of example, plus or minus 10 degrees, as necessary to maintain a constant voltage on capacitor 138. This voltage is preferably amplified by a conventional FET operational amplifier 140, such as an Intersil 8007C, to provide the control voltage for the voltage controlled oscillator 130 via path 132. It should be noted that for the improved phase locked loop 4100, if a full line of data is present, phase locked loop 4100 will utilize every data transition to continuously correct the clock phase whereas in the case of a series of empty or non-data lines being transmitted, phase locked loop 4100 will make a single correction each line utilizing the start bit which correction will be adequate to insure that phase lock exists at the beginning of the first non-empty or data line. Thus, improved phase lock loop 4100 can maintain phase lock to a single start bit rather than to the entire clock burst as well as utilizing every data transition to continuously correct clock phase. Thus, phase locked loop 4100 is an improvement over the phase locked loop arrangement described in our U.S. Pat. No. 3,889,054 which only utilizes the clock burst for phase lock rather than utilizing every data transition. In order to prevent large over corrections during periods when lines are not transmitted such as when not even the start bit is transmitted, for example during the vertical blanking interval, during which periods it is important that the last error state at the output of gates 134a and 134b does not continue to charge or discharge capacitor 138, such as if the last error state was in a leading condition where over correction would continue to drive through into a lagging condition, gates 134a and 134b are turned off except when an active line, which is defined as a line including a start bit, such as in region J, is received data gate path 125a. This data gate path 125a preferably goes high coindident with the start bit and goes low at the beginning of the following horizontal sync pulse so as to indicate the presence of an active line and to thus prevent the occurrence of correction during periods when lines are not transmitted.

Figure 5:
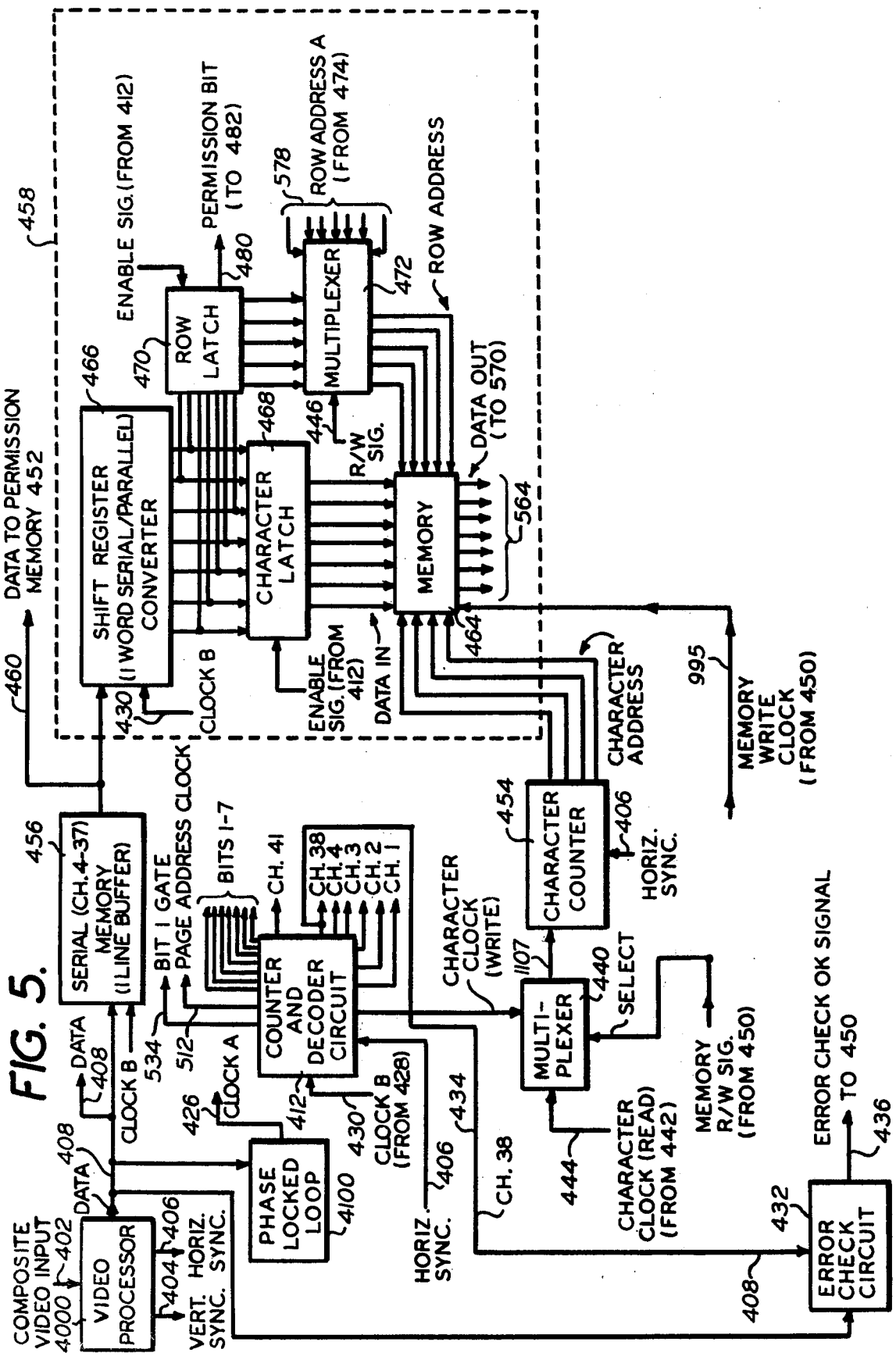
FIG. 5 is a block diagram of the timing control, memory input control and a part of the output processing portions of the preferred improved receiver of the present invention, showing the preferred phase locked loop of FIG. 4 in block.
Figure 6:
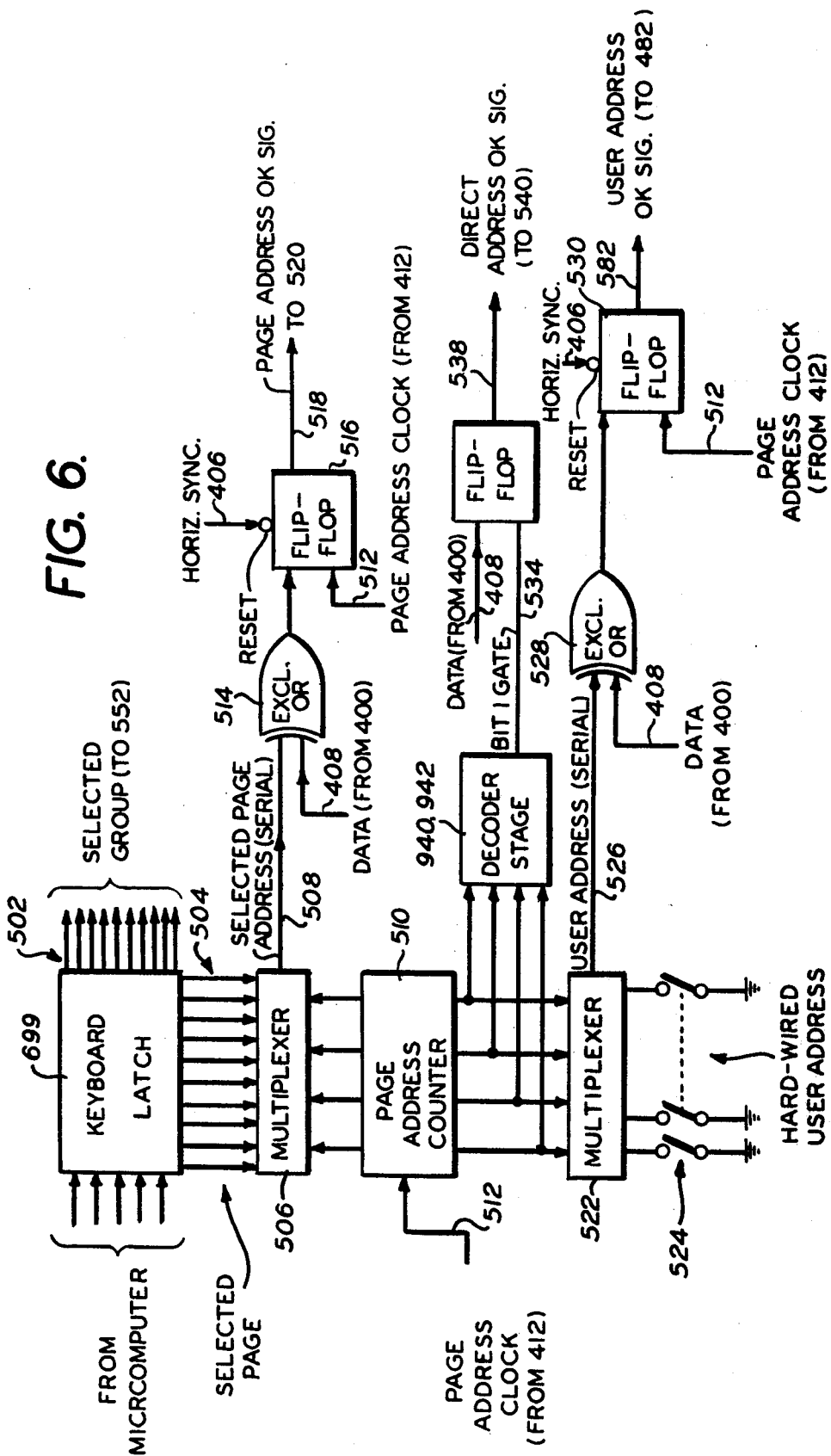
FIG. 6 is a block diagram of another portion of the memory input control portion of the preferred improved receiver of the present invention.
Figure 7:
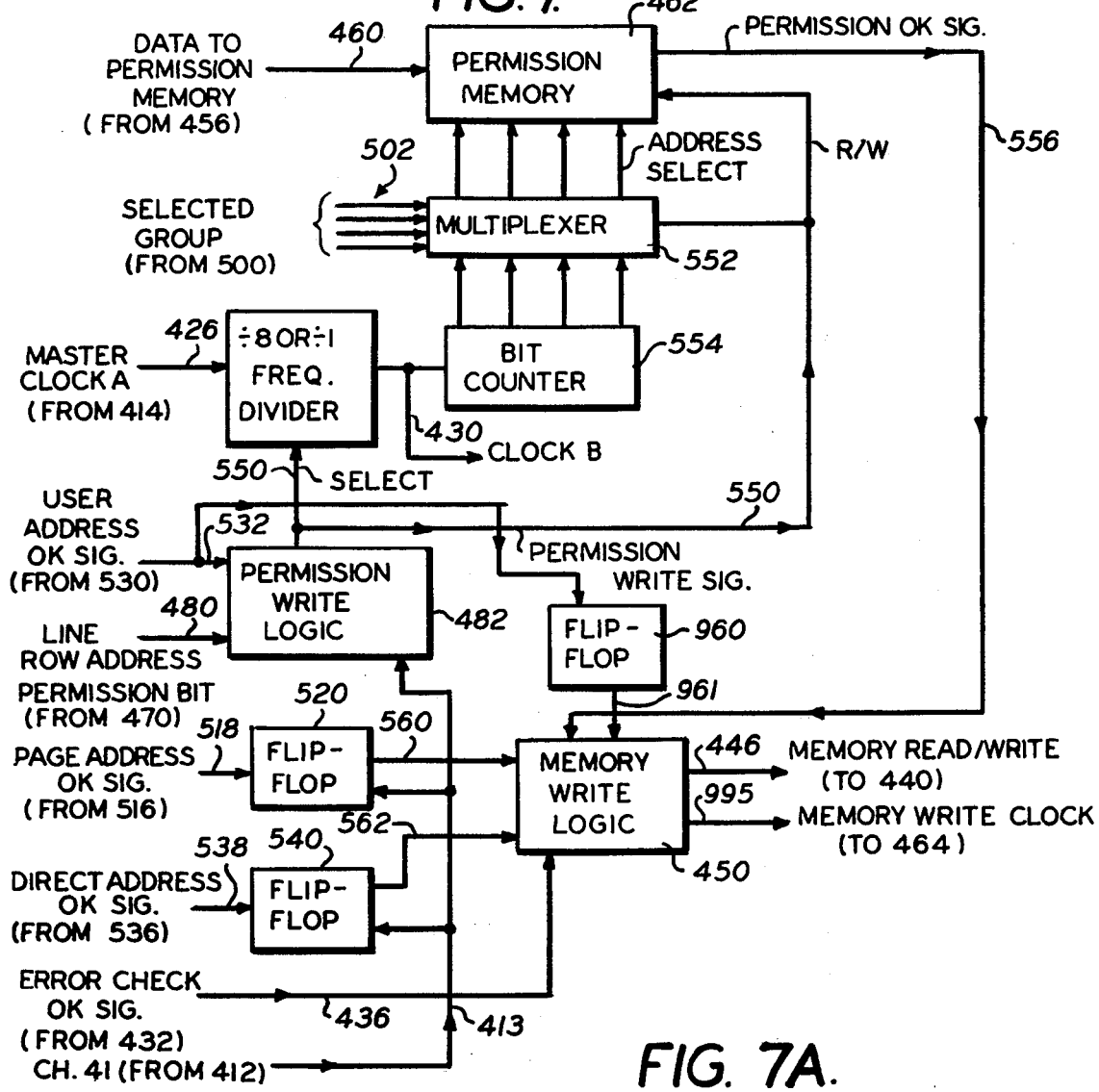
FIG. 7 is a block diagram of the memory and output processing portion of the preferred improved receiver of the present invention.
Figure 7A:
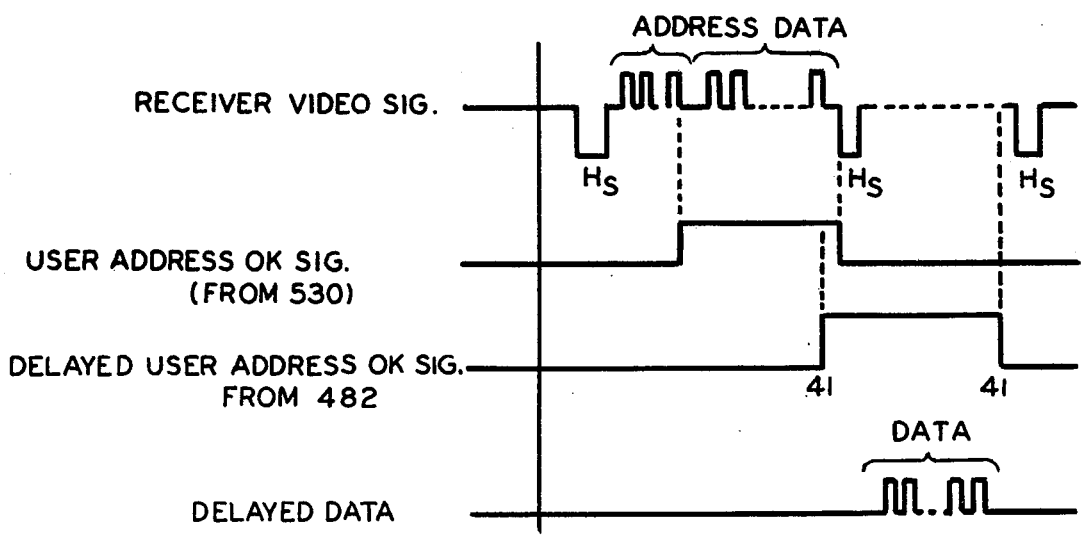
FIG. 7A is a graphical illustration of the timing associated with various signals in the arrangement of FIG. 7.
Figure 8:
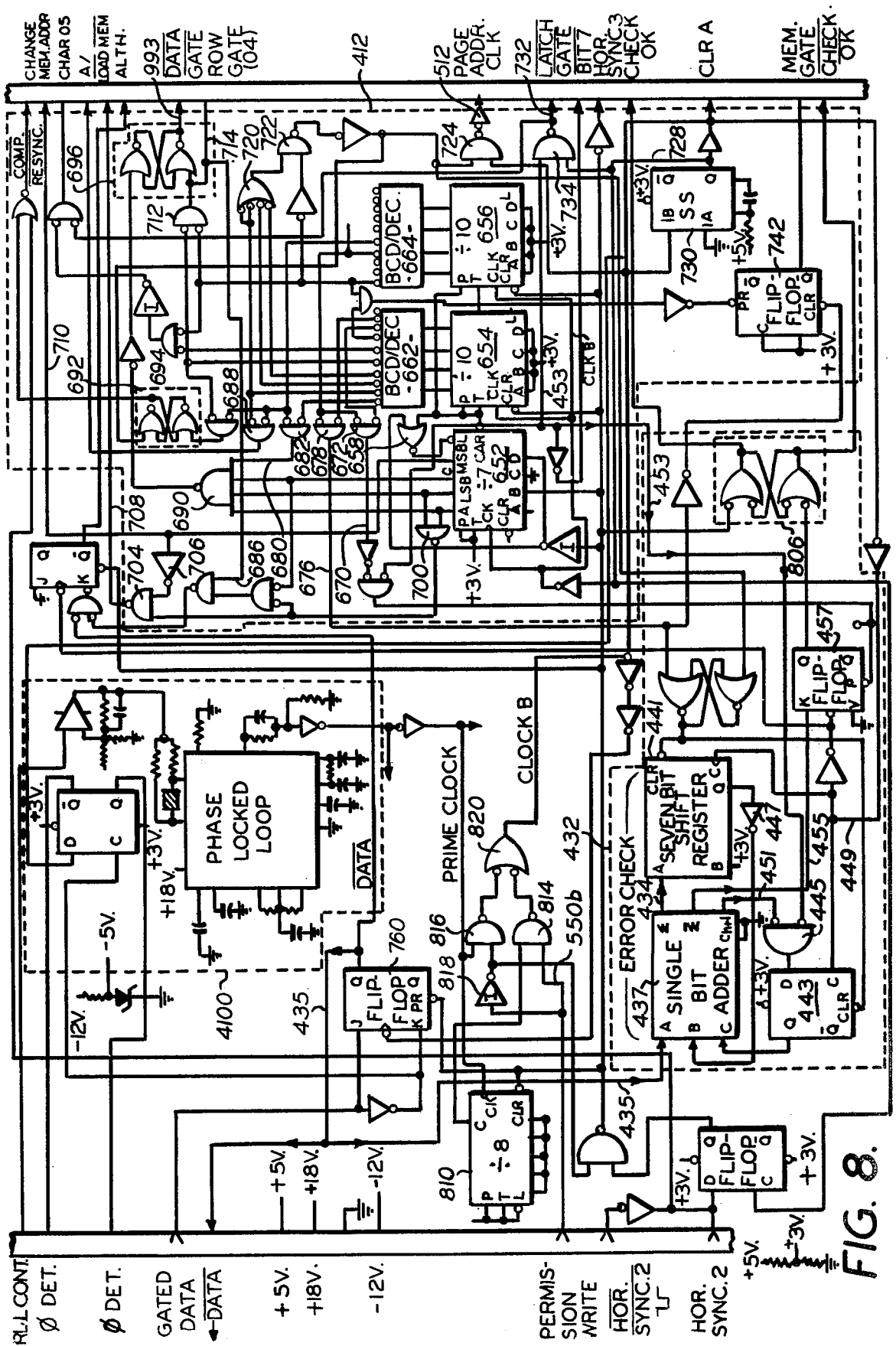
FIG. 8 is a logic diagram, partially in schematic, of a portion of the timing and keyboard control portion of the preferred improved receiver of the present invention illustrated in FIG. 5, showing the preferred phase locked loop portion of FIG. 4 in block.
Figure 9:
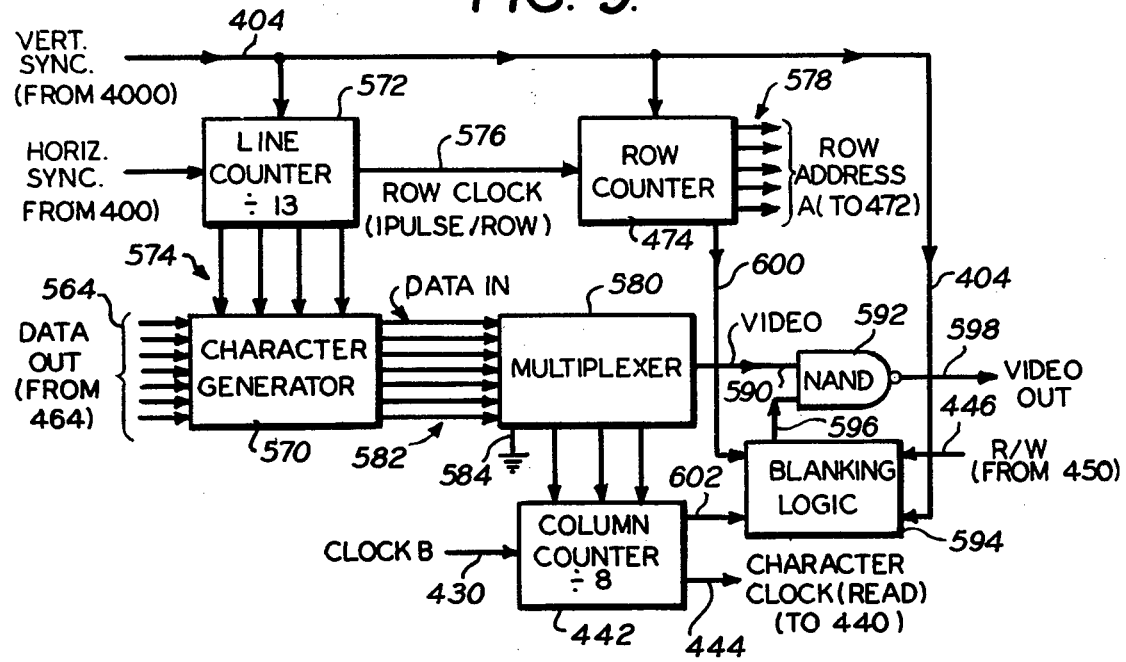
FIG. 9 is a block diagram of another portion of the memory and output processing portion of the preferred improved receiver of the present invention.
Figure 10:
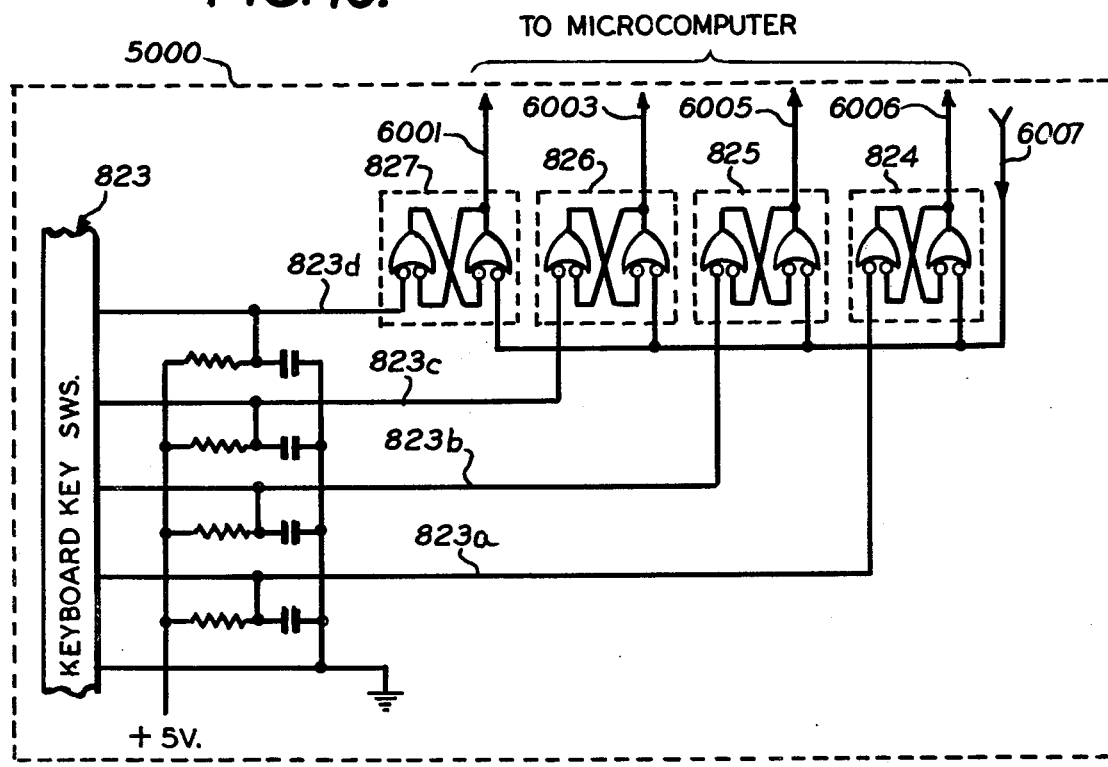
FIG. 10 is a logic diagram, partially in schematic, of the keyboard portion of the timing and keyboard control portion of the improved receiver illustrated in FIG. 5.
Figure 11:
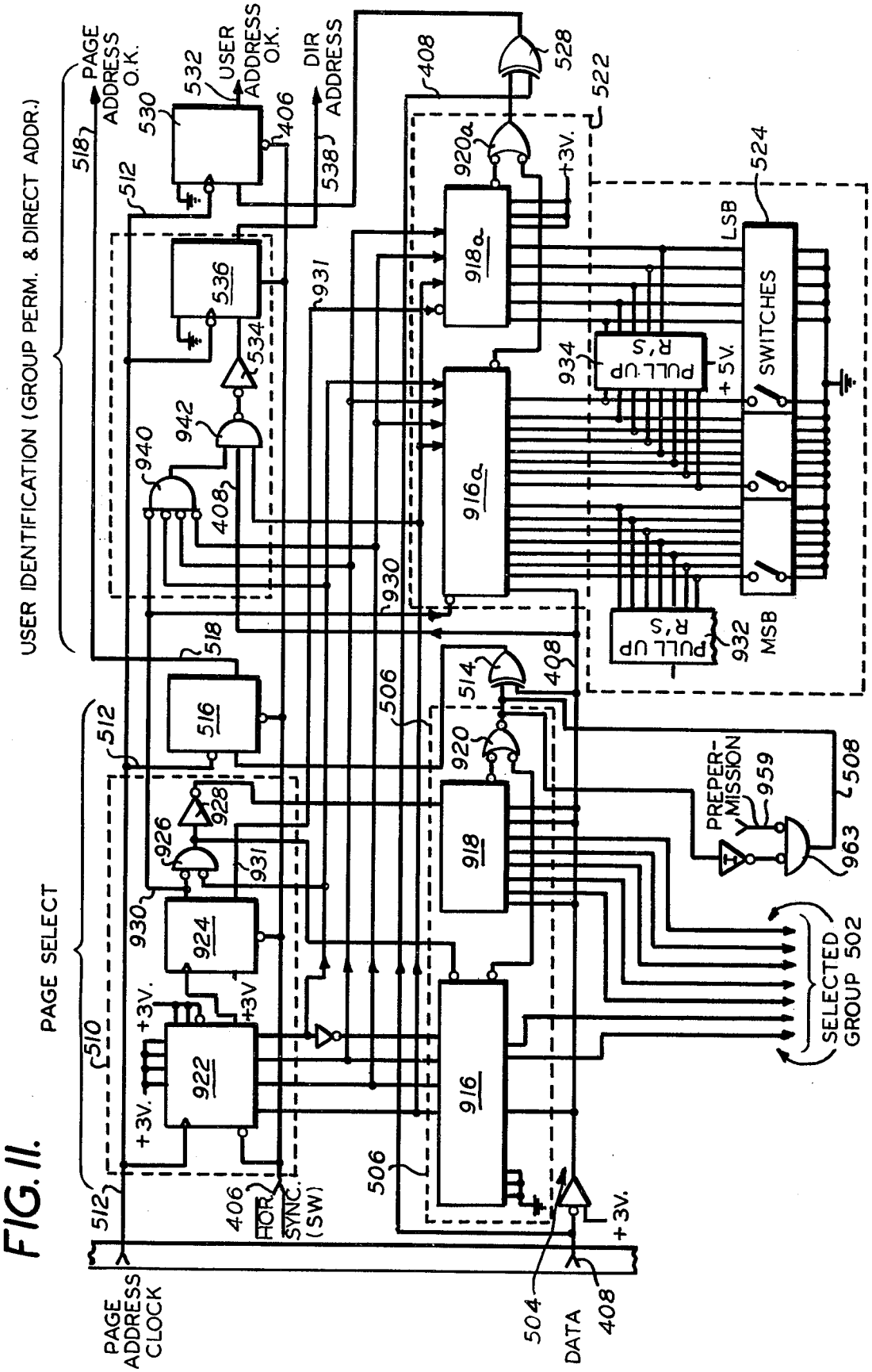
FIG. 11 is a logic diagram, partially in schematic, of the portion of the memory input control portion of the improved receiver illustrated in FIG. 6.

Referring now to FIG. 8, which is a logic diagram, partially in schematic, of a portion of the timing and keyboard control portion of the preferred receiver 28 of the present invention illustrated in FIG. 5, the circuit shown therein is essentially similar to that described with reference to FIG. 8 of our previous U.S. Pat. No. 3,889,054 with the exception of the improved phase locked loop portion 4100 previously described with reference to FIG. 4 and with the exception of an improved error check circuit 432 in place of the error check circuit described in our previous U.S. Pat. No. 3,889,054. As shown and preferred in FIG. 8, the input to error check circuit 432 is preferably resynchronized data out of flip-flop 760 which, as described in our previous U.S. Pat. No. 3,889,054 is an output which preferably follows the input data line except that it will be synchronized with the clock B signal by the clock of flip-flop 760 provided via path 435 which is the same data as utilized by the balance of the receiver display terminal 28. The resynchronized data preferably goes to the A input of a conventional single bit adder 437 which produces the sum of two input bits present at inputs A and B thereof with the B input initially being zero. This sum is preferably provided via path 439 to the input of a conventional seven bit shift register 441. The output of shift register 441 is preferably provided to the B input of adder 437 through a conventional inverter 447. As a result of the seven bit delay provided by register 441, adder 437 at any given time adds an input bit of a given character, since the system preferably utilizes seven bits per character, with the same bit of the previous character. At the beginning of the line, shift register 441 is preferably cleared so that the B input of adder 437 is again logic zero for the duration of the first character. When the first bit of the second character is received at the A input of adder 437, the first bit of the first character is then present at the B input of adder 437 and the output of adder 437 provided via path 439 is the sum of these two bits. At the beginning of the third character, the B input of adder 437 represents the sum of bit one from the first two characters. In this manner for the remainder of the line, that is the pseudo video scan line, the individual bits of the characters are added and accumulated. This is preferably a serial process which is serially repeated for each of the seven bits of the character; for example, for bit one of character 10, the B input of adder 437 is equivalent to the sum of bits one of characters one through nine and for bit two of character 10 the B input to adder 437 is equivalent to the sum of bits two of characters one through nine, etc. Adder 437 provides a carry output where required by binary addition; namely if one and one are added, the sum is zero in that position plus a carry of one to the next position. This carry output is present on path 451 and is preferably applied to the D input of a coventional flip-flop 443 via a conventional two input NAND gate 445. Flip-flop 443 is preferably clocked by the system clock provided via path 449 so that the non-inverted output of flip-flop 443 represents the carry output of adder 437 delayed by one bit. Thus, the carry output present via path 451, such as, by way of example, the output that results from the addition of bit one, is present at the C input of adder 437 when the bit two addition is taking place. The bit two addition then is a full addition resulting from the data bits at A and B of adder 437 as well as the carry state C of adder 437. Preferably, a carry output of bit seven is ignored which is accomplished by gate 445 which turns off the input to flip-flop 443 during bit seven in response to a bit seven pulse from the decoder 412 whose operation is described in our previous U.S. Pat. No. 3,889,054, which pulse is provided via path 453. It should be noted that the output of adder 437 via path 439 preferably represents in serial form the accumulated sum of individual character bits. Preferably, during the 38th character, which is preferably the error check character, the accumulated sums will all be ones after the error check character is added in if no error is present. The inverted output of adder 437 is provided via path 455 to another conventional flip-flop 457. Path 455 preferably must be in the zero state during the 7 bits of the 38th character for the received pseudo video scan line to be considered a true or valid line. Flip-flop 457 tests for this condition by being kept in a set state due to a negative preset signal at all times except during character 38; in other words, except when the 38th character pulse is provided. Path 455 is connected to the K input of J-K flip-flop 457 so that if path 455 is high during any bit of the 38th character, flip-flop 457 will be reset. Thus, a negative pulse at the non-inverted or Q output of flip-flop 457 during the 38th character will indicate an error. Accordingly, the improved error check circuit 432 of the present invention adds on a word-by-word basis as opposed to a bit-by-bit basis as described in our previous U.S. Pat. No. 3,889,054 and accomplishes this summing or addition in serial fashion rather than parallel fashion.

Microprocessor and Keyboard System

Referring now to FIGS. 24, 26, 27 and 28, the improved microprocessor and keyboard control system of the present invention which preferably replaces the keyboard circuitry of the system described in our previous U.S. Pat. No. 3,889,054 will be described. If desired, however, the improved row grabbing system of the present invention may continue to operate with the keyboard circuit arrangement described in our previous U.S. Pat. No. 3,889,054 as opposed to utilizing the improved microprocessor-keyboard control system to be described hereinafter without departing from the spirit and scope of the present invention in which instance the improved system 10 will contain whichever advantages described herein are not dependent on the microprocessor-keyboard control system to be described hereinafter. As shown and preferred in FIGS. 27 and 28, the microprocessor 6000 of the present invention preferably includes a conventional microcomputer or CPU 601, a conventional read only memory or ROM 603, a conventional random access memory or RAM 605, and a conventional input/output buffer or I/O 607. Preferably, the microcomputer 601, read only memory 603, random access memory 605 and input/output buffer 607 are all integrated circuit chips of the type manufactured by Rockwell International, such as what is commonly available from Rockwell International as their PPS-4 MP system wherein the microcomputer chip 601 is a Rockwell International 10660 CPU, read only memory 603 and random access memory 605 are Rockwell International 10432 memory chips and input/output buffer chip 607 is a Rockwell International 10696. The programming language for the permanently storable loader and executive program which is preferably stored in read only memory 603 is preferably written in PPS-4 Assembler language provided from Rockwell International and a typical such conventional preferred control program for operating the microprocessor 6000 of the present invention in accordance with the desired row grabbing function for the video display terminal is set forth below, with this version of the program utilizing the arrangement of FIG. 28 comprising one CPU chip 601, one 256-by-4 bit random access memory chip 605, one 1024-by-8 read only memory chip 603 and two input/output buffer chips 607:

MICROPROCESSOR 6000 CONTROL PROGRAM

```
             *
             *INITIALISATION
             *
0000 81              T       #1
             *SET O/P TO ZERO
0001 7F              LDI     0
0002 1C OE           IOL     #E
0004 7F              LDI     0
0005 1C OD           IOL     #D
0007 7F              LDI     0
0008 1C 07           IOL     #7
             *RESET FLIP-FLOPS
000A 26              RF1
000B 25              RF2
             *CLEAR RAM
000C 00 00           LBL     D15R15
000E 7F      IN10    LDI     0
000F 2F              EXD
0010 8E              T       IN10
0011 18              XBMX
0012 1A              XAX
```

```
0013 60                  ADI     F
0014 98                  T       IN20
0015 1A                  XAX
0016 18                  XBMX
0017 8E                  T       IN10
              *SET RAM SPECIAL VALUES
0018 CB         IN20     LB      R0D9
0019 71                  LDI     E               KBD CHARACTER (FOR INITIAL CALL)
001A 2B                  EXD     4
001B 7B                  LDI     4               CONSTANT (PCC BIT MASK)
001C 2F                  EXD     *
001D C7                  LB      R4D5
001E 7E                  LDI     1               SEARCHING FOR ROW (NOT)
001F 2F                  EXD     *
0020 C2                  LB      R6D2
0021 70                  LDI     F               KBD ROUTINE ADDRESS
0022 3A                  EX      5
0023 7E                  LDI     1               KBD # (INITIALLY PAGE 1)
0024 2A                  EXD     5
0025 70                  LDI     F
0026 2F                  EXD
0027 73                  LDI     C
0028 3F                  EX
0029 50 40               TL      SCHED
              *
              *
                         ORG     40
              *
              *
              *
              *SCHEDULER
              *  CHECKS 1)RAR CHANGED WITH REN HIGH & SCH/RAW CHANGED
              *               (PROCESS SCH)
              *          2)AS 1) WITH NO SCH/RAW CHANGE & RAR
              *               APPROACHING PRINT ROW (PROCESS RAR)
              *          3)PCC CHANGED & HIGH & PRINTING IN PROGRESS
              *               (PROCESS PRINT)
              *          4)KBD HELD FOR 1 MILLISEC AT LEAST
              *               (PROCESS KBD)
              *
              *
              *SCH HAS HIGHEST PRIORITY FOR CHECKING.
              *    CHANGES 110 MICROSEC (22 CYCLES) BEFORE
              *    RAR CHANGES & IS LATCHED UNTIL NEW ONE
              *    AVAILABLE. RAW DENOTES ROW TO WHICH IT
              *    APPLIES. IF UNCHANGED SCH FOR THIS RAW
              *    EITHER NOT CHANGED OR REPEATED - IN
              *    BOTH CASES IGNORE TO AVOID MULTIPLE
              *    PRINTS, ETC. CHECKED ONLY WHEN RAR
              *    CHANGES. RAR CHANGES EVERY 13*63 MICRO-
              *    SECS (163 CYCLES), SO HAVE COMPLETE
              *    PROGRAM CYCLE LESS THAN 141 CYCLES IF
              *    RAR UNCHANGED LAST TIME, OR 163 CYCLES
              *    IF RAR CHANGED LAST TIME. RAR ONLY VALID
              *    WHEN REN HIGH.
              *
              *CHECK RAR CHANGED
0040 CD         SCHED    LB      R3D10
0041 1C 19               IOL     #19             GET RAR
0043 0C                  EOR
0044 1E                  SKZ
0045 88                  T       *+3             RAR CHANGED
0046 50 80      PCXX     TL      PCCX            RAR UNCHANGED
0048 1C 13               IOL     #13             GET REN
004A 67                  ADI     8
004B 80                  T       SCHED           REN GONE LOW
004C 1C 19               IOL     #19             REREAD RAR IN CASE REN LOW WHEN 1ST REA
004E 1B                  LXA     *               SAVE IN X
004F 3F                  EX      *               SAVE IN RAM
              *CHECK SCH/RAW CHANGED
0050 C0                  LB      R1
0051 1C 03               IOL     #3              GET RAW
0053 19                  XABL    *               SET UP SCH TABLE OFFSET
0054 1C 0A               IOL     #A              GET SCH BITS 0-3
0056 0C                  EOR
0057 1E                  SKZ
```

```
0058 A0                T     SCXX         SCH CHANGED
0059 34                LD    3
005A 1C 1A             IOL   #1A          GET SCH BITS 4-6
005C 0C                EOR
005D 1E                SKZ
005E A5                T     SCYX         SCH CHANGED
005F A9                T     RARX         SCH UNCHANGED
0060 0C        SCXX    EOR   *            SAVE SCH BITS 0-3
0061 3C                EX    3
0062 1C 1A             IOL   #1A
0064 0C                EOR
0065 0C        SCYX    EOR   *            SAVE SCH BITS 4-6
0066 3C                EX    3
0067 DF                TM    SCHX         PROCESS SCH
0068 80                T     SCHED
               *
               *
               *IF NO SCH TO BE PROCESSED, NEXT PRIORITY IS TO
               *   SEARCH FOR ROW TO PRINT. IF THERE IS ONE,
               *   THE PRINTER INTERFACE MUST BE INFORMED
               *   WITHIN 189 MICROSECS (37 CYCLES) OF RAR
               *   CHANGING TO CORRECT VALUE BY PWR PULSE.
               *   SO IF RAR IS ONE BEFORE REQUIRED ROW, SET
               *   UP DATA FOR PRINT & WAIT IN LOOP FOR ROW TO
               *   CHANGE. MAY ALSO BE SEARCHING FOR ROW NOT
               *   TO BE PRINTED. IN THIS CASE, SEE IF ALL ROWS
               *   PRINTED & IF NOT, START SEARCH FOR NEXT ROW.
               *
               *CHECK CORRECT RAR
0069 C7        RARX    LB    R4D5
006A 30                LD    7
006B 1E                SKZ
006C 86                T     PCXX         NOT SEARCHING FOR ROW
006D 12                LAX   *            GET RAR
006E 0E                COMP
006F 0B                AD
0070 1E                SKZ
0071 86                T     PCXX         WRONG ROW
0072 31                LD    6
0073 19                XABL
0074 37                LD
0075 09                ADSK
0076 B9                T     RWGX         ROW NOT TO BE PRINTED
0077 53 17             TL    ROWP         PRINT THIS ROW
0079 53 3D     RWGX    TL    ROWG         GET NEXT ROW
               *
               *
               *IF RAR UNCHANGED, NEXT PRIORITY IS TO CHECK PRINTER
               *   CLOCK. PCC IS HIGH FOR 27 MSEC (5400 CYCLES) AND
               *   ANY PRINT PULSE MUST BE GIVEN DURING THIS TIME.
               *   TO CATCH THIS HIGH EVERY TIME, MAXIMUM PROGRAM
               *   CYCLE FOR RAR CHANGING MUST BE 158 CYCLES. IF
               *   PRINTING IS IN PROGRESS, ONE OF THE FOLLOWING
               *   PULSES WILL BE GIVEN WHEN PCC CHANGES TO HIGH:
               *     SPA - 16 LEADING SPACES ON 32-CHAR ROW
               *     PRT - PRINT ROW
               *     BLANK - NO PULSE WHILE WAITING FOR ROW TO BE
               *        PRINTED (32/64 CLOCKS) OR FOR 1 CLOCK DELAY
               *        IN 64-CHAR. ROW WHILE PRINTER I/F READS ROW
               *     LFD - LINE FEED AFTER ROW & BEFORE CERTAIN ROWS
               *     CAR - CARRIAGE RETURN (AS LFD)
               *
               *CHECK PCC CHANGED
                       ORG   80
0080 CA        PCCX    LB    R4D8
0081 1C 13             IOL   #13          GET NEW PCC
0083 0D                AND   *            GET BIT 2
0084 3F                EX
0085 38                EX    7            (RESTORE CONSTANT)
0086 3F                EX    *            SAVE NEW PCC
0087 0C                EOR   *            BIT 2 = 1 IF CHANGED
0088 63                ADI   C            CARRY IF BIT 2 = 1
0089 BC                T     KBXX         PCC NOT CHANGED
008A 37                LD
008B 60                ADI   F
008C BD                T     SHDX         NEW PCC = 0
008D 1F                DECB
```

```
008E 37                    LD
008F 60                    ADI    F
0090 BD                    T      SHDX      PRINTING NOT IN PROGRESS
               *SET UP NEXT PRINTER PULSE
0091 1F                    DECB
0092 37                    LD
0093 60                    ADI    F
0094 9F                    T      PR30      4-BIT COUNT = 0
0095 3F                    EX     *         STORE COUNT-1
0096 17        PR10        INCB
0097 30                    LD     7         GET NEXT O/P
0098 0D                    AND    *         MASK
0099 1C 0E     PR20        IOL    #E        PULSE PRINTER
009B 7F                    LDI    0
009C 1C 0E                 IOL    #E
009E BD                    T      SHDX      CONTINUE
009F 38        PR30        EX     7         STORE 4-BIT COUNT - 1
00A0 37                    LD
00A1 60                    ADI    F
00A2 A5                    T      PR40      6-BIT COUNT = 0
00A3 38                    EX     7         STORE 6-BIT COUNT - 1
00A4 96                    T      PR10      & O/P NORMALLY
               *GET NEW PRINTER PULSE
00A5 C9        PR40        LB     R3D7
00A6 30                    LD     7
00A7 61                    ADI    E
00A8 AC                    T      PR50      NEXT O/P = 1 (ROW TO BE PRINTED NEXT)
00A9 C8                    LB     R3D6
00AA 7F                    LDI    0         CLEAR COUNT FOR NON-ROW PRINT
00AB B1                    T      PR60
00AC 37        PR50        LD     *         GET MASK (=0 FOR 64-CHAR ROW)
00AD 2F                    EXD    *         (=1 FOR 32-CHAR ROW)
00AE 1E                    SKZ
00AF B1                    T      PR60      32-CHAR ROW (ACC=CT=1)
00B0 7C                    LDI    3         SET CT. FOR 64-CHAR ROW
00B1 3F        PR60        EX     *         STORE NEW COUNT
00B2 C9                    LB     R3D7      SHIFT LEFT NEXT O/P
00B3 37                    LD     *         (GET NEW O/P)
00B4 0B                    AD
00B5 3F                    EX
00B6 37                    LD
00B7 1E                    SKZ    *         (SKIP IF PRINT CYCLE COMPLETE)
00B8 99                    T      PR20      PRINT NEW CHAR
00B9 C7                    LB     R4D5
00BA 3F                    EX     *         SET SEARCHING FOR ROW
00BB BD                    T      SHDX      CONTINUE
               *
               *
               *IF RAR & PCC UNCHANGED, KBD FUNCTIONS ARE ALLOWED.
               *   MAXIMUM LENGTH IN ANY PROGRAM IS A LIMITED
               *   NUMBER OF CYCLES, SO A SUSPEND SUBROUTINE IS
               *   USED TO ENTER THE CURRENT PROGRAM, AND SUSPEND
               *   IT WHEN ITS TIME IS UP.
               *   THIS ALLOWS A PART ROUTINE BETWEEN TWO TM STORE'S
               *   TO BE 63 CYCLES, OR A COMPLETE ROUTINE TO BE
               *   25 CYCLES LONG.
               *
               *DO KEYBOARD FUNCTIONS
00BC D1        KBXX        TM     STORE     ENTER CURRENT PROGRAM
00BD 50 40     SHDX        TL     SCHED     CONTINUE
               *
               *
                           ORG    300
               *INITIAL KBD PROGRAM
0300 CC        KBYX        LB     R3D9
0301 70                    LDI    F
0302 09                    ADSK
0303 8E                    T      KBX20     KBD CT. = 0
0304 3C                    EX     3         SAVE CT. -1
0305 1C 09                 IOL    #9        GET KBD
0307 0C                    EOR
0308 1E                    SKZ
0309 8B                    T      KBX10     KBD CHANGED
030A 95                    T      KBX40     KBD UNCHANGED
030B 0C        KBX10       EOR
030C 3C                    EX     3         STORE NEW KBD
030D 93                    T      KBX30
```

```
*ENTER KBD DECODER
030E 34      KBX20    LD     3
030F D8               TM     KBDX      ENTER KBD ROUTINE
0310 7D      KBX25    LDI    2
0311 D3               TM     PLSB      PULSE KLR
0312 CC               LB     R3D9
0313 7B      KBX30    LDI    4         RESET COUNT
0314 3F               EX
0315 D1      KBX40    TM     STORE     SUSPEND - RETURN TO SCHEDULER
0316 80               T      KBYX
*
*
*RAR PROCESSING - SET UP DATA FOR PRINT & WAIT
*    FOR RAR TO CHANGE.
*
0317 7F      ROWP     LDI    0         CLEAR PRINT BIT
0318 3B               EX     4         GET SCH FOR ROW
0319 37               LD     *         C SET & SKIP IF 64-CHAR ROW
031A 09               ADSK   *
031B 71               LDI    E         32-CHAR ROW
031C 70               LDI    F         64-CHAR ROW
031D 1C 1D            IOL    #1D       SET RWL
031F 0E               COMP
0320 00 B8            LBL    D7R4
0322 38               EX     7         SAVE MASK
0323 7E               LDI    1
0324 28               EXD    7         SET NEXT O/P TO SPACE
0325 15               SKC
0326 AB               T      RP10      32-CHAR ROW
0327 38               EX     7         SET CT. FOR 64-CHAR. ROW
0328 7E               LDI    1         (DELAY CT. = 1)
0329 28               EXD    7
032A AD               T      RP20
032B 7E      RP10     LDI    1         SET CT. FOR 32-CHAR. ROW
032C 2F               EXD    *         (SPACE CT. = 16)
032D 7E      RP20     LDI    1
032E 3D               EX     2         CLEAR SEARCHING FOR ROW
032F 3A               EX     5         CLEAR ROW COUNT
0330 1C 19   RP30     IOL    #19       WAIT FOR RAR TO CHANGE
0332 0C               EOR
0333 1E               SKZ
0334 B0               T      RP30      WRONG RAR
0335 1C 13            IOL    #13
0337 67               ADI    8
0338 B0               T      RP30      REN LO
0339 7E               LDI    1
033A D3               TM     PLSB      PULSE PWR
033B 50 40   RP40     TL     SCHED     CONTINUE
*
*
*RAR PROCESSING - GET NEXT ROW
*
033D D7      ROWG     TM     GETROW
033E BB               T      RP40      CONTINUE
*
*
*
             ORG      C0
*
*PAGE 3
*    DATA ADDRESSES
*    SUBROUTINE ADDRESSES
*    EQUATES
*
*EQUATES
             D0R0     EQU    00        GROUP # 3RD DIGIT
             D0R3     EQU    30        KBD # MOST SIG. DIGIT
             D2R4     EQU    42        WORKSPACE (FOR BINARY*2)
             D5R4     EQU    45        SEARCHING FOR ROW (WHEN ZERO)
             D5R6     EQU    65        ROW COUNT
             D7R3     EQU    37        NEXT O/P
             D7R4     EQU    47        MASK
             D15R2    EQU    2F        TOP OF SCH TABLE
             D15R5    EQU    5F        TOP OF ROW STATUS REGISTER
             D15R15   EQU    FF        TOP OF USED RAM
             *DATA ADDRESSES
00C0 EF      R1       PTR    #10       SCH TABLE
```

```
00C1 FD        R0D2    PTR     #02         GROUP #
00C2 9D        R6D2    PTR     #62         SAVED KBD ROUTINE ADDRESS
00C3 8D        R7D2    PTR     #72         PAGE NUMBER
00C4 CD        R3D2    PTR     #32         CURRENT KBD NUMBER
00C5 8C        R7D3    PTR     #73         INITIALISING
00C6 CA        R3D5    PTR     #35         CURRENT ROW
00C7 BA        R4D5    PTR     #45         SEARCHING FOR ROW (WHEN ZERO)
00C8 C9        R3D6    PTR     #36         PRINT COUNT
00C9 C8        R3D7    PTR     #37         NEXT O/P
00CA B7        R4D8    PTR     #48         MASK FOR PCC VALUE
00CB F6        R0D9    PTR     #09         KEYBOARD CHARACTER
00CC C6        R3D9    PTR     #39         KEYBOARD COUNT
00CD C5        R3D10   PTR     #3A         LAST RAR
00CE FF                PTR
00CF FF                PTR
               *SUBROUTINE ADDRESSES
00D0 FD        INDEX   PTR     ZINDE       SWITCH ROUTINE
00D1 E2        STORE   PTR     ZSTOR       SUSPEND OR RE-ENTER KBD ROUTINE
00D2 F6        SHIFT   PTR     ZSHIF       DOUBLE BINARY NUMBER
00D3 E8        PLSB    PTR     ZPLSB       SET AC AS PULSE ON I/O 0 GRP B
00D4 6C        CLEAR   PTR     ZCLEA       CLEAR 3 DIGITS
00D5 65        SCHRS   PTR     ZSCHR       RESET SPECIAL CHARACTERS
00D6 EF        PEND    PTR     ZPEND       STOP PRINTING & MODE A
00D7 BF        GETROW  PTR     ZGETR       GET NEXT ROW
00D8 D6        KBDX    PTR     ZKBDX       SELECT KBD ROUTINE
00D9 3F        NUM     PTR     ZNUM        KBD ROUTINES (IF <26 CYCLES, BEGIN XS,
00DA 5D        GRP     PTR     ZGRP        FINISH RTN; IF >25 CYCLES, DO NOT
00DB 07        PRINT   PTR     ZPRIN       BEGIN XS, FINISH TL KBX25, BREAK UP
00DC 38        UP      PTR     ZUP         INTO 63 CYCLE BLOCKS)
00DD 1C        BACK    PTR     ZBACK
00DE 5D        CALL    PTR     ZGRP
00DF FF        SCHX    PTR     ZSCHX       JUMP TO SCH DECODER
00E0 74        ERASE   PTR     ZERAS       SCH ROUTINES (BEGIN ALL WITH XS)
00E1 9C        PROW0   PTR     ZPROW       (FINISH RTN)
00E2 99        PROWX   PTR     ZPROX       (MUST BE <114 CYCLES)
00E3 70        ERAS2   PTR     ZERA2       ERASE SCREEN (BY KBD)
00E4 7F        PGPRT   PTR     ZPP20       PAGE PRINT (BY KBD)
00E5 94        RWPRT   PTR     ZPX15       ROW PRINT (BY KBD)
               *
               *
               *
                       ORG     100
               *
               *PAGES 4-7
               *   SUBROUTINES CALLED BY TM
               *
               *
               *GO TO S/R FOR SCH PROCESSING
0100 52 2F     ZSCHX   TL      SCHY
               *
               *
               *
               *INDEX - SWITCH ROUTINE
               *   SETS RETURN ADDR. BITS 0-3 TO COMP. OF M
               *   & ADDS COMP. OF M EOR 3 TO RETURN ADDR. BITS 4-7.
               *   LEAVES B AS B EOR 3.
               *   SWITCH TABLE MUST START AT 16-WD. BLOCK &
               *   LIE WITHIN 256-WD. BLOCK. CALLING INSTRUCTION
               *   MUST BE AT 16-WD BOUNDARY - 1. IF M EOR 3 = 0
               *   IS NOT TO AFFECT BITS 4-7 OF RETURN ADDRESS,
               *   TABLE MUST NOT START AT 64-WD. BLOCK & CALLING
               *   INSTRUCTION MUST IMMEDIATELY PRECEDE IT. IF M EOR 3
               *   = -1 IS NOT TO AFFECT BITS 4-7 OF RETURN ADDRESS,
               *   CALLING INSTRUCTION MUST BE 17 WORDS BEFORE
               *   TABLE & NOT AT END OF 64-WORD BLOCK.
0102 6F        ZINDE   CYS
0103 34                LD      3
0104 6F                CYS
0105 0B                AD
0106 6F                CYS
0107 6F                CYS
0108 05                RTN
               *
               *
               *
               *MULTIPLY BINARY # BY 2
               *   BY ADDING TO ITSELF
```

```
0109 C3      ZSHIF   LB      R7D2
010A 24              RC
010B 37      ZS10    LD
010C 0A              ADC
010D 2F              EXD
010E 8B              T       ZS10
010F 05              RTN
             *
             *
             *
             *STOP PRINTING
             *   CLEAR MODE A
             *   CLEAR ALL ROW, CRLF BITS
             *
0110 26      ZPEND   RF1     *           CLEAR MODE A
0111 00 A0           LBL     D15R5
0113 7F      PE10    LDI     0           CLEAR ROW, CRLF BITS
0114 2F              EXD
0115 93              T       PE10
0116 05              RTN
             *
             *
             *
             *PULSE OUTPUT ROUTINE
             *   SET O/P ON GROUP B OF I/O 0
             *   TO ACCUMULATOR & CLEAR IMMEDIATELY.
             *   PULSE LENGTH = 15 MICROSEC.
0117 1C 0D   ZPLSB   IOL     #D
0119 7F              LDI     0
011A 1C 0D           IOL     #D
011C 05              RTN
             *
             *
             *
             *SUSPEND OR RE-ENTER KBD ROUTINE PROGRAM.
             *   MUST NOT BE IN ANY KBD ROUTINE TOO LONG
             *   SO CALLING THIS WILL STORE CURRENT ADDRESS
             *   & RETURN TO THE LAST STORED ADDRESS.
             *   STORED ADDRESS INITIALLY SET TO KBYX
             *   SO CALLED AT KBXX TO ENTER, & AFTER
             *   BLOCKS OF KBD ROUTINE TO SUSPEND.
011D C2      ZSTOR   LB      R6D2
011E 6F      ST10    CYS
011F 2F              EXD
0120 9E              T       ST10
0121 6F              CYS
0122 05              RTN
             *
             *
             *
             *PROCESS KBD
             *   POSSIBLE KBD VALUES:
             *     0-9 NUMERALS
             *     10  GROUP
             *     11  PRINT
             *     12  UP
             *     13  BACK
             *     14  CALL
             *     15  IDLE STATE
             *
                     ORG     129
0129 33      ZKBDX   LD      4           GET KBD CHAR.
012A 3B              EX      4           SAVE & GET LAST KBD
012B 0C              EOR
012C 1E              SKZ     *           NOT CHANGED?
012D AF              T       *+2         PROCESS NEW KBD
012E 05              RTN
             *THIS TABLE MUST BEGIN AT END OF 16-WD BLOCK & LIE
             *   WITHIN A 64-WD BLOCK.
012F D0      *       TM      INDEX       (RETURN ADDRESS = P + SWITCH INDEX)
0130 05              RTN     *           NO CHARACTER
0131 DE              TM      CALL
0132 DD              TM      BACK
0133 DC              TM      UP
0134 DB              TM      PRINT
0135 DA              TM      GRP
0136 D9              TM      NUM
```

```
0137 D9                    TM      NUM
0138 D9                    TM      NUM
0139 D9                    TM      NUM
013A D9                    TM      NUM
013B D9                    TM      NUM
013C D9                    TM      NUM
013D D9                    TM      NUM
013E D9                    TM      NUM
013F D9                    TM      NUM
          ***END OF TABLE
          *
          *
          *
          *GET NEXT ROW & PRINT LEADING CRLF IF NECESSARY.
          *    STOP PRINT MODE A IF ROW COUNT = 16
          *    (CLEARED WHENEVER ROW OR CRLF PRINTING IS SET
          *    UP, OR WHEN A ROW PRINT OR CRLF BIT IS SET IN
          *    ROW STATUS; INCREMENTED EACH TIME NEXT ROW GOT).
          *    CALLED WHEN ROW PRINTED TO GET NEXT, OR WHEN
          *    PRINTING TO BE STARTED (WHEN PUT CURRENT ROW
          *    = 1ST ROW - 1).
          *
          *GET NEXT ROW
0140 00 BA    ZGETR   LBL     D5R4
0142 7F               LDI     0
0143 38               EX      7           SET SEARCHING FOR ROW
0144 7E               LDI     1
0145 0B               AD
0146 3F               EX      *           INCR. CURRENT ROW
0147 31               LD      6
0148 19               XABL    *           GET ROW STATUS
0149 7B               LDI     4
014A 0D               AND
014B 1E               SKZ
014C 98               T       GT20        CRLF BIT SET
014D 00 9A            LBL     D5R6
014F 37               LD
0150 6E               ADI     1           INCR. ROW COUNT
0151 96               T       GT10        NOT YET SCANNED ALL 16 ROWS
          *TERMINATE KBD PRINT MODE
0152 26               RF1     *           CLEAR PRINT MODE A (ALL ROWS PRINTED)
0153 3D               EX      2
0154 7E      GT05     LDI     1
0155 3D               EX      2           CLEAR SEARCHING FOR ROW
0156 3F      GT10     EX      *           CLEAR (OR STORE) ROW COUNT
0157 05               RTN
          *PRINT LEADING CRLF
0158 0C      GT20     EOR
0159 3F               EX      *           CLEAR CRLF BIT
015A 00 C8            LBL     D7R3
015C 7D               LDI     2
015D 2F               EXD     *           SET TO PRINT LFD NEXT
015E 7F               LDI     0
015F 38               EX      7           PRINT COUNT = 0
0160 7F               LDI     0
0161 2F               EXD
0162 94               T       GT05
          *
          *
          *
          ****SPECIAL CHARACTER ROUTINES
          *
          *
          *
          *SPECIAL CHARACTER ROW PRINTS
          *    PROWX - ONLY IF IN MODE B, NO LEADING CRLF
          *    PROWO - ALWAYS
          *
0163 06      ZPROW    XS      *           DISCARD RETURN ADDRESS
0164 30               LD      7
0165 AB               T       ZPX15
0166 06      ZPROX    XS
0167 14               SKF2
0168 05               RTN     *           NOT MODE B
0169 30               LD      7
016A 77               LDI     8           SET ONLY ROW PRINT BIT
016B 73      ZPX15    LDI     C           ENTRY FROM KBD ROUTINE
```

```
016C 2F              EXD      *           SET CRLF & ROW PRINT BITS
016D AE              T        *+1         (IGNORE SKIP)
016E 11              LABL     *           SAVE ROW-1
016F 1B              LXA
0170 00 9A           LBL      D5R6
                *ENTRY POINT FROM PPGEX
0172 7F         PX20 LDI      0
0173 3D              EX       2           CLEAR ROW COUNT
0174 37              LD
0175 60              ADI      F
0176 05              RTN      *           SEARCHING FOR ROW
0177 C9              LB       R3D7
0178 37              LD
0179 1E              SKZ
017A 05              RTN      *           PRINTING IN PROGRESS
017B C6              LB       R3D5
017C 12              LAX
017D 3F              EX       *           SET CURRENT ROW
017E D7              TM       GETROW      PRINT IT
017F 05              RTN
                *
                *
                     ORG      180
                *
                *
                *SPECIAL CHARACTER PAGE PRINT
                *   NO LONGER USED FOR SCH
                *   ONLY USED FOR COMPLETION OF KBD PAGE PRINT
                *   SCH CODE LEFT AS COMMENTS IN CASE OF FUTURE USE
                *
                *ZPPGE XS * DISCARD RETURN ADDRESS
                * SKFZ
                * RTN * NOT MODE B
                * LBL D15R5
                *PP10 LDI 8 SET ROW BIT ON ALL ROWS
                * EXD
                * T PP10
0180 17         ZPP20 INCB    *           ENTRY FROM KBD ROUTINE
0181 82              T        *+1
0182 73              LDI      C           SET CRLF BIT ON ROW 1
0183 3F              EX
0184 C6              LB       R3D5
0185 7F              LDI      0
0186 3A              EX       5           CURRENT ROW = 0
0187 70              LDI      F
0188 1B              LXA      *           SAVE CURRENT ROW IF GETROW CALLED
0189 51 72           TL       PX20
                *
                *
                *
                *SPECIAL CHARACTER ERASE
018B 06         ZERAS XS
018C 7B         XERA2 LDI     4           ENTRY FROM KBD ROUTINE
018D D3              TM       PLSB
018E 05              RTN
                *KBD S/R - ERASE SCREEN
018F 7D         ZERA2 LDI     2
0190 1C 17           IOL      #17         SET KAC
0192 8C              T        XERA2       ERASE SCREEN
                *
                *
                *
                *
                *
                *
                ****EXTRA UTILITIES
                *
                *
                *
                *CLEAR 3 SUCCESSIVE RAM DIGITS
0193 7F         ZCLEA LDI     0
0194 2F              EXD
0195 7F              LDI      0
0196 2F              EXD
0197 7F              LDI      0
0198 3F              EX
0199 05              RTN
                *
```

```
                    *
                    *
                    *RESET SPECIAL CHARACTERS
019A 00 D0   ZSCHR  LBL     D15R2
019C 7F      SR10   LDI     0
019D 3C             EX      3
019E 7F             LDI     0
019F 2C             EXD     3
01A0 9C             T       SR10
01A1 05             RTN
                    *
                    *
                    *
                    ****KEYBOARD ROUTINES
                    *
                    *
                    *
                    *PROCESS GROUP KEY
                    *   NO GROUP IGNORED
                    *   INVALID GROUP SET TO ZERO, WITH PAGE 10
                    *   GOOD GROUP # SENT TO TERMINAL WITH PGE # ZERO
                    *
                    *
                    *PROCESS CALL KEY
                    *   NO NUMBER = 0
                    *   GROUP NUMBER NOT AFFECTED
                    *   NEW PAGE NUMBER SENT TO TERMINAL
                    *
01A2 E3      ZGRP   TM      ERAS2       CLEAR SCREEN
01A3 00 CF          LBL     DOR3
01A5 37             LD
01A6 6E             ADI     1
01A7 AE             T       K10         NUMBER INSERTED BEFORE GROUP/CALL
01A8 3F             EX      *           NO NUMBER = 0
01A9 CB             LB      ROD9
01AA 37             LD
01AB 6A             ADI     5
01AC 53 D2          TL      RESET       FROM GRP - IGNORE NO #
                    *
01AE D1      K10    TM      STORE       WAIT
                    *
01AF 53 40          TL      XGPCL       SELECT NEW GROUP/PAGE
                    *
                    *
                    ORG     1C0
                    *
                    *
                    *PROCESS NUMERAL KEY
                    *   ADD INTO CURRENT 3-DIGIT NUMBER
                    *   EXCESS DIGITS SHIFTED OFF END
                    *
01C0 06      ZNUM   XS
01C1 34             LD      3           GET KBD CHARACTER
01C2 37             LD
01C3 C4             LB      R3D2
01C4 2F      NM10   EXD     *           INSERT IN KBD NUMBER
01C5 84             T       NM10
01C6 05             RTN
                    *
                    *
                    *
                    *PROCESS UP KEY
                    *   IGNORED IF PAGE # AT HIGH LIMIT
                    *   ELSE INCREMENTS PAGE NUMBER
                    *
01C7 E3      ZUP    TM      ERAS2       CLEAR SCREEN
                    *
01C8 D1             TM      STORE       WAIT
                    *
01C9 C3             LB      R7D2
01CA 37             LD
01CB 66             ADI     9
01CC 98             T       UP30        BITS 0-3 NOT 7-F
01CD 1F             DECB
01CE 37             LD
01CF 6D             ADI     2
01D0 98             T       UP30        BITS 4-7 NOT E/F
01D1 1F             DECB
```

```
01D2 7C              LDI    3
01D3 0D              AND
01D4 62              ADI    D
01D5 98              T      UP30       BITS 8-9 NOT 3
01D6 53 D2   UP15    TL     RESET      PAGE NUMBER AT HIGH LIMIT
             *
01D8 D1      UP30    TM     STORE      WAIT
             *UP ACCEPTED
01D9 C3              LB     R7D2       ADD 1 TO PAGE #
01DA 24              RC
01DB 7E              LDI    1
01DC 9E              T      UP50
01DD 7F      UP40    LDI    0
01DE 0A      UP50    ADC
01DF 2F              EXD
01E0 9D              T      UP40
01E1 53 96           TL     SEND       SEND TO TERMINAL
             *
             *
             *
             *PROCESS BACK KEY
             *    IGNORED IF PAGE # AT ZERO
             *    ELSE DECREMENTS PAGE NUMBER
             *
01E3 E3      ZBACK   TM     ERAS2      CLEAR SCREEN
01E4 C3              LB     R7D2
01E5 37      BK10    LD
01E6 1E              SKZ
01E7 AF              T      BK20
01E8 1F              DECB
01E9 40              SKBI   0
01EA A5              T      BK10
01EB 73              LDI    C
01EC 0F              OR
01ED 6C              ADI    3
01EE 96              T      UP15       PAGE NUMBER = 0
             *
01EF D1      BK20    TM     STORE      WAIT
             *BACK ACCEPTED
01F0 C3              LB     R7D2       SUBTRACT 1 FROM PAGE #
01F1 24              RC
01F2 70      BK30    LDI    F
01F3 0A              ADC
01F4 2F              EXD
01F5 B2              T      BK30
01F6 53 96           TL     SEND       SEND TO TERMINAL
             *
             *
             *
             *PROCESS PRINT KEY
             *    CODE IN ANOTHER PAGE
             *
01F8 52 C0   ZPRIN   TL     XPRIN
             *
             *
             *
                     ORG    22F
             *
             *PAGES 8-15 (EXCEPT PAGE 12 300-33F USED ALREADY)
             *    SUBROUTINES CALLED BY TML OR OTHER PROGRAMS
             *
             *
             *
             *PROCESS SCH
             *THIS TABLE MUST BEGIN AT THE END OF A 16-WD BLOCK
             *   (NOT A 64-WORD BLOCK) & LIE WITHIN A 256-WD BLOCK.
             *   & THE SWITCH TABLE MUST BE 16 WORDS ON FROM
             *   CALLING INSTRUCTION.
022F D0      SCHY    TM     INDEX      (RETURN ADDRESS = P + SWITCH INDEX)
             *    AN SCH 7F WILL ADD 1 TO RETURN ADDR. BITS 4-7 &
             *    THEREFORE RETURN HERE (16 WDS ON FROM CALLING INSTRUCTION).
                     ORG    240
0240 05              RTN
0241 05              RTN
0242 05              RTN
0243 05              RTN
0244 05              RTN
0245 05              RTN
```

| | | |
|---|---|---|
| 0246 | 05 | RTN |
| 0247 | 05 | RTN |
| 0248 | 05 | RTN |
| 0249 | 05 | RTN |
| 024A | 05 | RTN |
| 024B | 05 | RTN |
| 024C | 05 | RTN |
| 024D | 05 | RTN |
| 024E | 05 | RTN |
| 024F | 05 | RTN |
| 0250 | 05 | RTN |
| 0251 | 05 | RTN |
| 0252 | 05 | RTN |
| 0253 | 05 | RTN |
| 0254 | 05 | RTN |
| 0255 | 05 | RTN |
| 0256 | 05 | RTN |
| 0257 | 05 | RTN |
| 0258 | 05 | RTN |
| 0259 | 05 | RTN |
| 025A | 05 | RTN |
| 025B | 05 | RTN |
| 025C | 05 | RTN |
| 025D | 05 | RTN |
| 025E | 05 | RTN |
| 025F | 05 | RTN |
| 0260 | 05 | RTN |
| 0261 | 05 | RTN |
| 0262 | 05 | RTN |
| 0263 | 05 | RTN |
| 0264 | 05 | RTN |
| 0265 | 05 | RTN |
| 0266 | 05 | RTN |
| 0267 | 05 | RTN |
| 0268 | 05 | RTN |
| 0269 | 05 | RTN |
| 026A | 05 | RTN |
| 026B | 05 | RTN |
| 026C | 05 | RTN |
| 026D | 05 | RTN |
| 026E | 05 | RTN |
| 026F | 05 | RTN |
| 0270 | 05 | RTN |
| 0271 | 05 | RTN |
| 0272 | 05 | RTN |
| 0273 | 05 | RTN |
| 0274 | 05 | RTN |
| 0275 | 05 | RTN |
| 0276 | 05 | RTN |
| 0277 | 05 | RTN |
| 0278 | 05 | RTN |
| 0279 | 05 | RTN |
| 027A | 05 | RTN |
| 027B | 05 | RTN |
| 027C | 05 | RTN |
| 027D | 05 | RTN |
| 027E | 05 | RTN |
| 027F | 05 | RTN |
| 0280 | 05 | RTN |
| 0281 | 05 | RTN |
| 0282 | 05 | RTN |
| 0283 | 05 | RTN |
| 0284 | 05 | RTN |
| 0285 | 05 | RTN |
| 0286 | 05 | RTN |
| 0287 | 05 | RTN |
| 0288 | 05 | RTN |
| 0289 | 05 | RTN |
| 028A | 05 | RTN |
| 028B | 05 | RTN |
| 028C | 05 | RTN |
| 028D | 05 | RTN |
| 028E | 05 | RTN |
| 028F | 05 | RTN |
| 0290 | 05 | RTN |
| 0291 | 05 | RTN |
| 0292 | 05 | RTN |
| 0293 | 05 | RTN |

```
0294 05              RTN
0295 05              RTN
0296 E1              TM      PROWO     SCH=41
0297 05              RTN
0298 05              RTN
0299 05              RTN
029A 05              RTN
029B 05              RTN
029C 05              RTN
029D 05              RTN
029E E1              TM      PROWO     SCH=33
029F E0              TM      ERASE     SCH=32
02A0 E2              TM      PROWX     SCH=31
02A1 05              RTN
02A2 E2              TM      PROWX     SCH=29
02A3 05              RTN
02A4 E2              TM      PROWX     SCH=27
02A5 05              RTN
02A6 E2              TM      PROWX     SCH=25
02A7 05              RTN
02A8 E2              TM      PROWX     SCH=23
02A9 05              RTN
02AA E2              TM      PROWX     SCH=21
02AB 05              RTN
02AC E2              TM      PROWX     SCH=19
02AD 05              RTN
02AE E2              TM      PROWX     SCH=17
02AF 05              RTN
02B0 E2              TM      PROWX     SCH=15
02B1 05              RTN
02B2 E2              TM      PROWX     SCH=13
02B3 05              RTN
02B4 E2              TM      PROWX     SCH=11
02B5 05              RTN
02B6 E2              TM      PROWX     SCH=9
02B7 05              RTN
02B8 E2              TM      PROWX     SCH=7
02B9 05              RTN
02BA E2              TM      PROWX     SCH=5
02BB 05              RTN
02BC E2              TM      PROWX     SCH=3
02BD 05              RTN
02BE E2              TM      PROWX     SCH=1
02BF 05              RTN     *         SCH=0
               ***END OF TABLE
               *
               *
               *
               ****MORE KEYBOARD ROUTINES IN PAGES 8-15
               *
                     ORG     2C0
               *
               *
               *PROCESS PRINT KEY
               *   NO NUMBER = PRINT PAGE OR STOP PRINT
               *   NUMBER 0 = START MODE B
               *   NUMBER 1-16 = PRINT ROW
               *
02C0 00 CF     XPRIN LBL     DOR3
02C2 37              LD
02C3 6E              ADI     1
02C4 9A              T       P60       NUMBER INSERTED
               *
02C5 D1              TM      STORE     WAIT
               *NO NUMBER INSERTED
02C6 16              SKF1
02C7 89              T       P10
02C8 8B              T       P20       MODE A
02C9 14        P10   SKF2
02CA 8E              T       P30       NOT MODE B
               *STOP PRINTING
02CB 25        P20   RF2     *         CLEAR MODE B
02CC D6              TM      PEND      CLEAR MODE A, ROW, CRLF BITS
02CD 98              T       P50       EXIT
               *PRINT PAGE
02CE 22        P30   SF1     *         SET MODE A
02CF 00 A0           LBL     D15R5
02D1 77        P40   LDI     8         SET ALL ROW BITS
```

```
02D2 2F              EXD
02D3 91              T     P40
           *
02D4 D1              TM    STORE     WAIT
           *
02D5 00 A0           LBL   D15R5     RESET B
02D7 E4              TM    PGPRT     USE SCH ROUTINE TO SET REST OF DATA
02D8 53 D2    P50    TL    RESET     RESET KBD # AND EXIT
           *NUMBER INSERTED
02DA C4       P60    LB    R3D2
02DB 37              LD
02DC 66              ADI   9
02DD 9F              T     P70
02DE A6              T     P80
02DF 1F       P70    DECB
02E0 7E              LDI   1
02E1 0C              EOR
02E2 1E              SKZ
02E3 B1              T     P90
02E4 17              INCB
02E5 76              LDI   9
02E6 70       P80    LDI   F
02E7 0B              AD
           *PRINT ROW
02E8 22              SF1   *         SET MODE A
02E9 25              RF2   *         CLEAR MODE B
02EA 3F              EX    *         SAVE ROW #
           *
02EB D1              TM    STORE     WAIT
           *
02EC C4              LB    R3D2
02ED 39              EX    6         GET ROW #
02EE 19              XABL  *         GET ROW STATUS WORD
02EF E5              TM    RWPRT     USE SCH ROUTINE TO SET REST OF DATA
02F0 98              T     P50       EXIT
           *SET MODE B
02F1 17       P90    INCB
02F2 37              LD
02F3 1E              SKZ
02F4 A6              T     P80       NOT ZERO NUMBER - PRINT ROW
02F5 26              RF1   *         CLEAR MODE A
02F6 21              SF2   *         SET MODE B
02F7 98              T     P50       EXIT
           *
                     ORG   340
           *
           *
           *
           *CONTINUE WITH GROUP/CALL KEY PROCESSING
           *    THE STORY SO FAR:-
           *    SCREEN ERASED, NO NUMBER DEALT WITH
           *
           *CONVERT DECIMAL TO BINARY NUMBER
0340 C3       XGPCL  LB    R7D2
0341 D4              TM    CLEAR     INITIALISE BINARY TO ZERO
0342 3F              EX
0343 38              EX    7         GET GROUP BITS 8/9
0344 3F              EX
0345 37              LD    *         SHIFT TWICE RIGHT & INSERT IN GROUP
0346 0B              AD
0347 3F              EX
0348 37              LD
0349 0A              ADC
034A 3F              EX
034B 37              LD
034C 0A              ADC
034D 2B              EXD   4
034E 8F              T     *+1
034F 7F              LDI   0
0350 3F              EX    *         INITIALISE POINTER FOR KBD # DIGITS
           *ADD IN NEXT DIGIT TO NUMBER SO FAR
0351 7E       DB20   LDI   1
0352 0B              AD    *         INCREMENT POINTER
0353 38              EX    7
0354 19              XABL
0355 37              LD    *         GET NEXT DIGIT
0356 C3              LB    R7D2
0357 24              RC
0358 9A              T     DB40
```

```
0359 7F      DB30    LDI   0            ADD ANY CARRY
035A 0A      DB40    ADC
035B 2F              EXD
035C 99              T     DB30
             *CHECK COMPLETION
035D 34              LD    3
035E 37              LD
035F 62              ADI   D
0360 A3              T     DB60         NOT ALL DIGITS DONE
0361 53 80           TL    DB90         FINISHED
             *
0363 D1      DB60    TM    STORE        WAIT
             *MULTIPLY NUMBER SO FAR BY 10 (MAKE ROOM FOR NEXT DIGIT)
0364 D2              TM    SHIFT        *2
0365 C3              LB    R7D2
0366 34      DB70    LD    3            SAVE *2
0367 2C              EXD   3
0368 A6              T     DB70
0369 D2              TM    SHIFT        *4
             *
036A D1              TM    STORE        WAIT
             *
036B D2              TM    SHIFT        *8
036C 00 BD           LBL   D2R4         ADD *2
036E 24              RC
036F 34      DB80    LD    3
0370 0A              ADC
0371 2C              EXD   3
0372 AF              T     DB80
0373 91              T     DB20         DO NEXT DIGIT
                     ORG   380
             *
0380 D1      DB90    TM    STORE        WAIT
             *COMPLETION
0381 CB              LB    R0D9
0382 37              LD
0383 6A              ADI   5
0384 86              T     *+2          FROM GROUP
0385 8C              T     DB120        FROM CALL
0386 C3              LB    R7D2
0387 30      DB100   LD    7
0388 28              EXD   7
0389 87              T     DB100
038A C3              LB    R7D2
038B D4      DB110   TM    CLEAR        CLEAR PAGE #
038C 00 FF   DB120   LBL   D0R0         RESET GROUP BITS 8/9
038E 37              LD
038F 0B              AD
0390 0B              AD
0391 0B              AD
0392 3F              EX
0393 30              LD    7
0394 0F              OR
0395 3F              EX
             *SEND NEW GROUP/PAGE TO TERMINAL
0396 D1      SEND    TM    STORE        WAIT
             *
0397 D6              TM    PEND         STOP PRINTING
             *
0398 D1      SD10    TM    STORE        WAIT
             *SEND PAGE #
0399 C3              LB    R7D2
039A 24              RC    *            MARK PAGE # SENDING
039B 34      SD20    LD    3            GET 4 BITS FOR GAD/PAD
039C 1C 1E           IOL   #1E          SEND
039E 42              SKBI  2
039F A4              T     SD24         NOT 1ST 4 BITS
03A0 15              SKC
03A1 7E              LDI   1            1ST 4 BITS PAGE #
03A2 77              LDI   8            1ST 4 BITS GROUP #
03A3 AB              T     SD32
03A4 15      SD24    SKC
03A5 A8              T     SD30         2ND/3RD 4 BITS PAGE #
03A6 53 C0           TL    SD40         LAST 4-BITS GROUP #
03A8 41      SD30    SKBI  1
03A9 7B              LDI   4            3RD 4 BITS PAGE #
03AA 7D              LDI   2            2ND 4 BITS PAGE #
03AB 1C 07   SD32    IOL   #7           PULSE LEN
03AD 7F              LDI   0
03AE 1C 07           IOL   #7
03B0 2C              EXD   3
```

```
03B1 9B              T     SD20
         *
03B2 D1              TM    STORE        WAIT
         *SEND GROUP #
03B3 C1              LB    R0D2
03B4 20              SC    *.           MARK GROUP # SENDING
03B5 9B              T     SD20
                     ORG   3C0
03C0 77     SD40     LDI   8
03C1 D3              TM    PLSB
03C2 1C 13           IOL   #13          GET PER
03C4 3F              EX
03C5 7D              LDI   2
03C6 0D              AND
03C7 60              ADI   F
03C8 9C              T     SD45         INVALID GROUP
03C9 C5              LB    R7D3         PER OK
03CA 2F              EXD
03CB 1E              SKZ   *            INITIALISING
03CC 91              T     SD44
03CD 7D              LDI   2
03CE 3F              EX    *            CALL PAGE 2
03CF 53 98  SD43     TL    SD10         SEND
03D1 D5     SD44     TM    SCHRS        RESET SCH'S
         *
03D2 D1     RESET    TM    STORE        WAIT
         *RESET KBD # AND EXIT
03D3 7F              LDI   0
03D4 1C 17           IOL   #17          CLEAR KAC
03D6 C4              LB    R3D2
03D7 D4     RS10     TM    CLEAR
03D8 70              LDI   F
03D9 3F              EX
03DA 53 10           TL    KBX25        RETURN TO SCHEDULER
         *INVALID GROUP - SET TO ZERO
03DC C5     SD45     LB    R7D3         PER BAD
03DD 09              ADSK
03DE 8F              T     SD43         INITING - RESEND PGE 1
03DF 1F              DECB
03E0 7C              LDI   3            BAD GRP - SEND GRP 0 PGE 3
03E1 7F     SD60     LDI   0
03E2 38              EX    7
03E3 7F              LDI   0
03E4 28              EXD   7
03E5 A1              T     SD60
03E6 8F              T     SD43
         *
         *
         *
                     END
```

Figure 24:
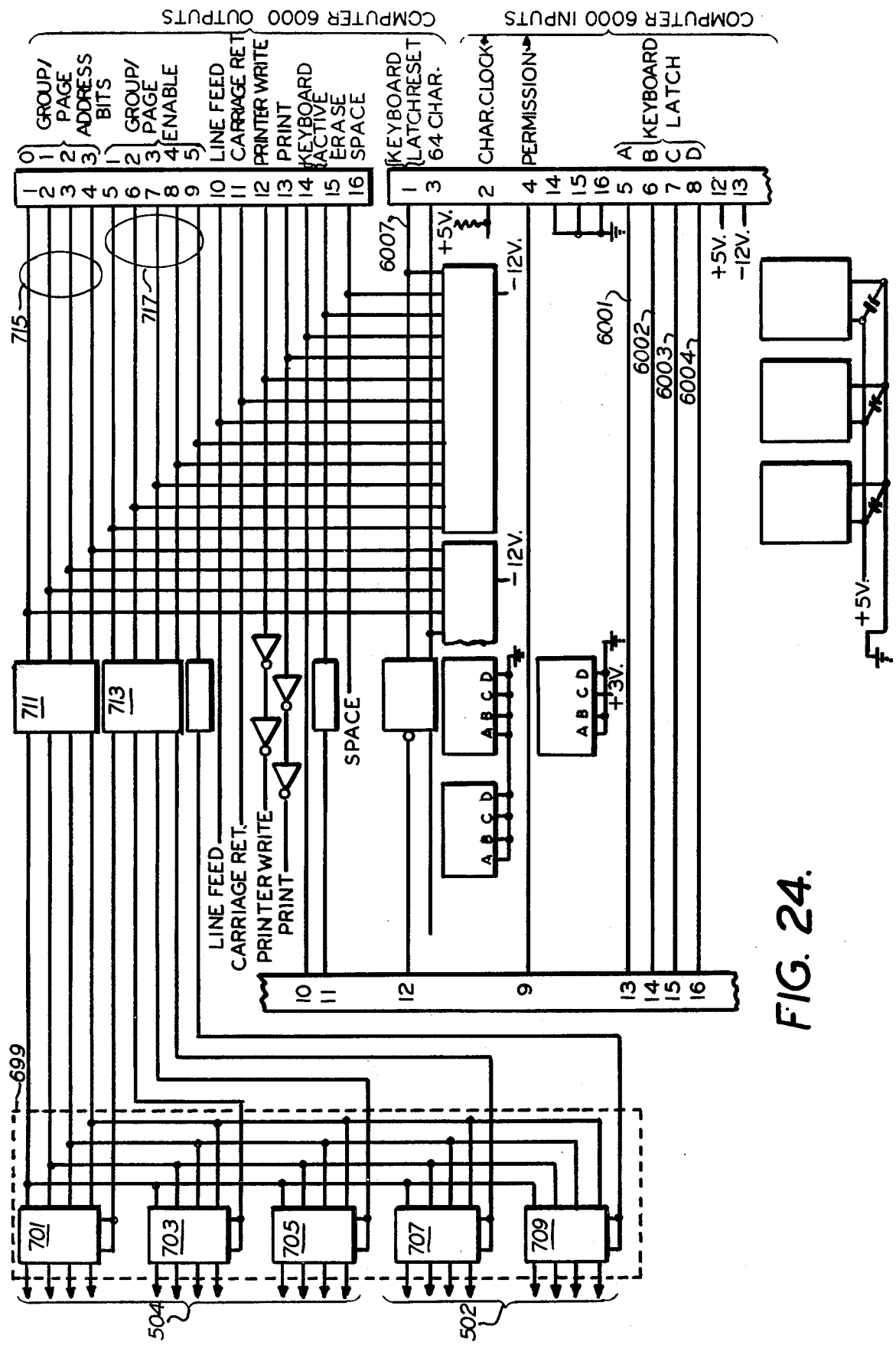
FIG. 24 is a block diagram, partially in schematic, of the various interface connections between the microprocessor and the keyboard in the preferred improved receiver of the present invention.
Figure 26:
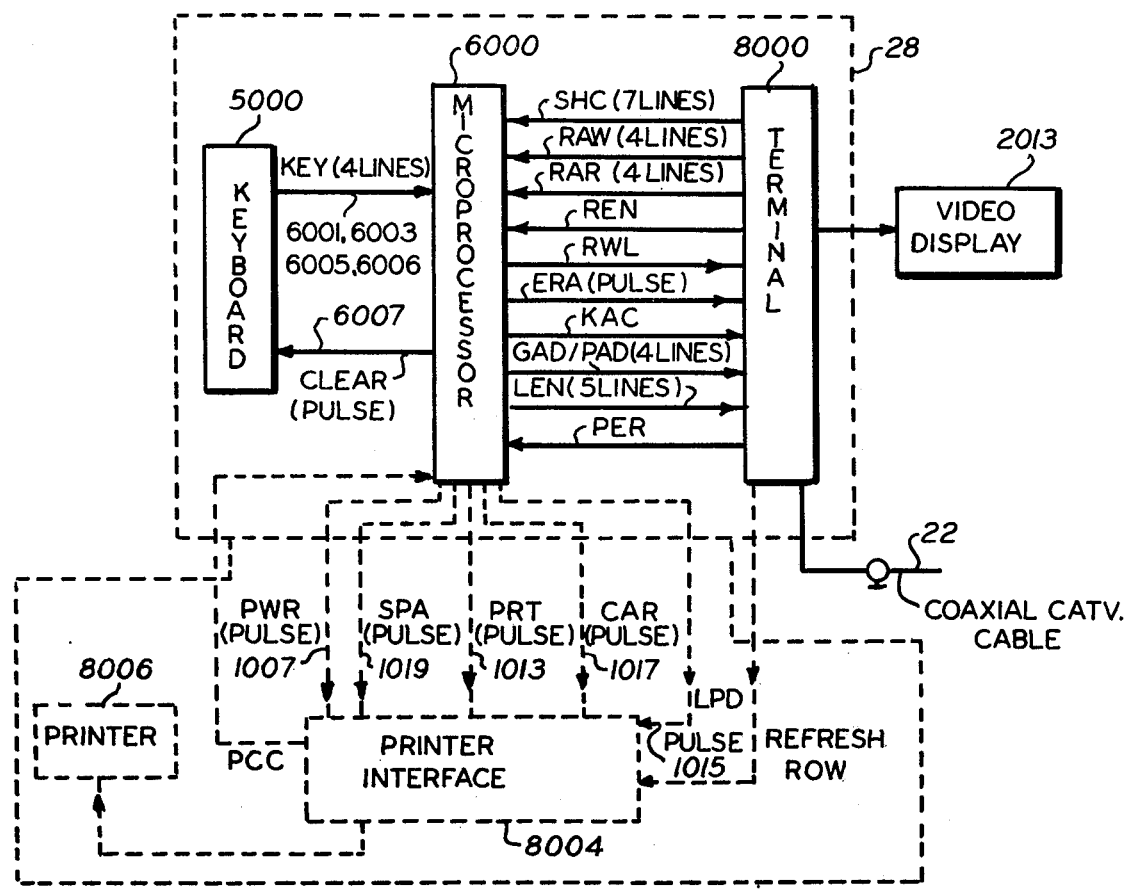
FIG. 26 is a block diagram of the preferred improved receiver of the present invention including a functional indication of the various control signals utilized therein.
Figure 27:
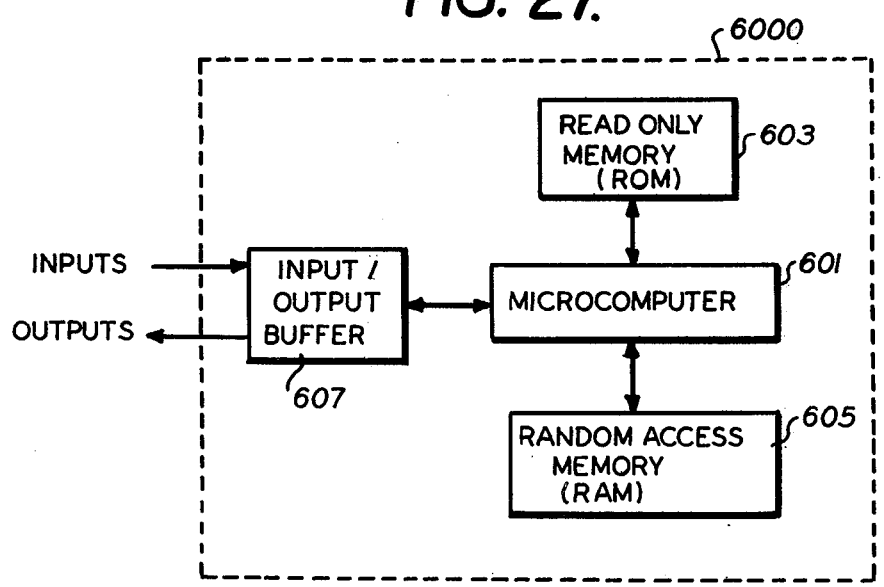
FIG. 27 is a block diagram of the microprocessor portion of the preferred improved receiver of the present invention illustrated in FIG. 26.
Figure 28:
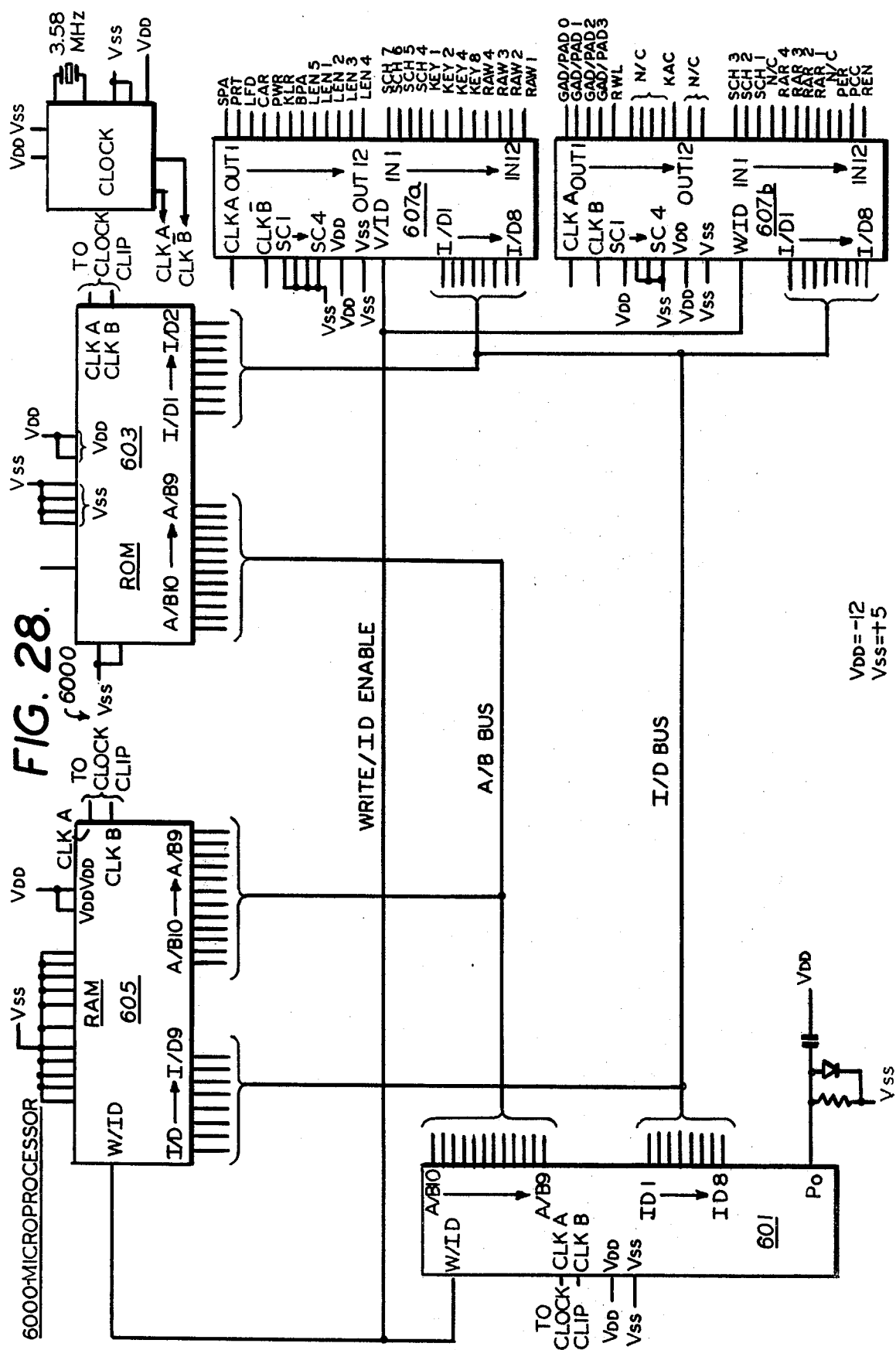
FIG. 28 is a functional block diagram similar to FIG. 27 for use in explaining an exemplary program for the microprocessor of the preferred improved receiver of the present invention.

The various inputs and outputs to the microcomputer or CPU 601 are all preferably conventionally routed through the input/output buffer 607 for interfacing the sytem with the microcomputer 601 and have been omitted from FIG. 27 for clarity; however, these signals as well as their function in the system for providing displayable rows of video information on video display terminal 2013 is illustrated in FIGS. 24, 26 and 28 and shall be described in greater detail hereinafter. During operation of the system, microcomputer 601 gets the instructions required from the stored program in read only memory 603 step-by-step, such as "take data from buffer 607 and put it in random access memory 605" or "take data out of random access memory 605 and provide it to buffer 607." Microcomputer 601 can also perform typical computer functional operations on the data. As shown and preferred in FIG. 26 which is a block diagram of the terminal key board and microprocessor input/output for video display row-by-row of pseudo video scan lines in the improved row grabbing terminal 28 of the present invention, the keyboard 5000 provides selection information to the microprocessor 6000, such as the group and page address, as described in our previous U.S. Pat. No. 3,889,054. The balance of the circuitry of the receiver 28 controlled by the microprocessor 6000 is generally represented by the block 8000 labeled "terminal" in FIG. 26. If desired, the input/output buffer 607 may also include a conventional special character decoder in addition to the balance of the interface functions performed thereby so as to detect the presence of a special character. The various latchings preferably occurring within the terminal 8000 shall be described in greater detail hereinafter with reference to FIG. 24. As shown and preferred in FIG. 10, the keyboard entry line for the microprocessor 6000 from keyboard 5000 preferably comprises four lines 6001, 6003, 6005 and 6006 which are set when a key is pressed and latched and are reset to the idle state only when a clear pulse is sent via line 6007 from the microprocessor 6000. The keys which can be set are numeric keys as well as special function keys such as group, page, up, back, and call. In addition, as decribed in the copending U.S. patent application of Robert H. Nagel, one of the joint inventors herein, and owned by the same assignee as the present application and entitled "Information Retrieval System Having Selectable Purpose Variable Function Terminal" filed Sept. 10, 1975, and bearing U.S. Ser. No. 611,927, additional keys such as program may be provided when the system is utilized to retrieve programs or sets of instructions as opposed to or in addition to data. As shown and preferred in FIG. 26, if a group key is depressed and preceded by a number, terminal 8000 will be informed of the new group via the group address and page address line GAD/PAD and LEN lines, with the page number preferably reset to zero. If the group is not preceded by a number, preferably the only action taken would be to release directed messages by setting and clearing the KAC line and to erase the screen via a pulse on the ERA line, all functions which change the group/page accomplishing this such as call, back, up and group. The inputs from the terminal 8000 to the microprocessor 6000 are preferably the row enable line REN, the row address read line RAR, the row address write line REW, the special character line SCH, and te permision line PER. The output to the keyboard is preferably the clear or keyboard latch reset line 6007 which is pulsed when a key has been completely processed so that the key will then be reset to the idle state. The outputs to the terminal 8000 from the microprocessor 6000 preferably comprise the erase line which erases the video display 2013, the keyboard active line KAC which is set while a group/page number is being sent to the terminal 8000 so that the terminal 8000 will take no action on it until the number is completely received, the group address/page address line GAD/PAD which informs the terminal 8000 of new page to grab, the latch enable line LEN and the row length line RWL. Suffice it to say that the microprocessor 6000 performs all data handling and execution of the permanently stored program in the read memory 603 with the random access memory 605 preferably functioning to store data in order to accomplish the row grabbing function, the data being taken out of the random access memory 605 and provided to the input/output buffer 607 for subsequent display on the video display 2013.

Referring now to FIG. 24, the output of microprocessor 6000 preferably includes four general purpose address bits or lines 715 and five lines of enable pulses 717. Lines 717 specify which one of the plurality of latches 701, 703, 705, 707 and 709, collectively referred to by reference numeral 699, with latches 701, 703, and 705 being the page address latches, and latches 707 and 709 being the group address latches, the address bits 715 are designated for. By utilizing the four data lines 715 and five enable lines 717, up to 20 different bits of address, which is equivalent to 1,048,576 addresses, can be established. The page address output bits collectively referred to by reference numeral 504 and the group address output bits collectively referred to by reference numeral 502 are employed in the memory input control portion of the receiver 28 illustrated in FIG. 11 preferably in the same manner as described in our previous U.S. Pat. No. 3,889,054 with respect to the outputs of the keyboard counter 500 of the system described in U.S. Pat. No. 3,889,054 and will not be described in greater detail hereinafter since such description is specifically incorporated by reference herein.

Referring to the aforementioned exemplary program written in PPS-4 Assembler language, as was previously mentioned, a typical microprocessor 6000 arrangement which is controlled by the aforementioned program is illustrated in FIG. 28 with the various pin number designations utilized by Rockwell International for the read only memory, random access memory, CPU or microcomputer, and input/buffer chips 605, 603, 601, and 607a and 607b, respectively being utilized in FIG. 28 for clarity. Furthermore, and as shown and preferred in FIG. 26, if desired, the receiver terminal 28 may additionally have a computer/printer or cathode ray tube display interface for use with a CRT character generator so as to provide a "hard copy" printout of the information being displayed on video display 2013 as well as the video display thereof. However, this is optional to the improved video display terminal of the present invention and need not be included unless such "hard copy" printout is desired. In such an instance, a printer interface 8004 and conventional printer 8006 would be required and would preferably be controlled by the microprocessor 6000 in a manner to be described in greater detail hereinafter. It should be noted that if such printing function is not desired then the functions of the terminal 28 and microprocessor 6000 relating thereto may be omitted; however, for purposes of completeness the programmed terminal will be described, as illustrated in the aforementioned program, assuming such printer and printing function is included.

Referring once again to FIGS. 26 and 28 and the aforementioned program, in order to facilitate the understanding of the functioning of the illustrative conventional program in the system of the present invention, the following detailed description of the inputs from the keyboard 5000, the inputs from the printer interface 8004, the inputs from the terminal 8000, the outputs to the keyboard 5000, the outputs to the printer interface 8004, the outputs to the terminal 8000, the input/output buffer assignments, the random access memory or RAM allocations, the register allocations, and the read only memory or ROM map is provided by way of example below.

Inputs (from keyboard 5000)

(a) — Keyboard entry KEY 4 lines
Set when a key is pressed and latched. Reset to the idle state only when a pulse sent on KLR. Settings are as follows:
- 0-9 — for numeral key. Consecutive numeral keys pressed will build a number (leading zeros automatically provided). Leading digits which cause the number to become too big for the function will be ignored — e.g., if 255 is the biggest number allowed for a group, and the number 256 is inserted, when the GROUP key is pressed, this will be truncated to 56.
- $A_{16}$ — for GROUP key. If this is preceded by a number, the terminal will be informed of the new group via GAD/PAD and LEN lines, with page number reset to zero. If not preceded by a number, the only action taken will be to release directed messages by setting and clearing KAC and to erase the screen via a pulse on the ERA line (all functions which change the group/page do this — i.e., CALL, BACK, UP and GROUP). Biggest numbers are 127 for 6-bit characters, 1023 for 7-bit characters.
- $B_{16}$ — for PRINT key. There are two print modes — mode A is initiated by pressing the PRINT key preceded by a number between 1 and 16 (when truncated to = 16), or by pressing the PRINT key with no preceding number when not already in mode A or B. The former will cause the specified row of the displayed page to be printed, preceded and terminated by a line feed, carriage return.
 The latter will cause the complete page to be printed, preceded by a line feed, carriage return, and each row terminated by a line feed, carriage return. Several rows can be marked for printing before the first has been fully printed by repeating the row print command.

Mode A is terminated by the printing initiated above being completed, or by pressing the PRINT key with no preceding number when already in Mode A or B (this also terminates Mode B), or by doing an operation which sends a new GAD/PAD identifier pulse (i.e., pressing valid GROUP, CALL, UP, BACK) or by starting Mode B.

Mode B is initiated by pressing the PRINT key preceded by the number 0 (when truncated). This prints certain information on receipt of certain SCH's (see below). It is terminated by pressing the PRINT key preceded by a non-zero number (which initiates Mode A), or by pressing the PRINT key with no preceding number when already in Mode A or B (this also terminates Mode A).

$C_{16}$ — for UP key. Any preceding number is ignored. The page number is incremented and the terminal informed via GAD/PAD and LEN lines with the group number unchanged. The screen is first cleared by an ERA pulse. If the page number is already at its highest limit (1023 for 6-bit characters, 4095 for 7-bit characters) the key pressing is ignored except for the screen being cleared, and KAC being set and cleared to release directed messages.

$D_{16}$ — for BACK key. As UP except the page number is decremented, and no action is taken if the page number is already zero.

$E_{16}$ — for CALL key. If this is not preceded by a number, zero is assumed. Else, the number is truncated to $\leq$ 1023 if the central computer is transmitting 6-bit characters (determined by SCH values - see below), or $\leq$ 4095 if 7-bit characters are transmitted. The page number is reset to this and the terminal informed in GAD/PAD and LEN lines, with the group number unchanged. The screen is first cleared by an ERA pulse.

$F_{16}$ — when in idle state. When any key is pressed, that key is not processed unless it is held constant for a minimum of 1 millisecond, to provide bounce protection.

As KEY is not reset to idle state unless the key has been released and KLR has been pulsed, KEY is not processed unless it is different from the last KEY processed, although KLR will be periodically pulsed.

Inputs (from printer interface 8004)

(b) — Printer character clock PCC 1 line

Runs at the printer rate (10 cps). High for 27 milliseconds (3-bit times) during which stop and idle bits are sent to printer and when interface can receive a pulse (SPA, LFD, CAR or PRT) from the PPS. Low for 73 milliseconds during which a character is sent to the printer. Used to determine when to send one of the above pulses to the interface, and also as a count after a PRT pulse is issued to determine when a row has been printed.

Inputs (from terminal 8000)

(c) — Row enable REN 1 line

Runs at the row rate of the terminal. 1 row = 13 scan lines = 13*63 microseconds (except during vertical retrace $\simeq$ 5 milliseconds). Low while RAR changing and therefore invalid (especially during vertical retrace). High when RAR valid.

(d) — Row address (read) RAR 4 lines

When REN is high, contains the address (0 → 15) of the row currently being read from memory and displayed on the screen, and available for transmission to the printer interface. The printer interface must be told to accept the row, if it is the correct one, within 3 scan lines (= 3*63 microseconds) of RAR changing, by a PWR pulse.

(e) — Row address (write) RAW 4 lines

Contains the address (0 → 15) of the last row written to memory after being grabbed from the cable. It is latched onto this and will not change until a new row is read. As rows can preferably only be written during the 3 blank scan lines at the end of a row, this will only change 2 scan lines (110$\mu$ sec = 22 cycles) before RAR changes. RAW will therefore be constant for a minimum of 10 scan lines after RAR changes.

(f) — Special character SCH 7 lines

Each row written (see RAW) has an SCH attached to it. This is changed at the same time as RAW and latched. Characters transmitted by the central computer are either 6 or 7 bits. To enable the PPS to know which, at least one row on Group 0, Page 0 will be transmitted with an SCH indicating which by its most significant bit (= 0 = < 6-bit chars, = 1 = < 7-bit). As group and page are automatically set to zero on power up, the PPS will know, from the very first page grabbed, what limits to set for page and group. Apart from this SCH, at the moment all other SCH's have individual meanings as follows:

0 Reset. Set to 0 by the terminal on power up. Real SCH's are zero when no action is to be taken, or when action started by an SCH is to be repeated. To ensure that action on any SCH is taken, the central computer will repeat it on the particular row several times. So to ensure a desired single operation is not repeated, the PPS will only act on an SCH which has changed on that row. Therefore, to repeat a similar operation, the central computer must send a zero SCH on the row before repeating the non-zero SCH. When a new page is selected, the PPS will act on the first SCH on each row, and then only when an SCH for a row changes.

1 Row print (select). The row specified by RAW is printed only if in print mode B.

2 Page print (select). The page displayed is printed only if in print mode B.

3 Row print override. The row specified by RAW is printed regardless of print mode.

4 Page start. Not used for any specific PPS function.

8 64 character row. The row specified by RAW is a 64 character row. If this row is printed later on, the PPS will wait for 64 clock pulses after issuing a PRT pulse before it sends the terminating LFD, CAR pulses. Receipt of this SCH sets RWL to 1.

$10_{16}$ — 32 character row. The row specified by RAW is a 32 character row. If this row is printed later on, the PPS will send 16 SPA pulses (to space the row in the middle of the page), then a PRT pulse. After 32 clock pulses, it sends the terminating LFD, CAR pulses. Receipt of this SCH sets RWL to 0.

$18_{16}$ — Erase. The PPS sends an ERA pulse to the terminal.

(g) — Permission PER 1 line

After a new group number is sent to the terminal, this line is tested. If low, the terminal is not allowed to receive that group, so the group number is reset to zero (the page number will already be zero), and resent to the terminal. The line is valid at any time, even when KAC is still set.

Outputs (to keyboard 5000)

(a) — Keyboard latch reset KLR 1 line
Pulsed when a key has been completely processed. KEY will then be reset to the idle state.

Erases screen. Pulse when SCH $18_8$ received, or when a group/page number is sent to the terminal, or when GROUP key is pressed with no preceding number.

(h) — Keyboard Active KAC 1 line
Set while a group/page number is being sent to the terminal, so the terminal takes no action on it until the number is completely received. Will always be preceded by an ERA pulse. Also ensures directed messages are released, so set and cleared for any pressing of GROUP, CALL, BACK or UP, even if no new group/page number is sent.

| I/O Assignments (bit 0 = LSB, bit 3 = MSB) | | | | |
|---|---|---|---|---|
| I/O 0 (607a) | GRP A | (A) | READ | SCH bits 0–3 |
| | | (E) | SET | SPA (bit 0), PRT (bit 1), LFD (bit 2), CAR (bit 3) |
| | GRP B | (9) | READ | KBD |
| | | (D) | SET | PWR (bit 0), KLR (bit 1), ERA (bit 2), LEN bit 4 (bit 3) (Only used for pulses via TM PLSB.) |
| | GRP C | (3) | READ | RAW |
| | | (7) | SET | LEN bits 0–3 |
| I/O 1 (607b) | GRP A | (1A) | READ | SCH bits 4–6 (bits 0–2). Bit 3 always /. 0. |
| | | (1E) | SET | GAD/PAD |
| | GRP B | (19) | READ | RAR |
| | | (10) | SET | RWL (bit 0) (Any change of bits 1–3 must leave RWL unaltered). |
| | GRP C | (13) | READ | PER (bit 1), PCC (bit 2), REN (bit 3) |
| | | (17) | SET | KAC (bit 1) (any bit set excludes others from being set.) |

Outputs (to printer interface 8004)

(b) — Printer write PWR 1 line
When a print is initiated, RAR is sampled until it equals the next row to be printed. PWR is pulsed within 189 microseconds of it changing, so the interface can write the row into its memory for printing on the PRT pulse.

(c) — Space SPA 1 line
On a 32 character row print, 16 leading spaces are printed, by sending this pulse once during each clock cycle when PCC is high for 16 times.

(d) — Line feed LFD 1 line
To print line feed, send LFD pulse while PCC high.

(e) — Carriage return CAR 1 line
To print carriage return, send CAR pulse while PCC high.

(f) — Print PRT 1 line
To print the row currently held in the printer interface buffer, send PRT pulse while PCC high and wait 32 or 64 clock times before issuing any other pulse to the interface.

Outputs (to terminal 8000)

(g) — Erase ERA 1 line (i) — Group address/Page address GAD/PAD 4 lines
To inform the terminal of a new page to grab, the page's identifier is sent in 5 pulses of 4 lines each. After the identifier is assembled in the PPS, the first 4 bits will be set on these lines, and LEN line 1 is pulsed. Then the second 4 bits are set, and LEN line 2 is pulsed, and so on until all 20 bits are sent. The identifier is constructed from the group/page number as follows:

| | | |
|---|---|---|
| (i) | using 6-bit characters | |
| | bits 0 → 9 | = page number |
| | bits 10/11 | = 0 |
| | bits 12 → 18 | = group number |
| | bit 19 | = 0 |
| (ii) | using 7-bit characters | |
| | bits 0 → 9 | = page number |
| | bits 12 → 19 | = group number bits 0 → 7 |
| | bits 10/11 | = group number bits 8/9 |

(j) — Latch enable LEN 5 lines
Only 1 line pulsed at any one time. If line n is pulsed, the terminal will take the 4 GAD/PAD lines as the nth 4 bits of the new group/page identifier (20 bits).

(k) — Row length RWL 1 line
Latched on 1 for 64 character rows, 0 for 32 character rows. Set according to the last SCH of 8 or $10_{16}$.

| RAM (605) allocation (RX DY = RAM address xy) | | |
|---|---|---|
| (all initially zero unless otherwise stated) | | |
| R0 | D0/1/2 | Group # [3rd digit - bits 8/9 - only used as temporary storage, as bits 8/9 group # normally held in page #] |
| R7 | D0/1/2 | Page # [bits 10/11 = bits 8/9 group #]- Also used for binary # during decimal to binary conversion. |
| R3 | D0/1/2/3 | Keyboard # (decimal) R3D0 = $F_{16}$ => no number yet. R3D0 = most significant digit. |
| R4 | D0/1/2/3 | Workspace. Used for current high limit and during decimal to binary conversion. |
| R8 | D0/1/2/3 | Group # high limit (decimal). Initially 0, 1, 2, 7. |

-continued

| | | |
|---|---|---|
| R9 | D0/1/2/3 | Page # high limit (decimal). Initially 1, 0, 2, 3. |
| R6 | D0/1/2 | KBD routine suspend address - used by STORE S/R. Initially complement of address of KBYX (C, F, F). |
| R1/R2 | | Complement of last SCH on each row. (R1 = bits 0-3, R2 = bits 4-7) |
| R5 | | Row status for each row:<br>    Bit 3 set => print this row<br>    Bit 2 set => print leading CRLF |
| R3 | D5 | Current row - set to row being searched for, or row being printed. |
| R6 | D5 | Row count. # of rows searched for without being printed. |
| R4 | D5 | Searching for row<br>  = 0 => yes<br>  = 1 => no    Initially 1 |
| R3/R4 | D6 | 6-bit count for printing. Used when printer pulse occurs and printing in progress.<br>If = 0, next o/p is shifted left and if ≠ 0, that pulse is sent (if = 2 when shifted, new count is set also).<br>If when shifted, next o/p = 0, then next row to print is searched for.<br>If ≠ 0, next o/p is masked with mask and that pulse sent after the count is decremented. |
| R0 | D7 | Row length. = Last F => 64 char rows. = E => 32 char rows. Set by last SCH of 8 or $10_{16}$. |
| R3 | D7 | Next o/p<br>  = 1 => SPA ]  ≠ 0 => printing in progress<br>  = 2 => PRT ]  = 0 => no printing<br>  = 4 => LFD ]<br>  = 8 => CAR ]<br>This digit is sent on I/O 0 group A as a pulse after being masked or shifted as above. |
| R4 | D7 | Mask<br>  = 0 => Do not send SPA or PRT pulse unless clount = 0 (then no mask takes place). 64 character rows (set when row to be printed)<br>  = 1 => Do not send PRT pulse unless count = 0. 32 character rows<br>[Remember when count = 0, shift left of next o/p occurs before pulse.] |
| R3 | D8 | Last PCC value (in bit 2). |
| R4 | D8 | 4 (constant mask for above). Initially 4 |
| R0 | D9 | Current KBD character. |
| Register Allocation | | |
| FF1 | | = 1 => Print mode A (KBD printing) |
| FF2 | | = 1 => Print mode B (SCH printing) |
| X | | Temporary working space |
| R3 | D9 | KBD count<br>  = 0 => KBD character can be processed<br>  ≠ 0 => No. of program loops to go before KBD character is accepted (bounce protection) |
| R4 | D9 | Complement of last KBD character |
| R3 | D10 | Complement of last RAR |
| R4 | D15 | Workspace used to access each digit in binary to decimal conversion |

ROM (608) Map

| Page | | | Description | | Spare Words |
|---|---|---|---|---|---|
| 0 | (00) | | Initialization | (63) | 1 |
| 1 | (40) | | Check RAR/SCH/RAW | (43) | |
| | | Sch-<br>edu-<br>ler | Check RAR | (17) | 5 |
| 2 | (80) | | Check PCC | (61) | |
| | | | Go to KBD check | ( 1) | |
| | | | Return to start of scheduler | ( 2) | 0 |
| 3 | (C0) | | RAM addresses (1st 16 words) | (16) | 0 |
| | | | S/R addresses (last 48 words) | (26) | 22 |
| 4 | (100) | | Go to SCH decoder | ( 2) | |
| | | | Switch S/R | ( 7) | |
| | | | Binary shift left S/R | ( 7) | |
| | | | Stop printing S/R | ( 7) | |
| | | | Pulse I/O 0 group B S/R | ( 6) | |
| | | | Suspend S/R | ( 6) | |
| | | | KBD decoder S/R | (23) | 6 |
| 5 | (140) | | Get row S/R | (35) | |
| | | | SCH row print [3 S/R's] | (27) | 2 |
| 6 | (180) | | SCH page print [2 S/R's] | (19) | |
| | | | SCH erase [2 S/R's] | ( 8) | |
| | | | SCH row length [2 S/R's] | (10) | |
| | | | SCH character length S/R | (10) | |
| | | | Clear 3 digits S/R | ( 7) | 2 |
| | | | Reset special characters | ( 8) | |
| 7 | (1C0) | | KBD numeral S/R | ( 7) | |
| | | | KBD up S/R | (28) | |
| | | | KBD back S/R | (21) | |
| | | | Go to KBD call | ( 2) | |
| | | | Go to KBD group | ( 2) | |
| | | | Go to KBD print | ( 2) | 2 |

-continued

| | | | | |
|---|---|---|---|---|
| 8 | (200) | SCH decoder switch jump | (1) | 63 |
| 9] | (240) | SCH decoder table | (128) | 0 |
| 10] | | | | |
| 11 | (2C0) | KBD print S/R | (56) | 8 |
| 12 | (300) | Check KBD | (23) | |
| | | RAR check - print row | (36) | |
| | | RAR check - get row | (2) | 3 |
| 13 | (340) | KBD group S/R | (11) | |
| | | KBD cal S/R (Pt 1) | (50) | 3 |
| 14 | (380) | KBD cal S/R (Pt 2) | (57) | 7 |
| 15 | (3C0) | KBD call S/R (Pt 3) | (60) | 4 |

It is of course understood that the above program and program description is merely provided by way of example and other programs and program arrangements could be utilized to accomplish the row grabbing video display function of the present invention without departing from the spirit and scope thereof. In addition, as previously mentioned, if desired a conventional keyboard control system such as described in our previous U.S. Pat. No. 3,889,054 could be utilized in the improved row grabbing system of the present invention in which instance the microprocessor 6000 and the associated programming required therefore would be omitted. It should be noted that with respect to FIG. 10 which illustrates the keyboard 5000, the keyboard key switches 823 and associated lines 823a through 823d with their respective associated flip-flop latches 824, 825, 826 and 827, respectively, which are cleared by the signal present on path 6007, are preferably identical in operation with that previously described in our previous U.S. Pat. No. 3,889,054 which description is specifically incorporated by reference herein.

Figure 12:
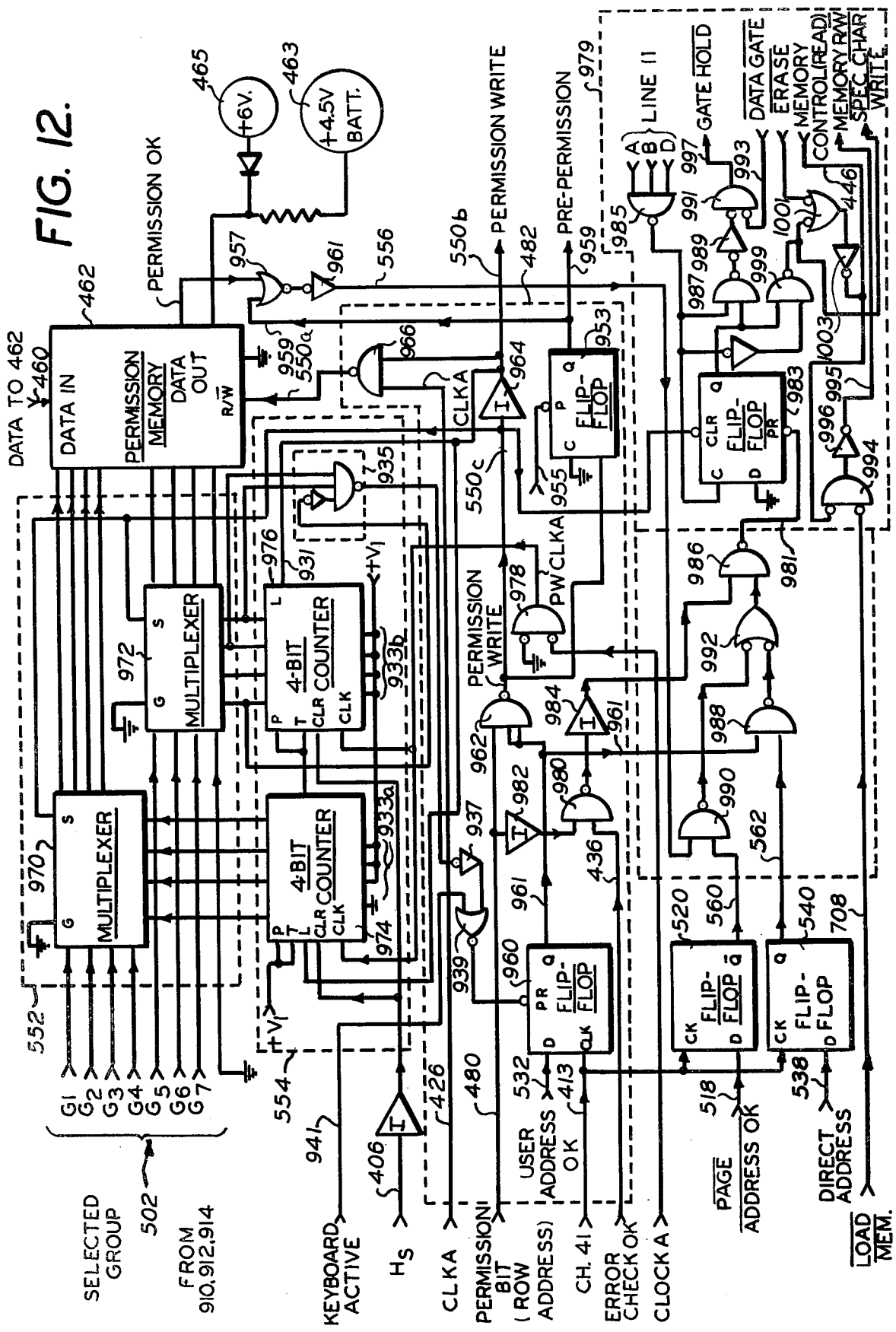
FIG. 12 is a logic diagram, partially in schematic, of the portion of the memory input control portion of the improved receiver illustrated in FIG. 7.
Figure 13:
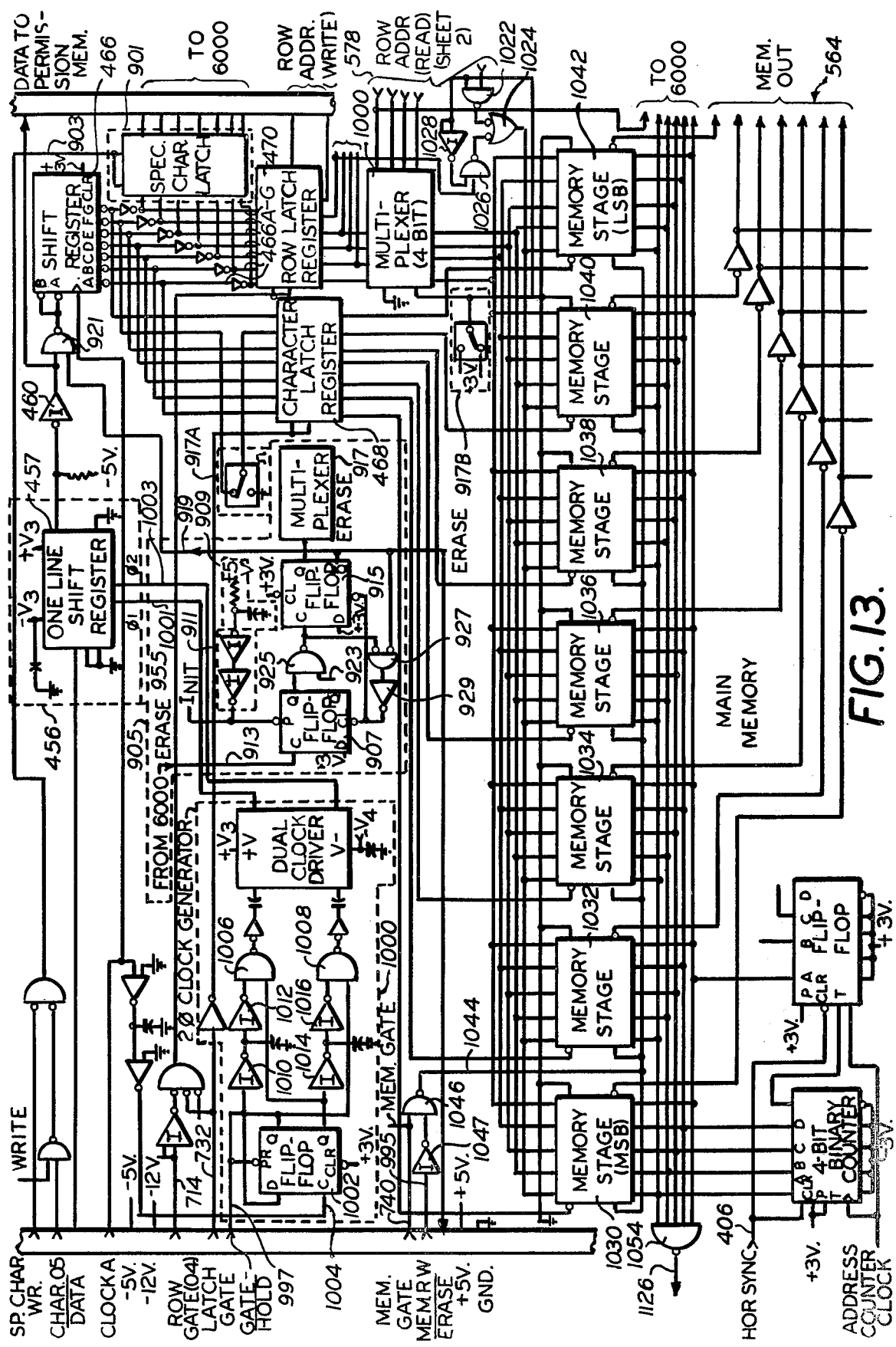
FIG. 13 is a logic diagram, partially in schematic, of the memory and output processing portion of the improved receiver illustrated in FIG. 5.

Similarly, referring to FIG. 13 which illustrates a portion of the improved memory output processor portion of the receiver 28 of the present invention, this portion is preferably identical with that described in our previous U.S. Pat. No. 3,889,054 with the exception of the erase circuit and the special character latching functions utilized with 32-or-64 character selection, to be described in greater detail hereinafter with reference to FIG. 13. Identical reference numerals are utilized for identical functioning components in FIG. 13 with those previously described in our previous U.S. Pat. No. 3,889,054 with reference to FIG. 12 of that patent which description was specifically incorporated by reference herein and will not be repeated. It should be noted that reference number 901 represents a special character latch, with the fifth character preferably being the special character, and, accordingly, latch 901 is strobed via path 903 during the fifth character. Any time a new valid pseudo video scan line is received, the special character, which is as previously mentioned preferably the fifth character, of that pseudo video scan line is entered into latch 901. The output of latch 901 is preferably provided to microprocessor 6000, as represented by the symbol "SCH" to provide an input thereto. Preferably, microprocessor 6000 does not act on all special characters such as for example not acting with respect to 32-or-64 character selection, although, if desired, the microprocessor could also be programmed to accomplish this.

Erase Circuit

Now considering the improved erase circuit portion 905 of the memory and output processor portion illustrated in FIG. 13, the erase circuit 905 provides a means for making the screen of the video display device 2013 go blank. This is desirable at initial turn on at which time the main memory would come on with a random bit pattern which in turn would display a random assortment of characters which would be meaningless and, perhaps, confusing to the viewer. Erase is accomplished by loading all character locations in memory which comprises stages 1030 through 1042 preferably with an octal 40 value which is the value which corresponds to a "space" in ASCII code. The erase cycle can be initiated also by the microprocessor 6000 in response to the appropriate special character assigned for the erase function or whenever a keyboard cycle takes place, if desired. The erase cycle is preferably initiated by a conventional flip-flop 907 which gets set initially when power is on as a result of an RC charging network 909 through inverters 911 connected to the preset input of flip-flop 907. Flip-flop 907 can also preferably get set by microprocessor 6000 via the clock input provided via path 913 from microprocessor 6000. Once set, flip-flop 907 preferably enables a conventional two input NAND gate 925 which also receives the vertical sync pulse via path 923. Therefore, the first vertical sync pulse that occurs after flip-flop 907 is set appears as a negative pulse at the clock input of a second flip-flop 915 to which the output of gate 925 is connected. Flip-flop 915 is clocked to its set state preferably at the trailing edge of the vertical sync pulse. When set, the output of flip-flop 915 preferably switches a conventional multiplexer 917 such as a Texas Instruments SN 74157N, which accomplishes the switching necessary to load the memory octal 40 values; specifically, switch 917a and 917b illustratively shown separate in FIG. 13 actually comprise the multiplexer 917 with switch 917a of multiplexer 917 loading a logic one into the correct bit position of character latch register 468 whose operation is described in detail in our previous U.S. Pat. No. 3,889,054, to obtain octal 40 therefrom. All of the other bits are preferably set to 0 via path 919 which is connected to the inverted output of flip-flop 915 with the signal present thereon turning off the input to shift register 466 previously described in detail in our previous U.S. Pat. No. 3,889,054, via a conventional two input NAND gate 921 whose inputs are the output of shift register 457, which is also previously described in our U.S. Pat. No. 3,889,054, and the inverted output of flip-flop 915. As a result, all logic zeros are present at the outputs of shift register 466 which logic zeros are provided to the inputs of character latch register 468 except for the previously mentioned single bit. Switch 917b of multiplexer 917 switches multiplexer 1020, which is described in detail in U.S. Pat. No. 3,889,054, so that the read row addresses are applied to the memory stages 1030 through 1042 even though the memory stages 1030 through 1042 are in the write mode during the erase cycle. This insures that all memory locations are addressed during erase. Termination of the erase cycle is preferably accomplished by the second vertical sync pulse that occurs after flip-flop 907 has been set.

The second vertical sync pulse clocks flip-flop 915 back to its original state and also clears flip-flop 907 via another conventional two input NAND gate 927 whose output is provided to the clear input of flip-flop 907 through an inverter 929. Thus, both flip-flops 907 and 915 are returned to their original state. The period of the erase cycle is thus preferably one vertical field period, this time being adequate to insure that all memory stage locations 1030 through 1042 have been addressed. As was previously mentioned the balance of the circuitry illustrated in FIG. 13 is adequately described in detail in our previous U.S. Pat. No. 3,889,054 which was specifically incorporated by reference herein.

Permission Memory Circuitry

Referring now to FIG. 12, the improved permission memory circuitry utilized in the preferred improved row grabbing terminal 28 of the present invention shall be described in greater detail. Except where otherwise specifically noted, the portions of the circuit in FIG. 12 are preferably identical with the permission memory circuitry described in our previous U.S. Pat. No. 3,889,054 with reference to FIG. 11 of that patent and identical reference numerals are utilized therefore. Thus, this description which is incorporated by reference herein will not be repeated and the following discussion of the improved permission memory circuitry will primarily be directed to the differences over the permission memory circuitry described in U.S. Pat. No. 3,889,054. In the previous permission memory circuit of U.S. Pat. No. 3,889,054, counters 974 and 976 were initially cleared to zero rather than being preloaded to a predetermined number such as 254. Thus, this previous system could possibly provide a couple of extraneous clock pulses before the first permission bit was received so that the counter was at a value of one when the first permission arrived and, accordingly, group 0 would not be available. In the improved permission memory circuit shown in FIG. 12, counters 974 and 976, which are four bit counters, constitute a 256 bit counter, although if desired a 128 bit counter could be utilzed instead. This counter, which is comprised of counters 974 and 976, is preferably utilized for addressing the permission memory 462 during the permission write cycle. Counters 974 and 976 are preferably initially loaded to a predetermined value, such as preferably 254, which is accomplished by utilizing the load input 931 of counter 976 in conjunction with the preset inputs 933a and 933b of counters 974 and 976, respectively. As a result of the preload via path 931, at the beginning of a permission write cycle, the first two clock pulses advance the counter 974–976 to 0. The second clock pulse occurs just prior to the availability of the first permission bit. This timing sequence makes it possible for the first permission bit to represent group 0. Thus it is possible to insure permissions for groups 0 through 127 on one pseudo video scan line. As shown and preferred in FIG. 12, 128 groups are provided via the connection of permission memory 462; however, as will be described in greater detail hereinafter, if desired, additional counters may be provided in conjunction with permission memory 462 so as to provide up to 1000 groups.

The improved permission memory circuit illustrated in FIG. 12 also enables self-termination of permission write to return the system to the normal mode if a permission line occurs at the end of a field. This is accomplished in the following manner. An inverter and NAND gate constitute a decoder 935 that generates a pulse preferably at a count, such as 192, which is greater than the number of groups, which were previously mentioned as being 128 by way of example in the arrangement illustrated in FIG. 12, and less than the number of bits in a data line to permission memory, which number of bits preferably constitutes 238 by way of example. The number 192 is preferably chosen for ease of decoding although it could be any number between 128 and 238, the criteria for these limits being defined as being greater than the number of groups and less than the number of bits in a data line to permission memory. This pulse is provided through an inverter 937 to one input of a conventional two input NOR gate 939 whose other input is the keyboard active line 941 and whose output is utilized to reset the permission flip-flop 960. Thus flip-flop 960 is guaranteed to get reset even if the completion of permission write occurs during vertical blanking. In such a case, flip-flop 960 would not otherwise get reset because the decoded character 41 pulse present on path 413 is not normally generated during vertical blanking. During a keyboard cycle, the group address is preferably not a valid signal. Therefore, the output of the permission memory 462 would not be valid. Accordingly, in order to prevent an erroneous authorization, flip-flop 960 is held in a reset state during the keyboard cycle. This is accomplished by the keyboard active line or KAC 941 which is generated by microprocessor 6000 which, as was previously described, is applied to the other input to NOR gate 939. Preferably, the improved permission memory of FIG. 12 provides permission initialization when the power is turned on, the permission memory circuit automatically selecting group 0, page 0 at such time. When the first permission line is received by receiver 28, the permission memory circuit of FIG. 12 will then preferably revert to normal operation. This initial mode, group 0, page 0 on turn on, is preferably established by flip-flop 953 which is initially preset by line 955 (FIG. 13) when power is turned on. The output of flip-flop 953 is preferably applied to a conventional NOR gate 957 via line 959 and sets the permission O.K. line 556 through an inverter 961. This asserts permission. Line or path 959, which is also preferably connected to gate 963 of the page address circuit (FIG. 11), and is termed pre-permission, also sets line 508 low. This simulates an address of page zero, group zero.

Figure 14:
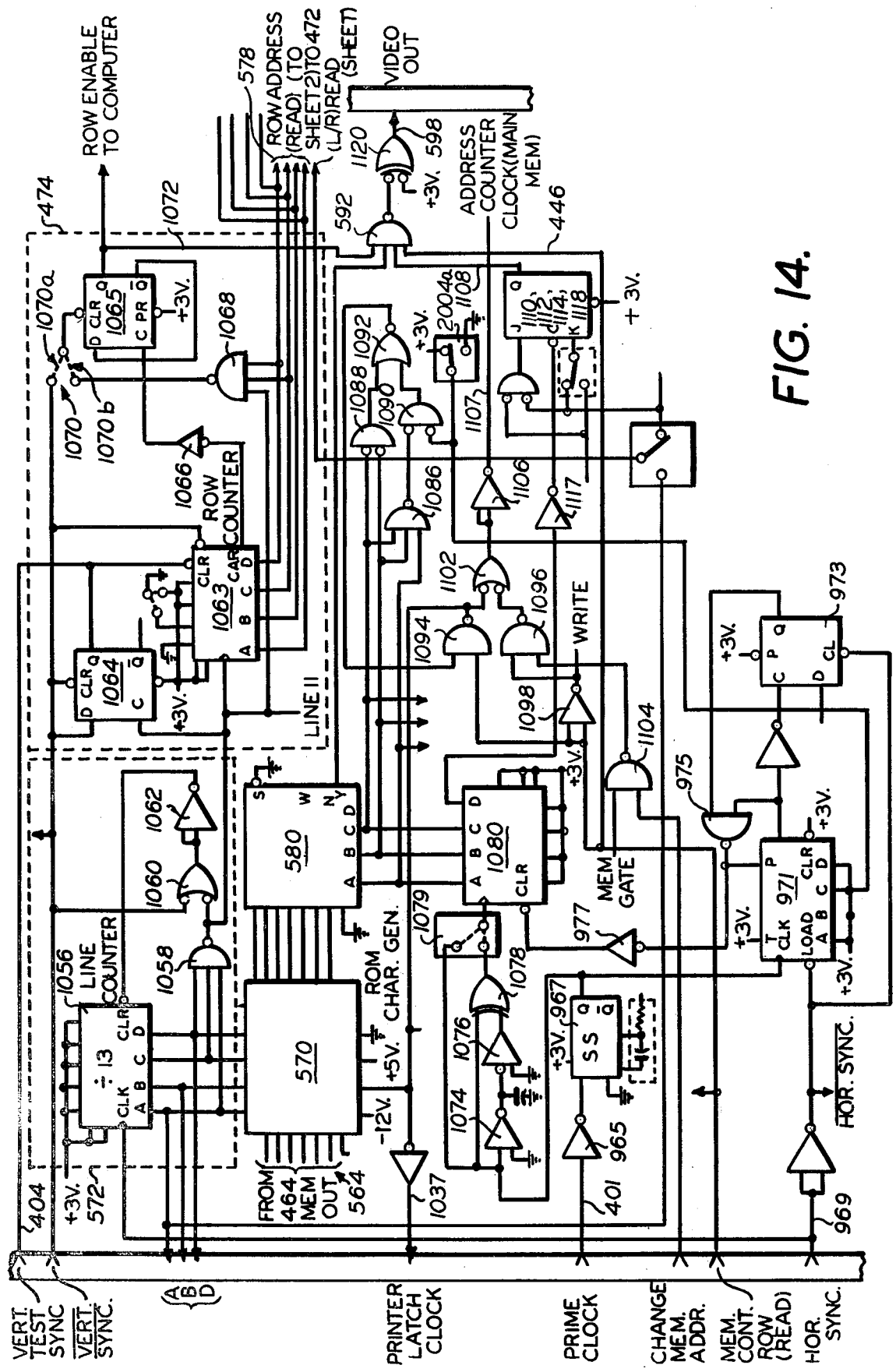
FIG. 14 is a logic diagram, partially in schematic, of another portion of the memory and output processing portion of the improved receiver illustrated in FIG. 5.

Referring now to FIG. 14, the improved permission memory update circuitry for updating the permission memory 462 (FIG. 12) is shown and will be described. As will be described in greater detail hereinafter, the purpose of the improved permission memory update circuitry is to avoid any flicker which might otherwise occur in the video display on display device 2013 during update of the permission memory as a result of such update. In the improved circuitry of FIG. 14, the previously considered clock B signal is replaced by the prime clock provided via path 401 from the voltage controlled oscillator 130 (FIG. 3). This prime clock input provided via path 401 to the permission memory update circuitry is inverted by an inverter 965 and applied to a conventional single-shot 967. Preferably, the purpose of single-shot or one-shot 967 is to generate a symmetrical square wave which is required by the conventional frequency doubler circuitry comprising inverters 1074 and 1076 and exclusive OR gate 1078. As described in our previous U.S. Pat. No. 3,889,054, inverters 1074 and 1076 provide a predetermined delay, such as 100 nanoseconds in the prime clock signal provided via path 401, this delay time preferably representing a fraction of the clock period. It is this delayed prime clock signal which is preferably supplied to one input of the two input exclusive OR gate 1078 whose other input is directly connected to the prime clock input provided at the output of single-shot 967. Exclusive OR gate 1078 preferably provides an output only during the period of time that the delayed prime clock signal overlaps the undelayed prime clock signal, which occurs twice per clock period and, as a result, two output pulses are available from gate 1078 for each input pulse. A shown and preferred in FIG. 14, the output of exclusive OR gate 1078 is fed to a conventional switch 1079 which selects between the 32 character position and the 64 character position depending on the desired character display, with the exclusive OR gate 1078 output being connected to the 64 character position and the non-doubled or direct prime clock signal being connected directly to the 32 character position of switch 1079. The output of switch 1079 is provided to the clock input of a conventional divide-by-eight counter 1080 previously described in our U.S. Pat. No. 3,889,054, such as the type manufacturd by Texas Instruments under the designation SN74161N, which is a four bit binary counter connected as a divide-by-eight counter, although, if desired, a conventional divide-by-eight counter could be utilized. Thus, the frequency doubled clock signal is preferably utilized as the clock for counter 1080 only during 64 character operation while, during 32 character operation, that is 32 characters per video row versus 64 characters per video row, counter 1080 is clocked directly by the prime clock signal. The prime clock signal provided via path 401 is preferably unaffected by the permission write mode (FIG. 8). The normal horizontal sync signal provided via path 969 is preferably utilized for the horizontal timing of all of the display circuits including the memory read circuit. The horizontal sync on path 969 is also unaffected by the permission write mode as it is the normal sync during the permission write mode.

The clear signal for counter 1080 is preferably developed as follows. Counter 971 in conjunction with flip-flop 973 establishes the start of a display video row. During horizontal sync, counter 971 is preloaded to a count which depends on whether the terminal 28 is operating as a 32 or 64 characters per row terminal. When the terminal 28 is operating as a 32 character per row terminal, the preload condition for counter 971 is preferably selected as one value, such as preferably 15, and when the terminal 28 is operating in the 64 characters per row mode the preload for counter 971 is preferably selected as another value, such as preferably 11. Whichever value is selected, that value is selected so as to obtain the correct starting position on the display screen. A different preload condition is preferably required for the 32 and 64 characters per row modes because preferably a different clock frequency is required for these two modes.

At the conclusion of the horizontal sync pulse, counter 971 preferably starts counting at the prime clock rate which prime clock is provided to the clock input of counter 971 from single-shot 967. At the completion of the count, the output of the two input NAND gate 975, which has one input connected to the non-inverted output of flip-flop 973 and the other input connected in parallel to the clock input to flip-flop 973 prior to inversion thereof, goes low and stops the counting using the P inhibit input of counter 971. Preferably a predetermined count value, such as preferably a value of 31, terminates the count cycle. The negative level present at the output of gate 975 is also provided in parallel through an inverter 977 and applied to the clear input of counter 1080 which enables counter 1080 by removing the clear state and counter 1080 starts its count sequence. Thus, by utilizing the prime clock for row one and the normal horizontal synch 969 together with the improved circuitry for enabling counter 1080, the display circuits are preferably independent of the permission memory update and, thus, any flicker which might otherwise occur in the display during such update as a result thereof is minimized and preferably avoided. The balance of the circuitry associated with FIG. 14 is preferably identical with that described in our previous U.S. Pat. No. 3,889,054 with reference to FIG. 13 thereof.

Main Memory Update

Referring again now to FIG. 12, the improved main memory update circuitry shall be described in detail hereinafter. Preferably, under normal conditions when the main memory which comprises stages 1030 through 1042 (FIG. 13), is in the write mode, the outputs of these stages 1030 through 1042 are not valid. Thus, as shown and preferred in FIG. 12, update control circuitry 979 is provided to prevent the main memory updating or writing if a valid pseudo video scan line is received while a row is being displayed. If a valid pseudo video scan line is receeived while a row is being displayed, other than during the occurrence of dead space on the screen, this line will preferably be stored in shift register 457 (FIG. 13) until completion of that displayed row and the line then would be written into memory 1030 through 1042 during the dead space following the row. When a valid pseudo video scan line is received, path 981, which is connected to the output of NAND gate 986, goes low and sets a flip-flop 983 which remains set preferably until the display sweep completes the 12th line counted of a row which is equivalent to line 11 which is a preferably dead line of a row with lines 1 through 9 of the row preferably being considered active lines for a row. The information corresponding to line 11 is provided to a three input NAND gate 985 which decodes the count of 11 provided from the output of line counter 1056 (FIG. 14) and provides a negative pulse to the clock input of flip-flop 983. Flip-flop 983 is then preferably reset at the end of that pulse; that is, at the completion of the 12th line counted which is equivalent to line 11. In this regard, it should be noted that the zero line is the first line counted and, therefore, the 11th line or a count of 11 is the 12th line counted. The time during which flip-flop 983 is set preferably establishes the time during which the input data must be stored in the one line shift register 457 (FIG. 13) which preferably stores this information as long as flip-flop 983 is set plus one more line to enable for shifting out and writing into memory 1030 though 1042. Update control circuit 979 also preferably includes a two input NAND gate 987 which has one input connected in parallel to the Q or non-inverted output of flip-flop 983 and the other input connected to the output of NAND gate 985. The output of gate 987 is preferably provided through an inverter 989 to one input of another gate 991 whose other input is the data gate signal provided via path 993 from flip-flop 696 (FIG 8). The output of gate 991 is the gate hold signal which is provided via path 997 to flip-flop 1002 (FIG. 13) and is the control line which stops the clocking of shift register 457 (FIG. 13) during the period that flip-flop 983 is set excluding the 12th line counted; in other words, the output of gate 991 via path 997 goes low when a valid pseudo video scan line is received and goes high at the beginning of the 12th line counted, which is equivalent to line 11. The output of gate 991 preferably cannot go high until the inverted data gate line 993 goes low. This continues to hold data in the serial shift register 457 (FIG. 13) preferably until the fourth character. Thus, the clocking of shift register 457 is preferably enabled at the beginning of the fourth character of the transmitted pseudo video scan line after the 12th line counted (line 11) of the displayed row is started. As was previously mentioned, the output of gate 991 is preferably applied to the preset input of flip-flop 1002 via path 997 (FIG. 13). The Q output of flip-flop 983 is also preferably connected in parallel to one input of another two input NAND gate 999 whose other input is connected through an inverter to the output of gate 985. Gate 999 preferably produces a negative level during the 12th line counted (line 11) which terminates a hold period. This 12th line counted is the time during which data is preferably written into the main memory 1030 through 1042 (FIG. 13). The low level at the output of gate 999 is preferably applied to the main memory circuit control (read) line 446 via a two input NOR gate 1001, whose other input is the inverted erase signal, through an inverter 1003. Gate 1001 preferably causes the memory control read line 446 to also go low during an erase cycle as a result of the inverted erase input applied thereto. As was described in our previous U.S. Pat. No. 3,889,054, the output of gate 994 which is provided through an inverter 996 preferably generates the memory pulse R/W via path 995 which is provided to the memory 1030 through 1042 through inverter 1047 and gate 1046 via path 1044 (FIG. 13). Thus, the operation of the update control circuit 979 preferably prevents any possible flicker in the display during the main memory write mode. The balance of the circuit of FIG. 12 is preferably identical with that described with reference to FIG. 11 of our previous U.S. Pat. No. 3,899,054 with the exception of the differences previously noted.

Computer/Printer CRT Display Interface

Figure 25:
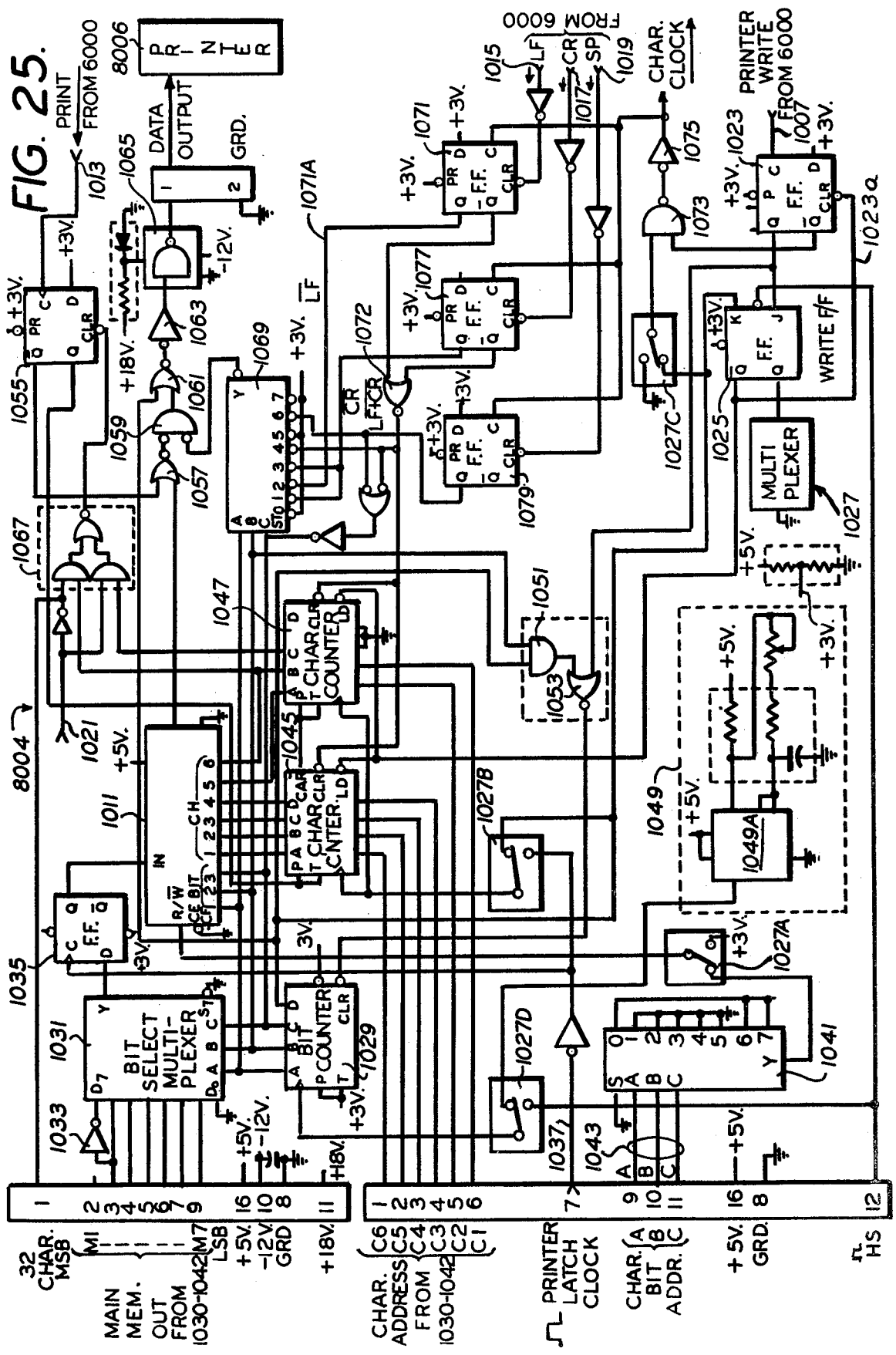
FIG. 25 is a block diagram, partially in schematic, of the computer/printer interface portion of the preferred improved receiver of the present invention illustrated in FIG. 26.

Referring now to FIGS. 24 and 25, the computer/printer CRT display interface 8004 which was generally referred to with reference to FIG. 26 with respect to the option of utilizing a printer to provide hard copy text in addition to the video display of information, and which is the subject of my copending U.S. patent application entitled "Interface For Enabling Continuous High Speed Row Grabbing Video Display With Real Time Hard Copy Print Out Thereof," filed Apr. 23, 1976, bearing U.S. Ser. No. 679,907, shall now be described in greater detail herein. As was previously mentioned, the above described system will function as an improved row grabbing terminal 28 without the additional computer/printer CRT display interface 8004 and printer 8006, if such hard copy text material is not desired, without departing from the spirit and scope of the present invention. However, assuming such hard copy text is desired, the computer/printer interface 8004 shall now be described with reference to FIGS. 24 and 25. As will be described in greater detail hereinafter, the interface 8004 preferably utilizes character information when available at a high speed rate so as to enable continuous high speed video display of the information which is normally preferably provided with the improved row grabbing terminal 28 of the present invention, as well as with our previously described row grabbing terminal described in U.S. Pat. No. 3,889,054, while also enabling real time pick off of this information for printing. The printer 8006 is preferably a conventional matrix printer, such as an Extel Model No. AF-11, whose operations are preferably controlled by the microprocessor 6000. The following functions are preferably commanded by the microprocessor 6000: PRINTER WRITE, PRINT, LINE FEED, CARRIAGE RETURN, SPACE COMMAND, and the 32/64 CHARACTER COMMAND, as indicated by the control lines illustrated in FIGS. 24 and 26. The PRINTER WRITE COMMAND from the microprocessor, provided via path 1007 from microprocessor 6000, preferably causes the printer interface 8004 to write a row of characters into a buffer memory 1011 from the terminal main memory 1030 through 1042 as will be described in greater detail hereinafter. The PRINT COMMAND, provided via path 1013 from microprocessor 6000, causes the interface 8004 to output the row of characters to the printer 8006 at the proper baud rate for the printer 8006, such as at 110 baud, in serial EIA standard format including start and stop bits for the printer 8006. The LINE FEED COMMAND, provided via path 1015 from microprocessor 6000, preferably causes the interface 8004 to issue an ASCII line feed character to the printer 8006 in the same format as the characters; that is, in serial EIA standard format at the same rate, such as the 110 baud rate. The CARRIAGE RETURN COMMAND, provided via path 1017 from microprocessor 6000, preferably causes the interface 8004 to issue an ASCII carriage return character to the printer 8006 in the same format as the characters. The SPACE COMMAND, provided via path 1019 from the microprocessor 6000, preferably causes the interface 8004 to issue an ASCII space character to the printer 8006 in the same format as the characters. The 32/64 CHARACTER COMMAND, provided via path 1021 from microprocessor 6000 to interface 8004, preferably causes the interface 8004 to write into its memory 1011 the correct number of characters. Thus, as will be described in greater detail hereinafter, the microprocessor 6000 can establish each printed page format.

Now describing the memory write mode for the interface 8004. When the interface 8004 receives a PRINTER WRITE COMMAND via path 1007, this signal is provided to the clock input of a flip-flop 1023 which is clocked to a set state. This causes a second flip-flop 1025 to subsequently be clocked to its set state by the first horizontal sync pulse occurring after flip-flop 1023 is clocked to its set state. When flip-flop 1025 is set, its Q or inverted output preferably resets or clears flip-flop 1023 via path 1023a. The set output of flip-flop 1025 preferably operates a conventional multiplexer 1027, such as a Texas Instruments SN74157N which is illustratively represented in FIG. 25 by further illustrating its various sections 1027a, 1027b, 1027c and 1027d as switches which are located in FIG. 25 in their appropriate functional positions for purposes of clarity. Thus, the operation of multiplexer 1027 preferably puts the interface 8004 into the write mode. Multiplexer section 1027d connects the horizontal sync pulse to the clock input of a conventional bit counter 1029 which will therefore advance one count for each TV line after the start of the write cycle. The write cycle preferably lasts for eight horizontal lines. During each of the eight horizontal lines, one bit from the main memory 1030 through 1042 of each character is preferably written into the buffer memory 1011. Thus, for example, for line one, no bit is selected; for line two, bit 7 for every character in line two is selected; for line three, bit 6 for every character in line three is selected; for line four, bit 5 for every character in line four is selected; for line five, bit 4 for every character in line five is selected; for line six, bit 3 for every character in line six is selected; for line seven, bit 2 for every character in line seven is selected; and for line eight, bit 2 for every character in line seven is again selected; however, it is inverted. A conventional bit select multiplexer 1031 preferably selects the appropriate main memory stage 1030 through 1042 line for each of the eight counts. During the first count, no line is selected if there are only 7 bits per character. During the second count, the memory line corresponding to the 7th bit is selected. This process continues for each line with the memory line for the second bit being selected on the seventh count. As was previously mentioned, on the eighth count the memory line for the second bit is again selected, but it is applied to multiplexer 1031 through an inverter 1033. The purpose of the above procedure is to preferably convert the standard 6 bit ASCII code from the main memory 1030 through 1042 into a 7 bit standard ASCII code which is used by the printer 8006, such conversion preferably being conventional. The output of multiplexer 1031 is preferably applied to the D input of a flip-flop 1035 which is clocked by the PRINTER LATCH CLOCK provided via path 1037 from gate 1094 (FIG. 14) and is preferably the same waveform that operates the character generator 570 (FIG. 14). Flip-flop 1035, as was previosuly mentioned, is a D flip-flop and, thus, the output follows the input but is delayed by an amount determined by the PRINTER LATCH CLOCK 1037. The purpose of flip-flop 1035 is to preferably provide a logic level which is stable for the full character period to the buffer memory 1011. The clocking of memory 1011 is preferably accomplished via R/W line 1039 through multiplexer section 1027a which is shown in the write position in FIG. 25, this signal being a clock signal provided by multiplexer 1041. The select inputs of multiplexer 1041 which are 1043a, 1043b, and 1043c, preferably select either a low or high level to provide a clock waveform via path 1039 with a period equal to a character period. The timing of the clock waveform 1039 is preferably such that data is clocked in memory 1011 after the data has been loaded into the flip-flop 1035. Memory 1011 is preferably a 1-by-1024 bit static random access memory. Thus, it preferably has one data input line and ten address lines with three of the address lines preferably being used for the bit address, allowing 8 bits per character, and six of the address lines preferably being used for the character address, allowing for up to 64 characters, one of these character address lines not being utlized when 32 character lines are to be printed as opposed to 64 character lines. The tenth address line is preferably not utilized. The bit address for memory 1011 preferably comes from the same bit counter 1029 that opperates the bit select multiplexer 1031, while the character address preferably comes from a pair of conventional character counters 1045 and 1047. During the write mode of operation, the character counters 1045 and 1047 are preferably utilized simply as latches to store the character address for the main memory 1030 through 1042 and to apply it to the buffer memory 1011. The character address is strobed into the character counters 1045 and 1047 by the PRINTER LATCH CLOCK 1037. The load input to counters 1045 and 1047 is preferably held low during the write mode by flip-flop 1025. It should be noted that the bits need only be selected at the character rate not at the bit rate since a given bit number for each line in the character contains the same information to the character generator input for that character; therefore, for example, bit 1 provides the same bit 1 information for all nine lines; similarly bit 2 provides the same bit 2 information for all nine lines, etc., thus enabling the use of a lower speed circuit thereby slowing things down so that the printer can be operated at normal speed. Thus, the preferred system takes advantage of the eight-to-one differential between the bit and character rates such as, by way of example, in the 64 character mode the bit rate being 10.2 megahertz and the character rate being approximately 1.28 megahertz, while in the 32 character mode the bit rate being 5.1 megahertz and the character rate being approximately 0.64 megahertz. Summarizing the above described memory write cycle, this cycle starts with the bit counter 1029 preferably set for bit 1 which corresponds to count 0, the character counters 1045 and 1047 addressing characters 1 through 32 or 1 through 64 and writing all zeros into memory 1011. At the start of the next TV line, the bit address out of counter 1029 is advanced by one and the character counters 1045 and 1047 again address characters 1 through 32 or 1 through 64 depending on whether it is in a 32 character mode or a 64 character mode and write bit 7 into memory 1011. This preferably continues through eight counts or bits of the bit counter 1029, writing bits 6, 5, 4, 3, and 2 into memory 1011 as the line changes. At the beginning of the ninth TV line, the D output of bit counter 1029 preferably goes high to the K input of flip-flop 1025 causing flip-flop 1025 to be reset at the trailing edge of the horizontal sync pulse. The resetting of flip-flop 1025 thereby terminates the write mode with flip-flop 1023 having previously been reset after flip-flop 1025 was set.

Now describing the output mode, which with reference to FIG. 25 is a mode in which all multiplexer sections or switches are set at the R or read position, all of these sections or switches being at the W or write position in the write mode. The output mode preferably comprises the print mode, the line feed mode, the carriage return mode and the space mode. During the output mode, the bit clock is preferably generated by a conventional oscillator 1049 which preferably comprises a conventional integrated circuit oscillator such as an NE555V, which is set at a frequency of preferably 110 hertz for the 110 baud rate described above by way of example. This corresponds to a print rate of 10 characters per second using an 11 bit per character format. It should be noted, however, that the printer rate can be set at any desired value merely by changing the oscillator 1049 rate, although the presently preferred printer rate is 110 baud. An 11 bit format preferably consists of one start bit, 7 character bits, one parity bit, which is preferably not utilized, and 2 stop bits. During the output mode, multiplexer 1027 is preferably not activated and the output of oscillator 1049 is preferably applied through multiplexer section 1027d to the clock input of bit counter 1029, which counter can preferably count up to 16 for the example given, although counter 1029 preferably operates in a count 11 mode. Thus, preferably when the output of counter 1029 is equal to binary 10, a gate 1051 connected thereto acts as a decoder and applies a negative level to the clear input of counter 1029 through a two input NOR gate 1053 whose other input is connected to the J output of J-K flip-flop 1025. Preferably, counter 1029 has a synchronous clear so that it is cleared to zero on the next clock following count 11. In addition, during the output mode, counter 1029 preferably establishes the bit sequence of the serial line to the printer 8006 with the counter 1029 count value 0, corresponding to count one, establishing the printer start bit and with counter values 1 through 7, corresponding to count 2 through 8, establishing the data bits, count values 9 and 10, corresponding to counts 10 and 11, establishing the printer stop bits, and with count value 8, corresponding to count 9, preferably not being utilized.

With reference to the print mode, microprocessor 6000 preferably initiates a print cycle, as was previously mentioned, by pulsing line 1013. This pulse, provided via path 1013, is the PRINT COMMAND and clocks a flip-flop 1055 to its set state. The set output of flip-flop 1055 is preferably applied to the enable inputs P and T of character counter 1045 which then advances when clocked by the D output of bit counter 1029. Thus, character counter 1045 advances at count value 8 of the bit counter 1029 which is the D output of counter 1029. As a result, the memory 1011 is addressed sequentially through the bit and character values that constitute one row. Thus, the output of memory 1011 is a serial bit stream when bits 1 through 8 of character 1 first appear with bits 1 through 8 of subsequent characters following. In each case, bit 1 is a zero level and bits 2 through 8 are the bit values of the character retrieved from memory 1011. The output of memory 1011 is preferably applied to one input of a two input NOR gate 1057, the other input thereto preferably being provided from the reset output of flip-flop 1055 which is low during the print mode. Thus the output of gate 1057 is the inverted bit stream from memory 1011, this inverted bit stream preferably being applied to one input of a negative NAND gate 1059, the other input thereto being low during the print mode so that the non-inverted bit stream is present at the output of gate 1059. The output of gate 1059 is provided as one input to a two input NOR gate 1061, the other input thereto being the D output of bit counter 1029 which is preferably high during bits 9, 10 and 11. Thus, the output of gate 1061 is inverted data including the printer start bit during bits 1 through 8, but is a steady low level during bits 9, 10 and 11. The output of gate 1061 is preferably inverted by an inverter 1063 to provide the final serial output through a level changer 1065 to the printer 8006. The output of inverter 1063 preferably has a high level during bit 1, which is the printer start bit, and follows the data during bits 2 through 8, with this output being low during bits 9, 10 and 11. This corresponds to the prescribed preferred EIA format for a 0 start bit and two 1 start bits. Level changer 1065, which is also a line driver, preferably generates an output signal such as, by way of example, with +12 volts representing binary 0 and −12 volts representing binary 1, these levels being prescribed by the EIA serial line interface standard. At the end of the row, a decoder 1067 preferably provides a negative level to reset flip-flop 1055 with the decoder 1067 preferably being programmed via line or path 1021 from the microprocessor 6000 by setting the appropriate input levels to provide a negative output in the case of a 64 character format at count value 64, which is at the beginning of count 65 of the character counter 1047, and to provide a negative output in the 32 character mode at count value 32, which is at the beginning of count 33 of character counter 1047. This resetting of flip-flop 1055 preferably terminates the print mode.

The microprocessor 6000 can also preferably command a single special function character such as for example LINE FEED, CARRIAGE RETURN or SPACE. Preferably, if the microprocessor 6000 wants a repeated special function character, it must recommand the character after adequate time, such as for example, 0.1 seconds for a 110 baud rate, has elapsed for the first special function character to have been issued to the printer 8006. A multiplexer 1069, such as a Texas Instruments SN74151AN, is provided which preferably functions as a programable character generator to provide the proper bit sequence that corresponds to the special character which has been requested. The microprocessor 6000 commands a line feed preferably by pulsing line 1015 with the LINE FEED COMMAND. This clears flip-flop 1071 which is normally in a set state with flip-flop 1071 setting a low level at bit input 2 of multiplexer 1069 via path 1071a, and also sets bit input 4 low via NOR gate 1072, all other bit inputs to multiplexer 1069 preferably being high. Multiplexer 1069 preferably sequentially switches the bit inputs 0 through 7 to the output Y under control of the inputs A, B, C from bit counter 1029. As a result, a serial output is applied from multiplexer 1069 to one input of gate 1059. At this time, the other input to gate 1059 is preferably a steady low level so that the single character bit stream is provided to the NOR gate 1061. This bit stream is preferably combined with the stop bits and is applied to the output line to printer 8006 from level changer and line driver 1065 in the same manner as previously described with respect to the print mode. At the completion of one special character, flip-flop 1071 is preferably reset by the D output of bit counter 1029 via multiplexer section or switch 1027c, NAND gate 1073 and inverter 1075, with the output of inverter 1075 preferably being connected in parallel to also provide the character clock for the microprocessor 6000. This preferably completes a line feed cycle.

When a CARRIAGE RETURN COMMAND is requested by the microprocessor 6000, it pulses line 1017 and clears flip-flop 1077 which then sets bit input numbers 1, 3 and 4 low to multiplexer 1069, multiplexer 1069 then generating a single character return ASCII code in the manner as previously described with respect to the LINE FEED code. Flip-flop 1077 is also preferably reset in the same manner as previously described with respect to the LINE FEED by the next character clock from inverter 1075.

When the microprocessor 6000 commands a space by providing the SPACE COMMAND by pulsing line 1019, flip-flop 1079 is cleared which then sets bit input number 6 low to multiplexer 1069 causing multiplexer 1069 to then generate a single space ASCII code in the same manner as previously described with respect to LINE FEED. Flip-flop 1079 is also preferably reset in the same manner as previously described with respect to LINE FEED by the next character clock provided from inverter 1075.

It should be noted that preferably the character counters 1045 and 1047 are cleared during either a line feed or carriage return by the low level from NOR gate 1072. Thus, one row cannot follow another to printer 8006 unless a LINE FEED or CARRIAGE RETURN is issued. However, normally microprocessor 6000 will generate such a CARRIAGE RETURN and LINE FEED between each row. Thus, the interface 8004 enables the microprocessor 6000 to make the following types of decisions: what row to be printed, how many rows, whether to print a 32 or 64 character row, how much marginal space for the row and whether or not extra spaces are to be placed between rows. These decisions are based on keyboard inputs from the operator provided to the microporcessor 6000, and inputs from the transmitted data in the form of special characters, directed messages or override messages provided to the microprocessor 6000. Due to all of the above, the computer/printer interface 8004 enables a system to have the following capabilities: the operator can print a complete page of displayed information or any selected row or group of rows of displayed information; it provides the capability to print an override message, such as an emergency message, without operator involvement as is also true with respect to a directed message; it permits the operator to select a special print mode wherein a row or page which he has selected will be reprinted whenever data on the selected row or page is changed with operator involvement not being required after initial selection of the mode, this operation being activated by a one time per update special character on the updated row; and special messages such as override messages can be emphasized by using extra line feeds between rows.

Figure 29:
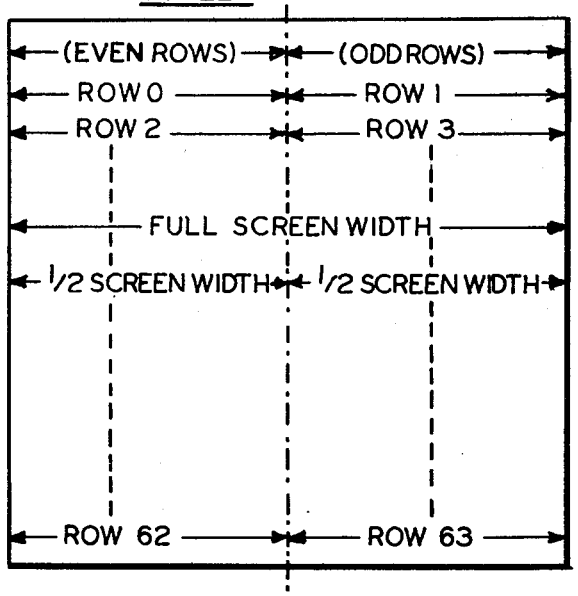
FIG. 29 is a diagrammatic illustration of a video display screen for providing 32 and/or 64 character display selection.
Figure 30:
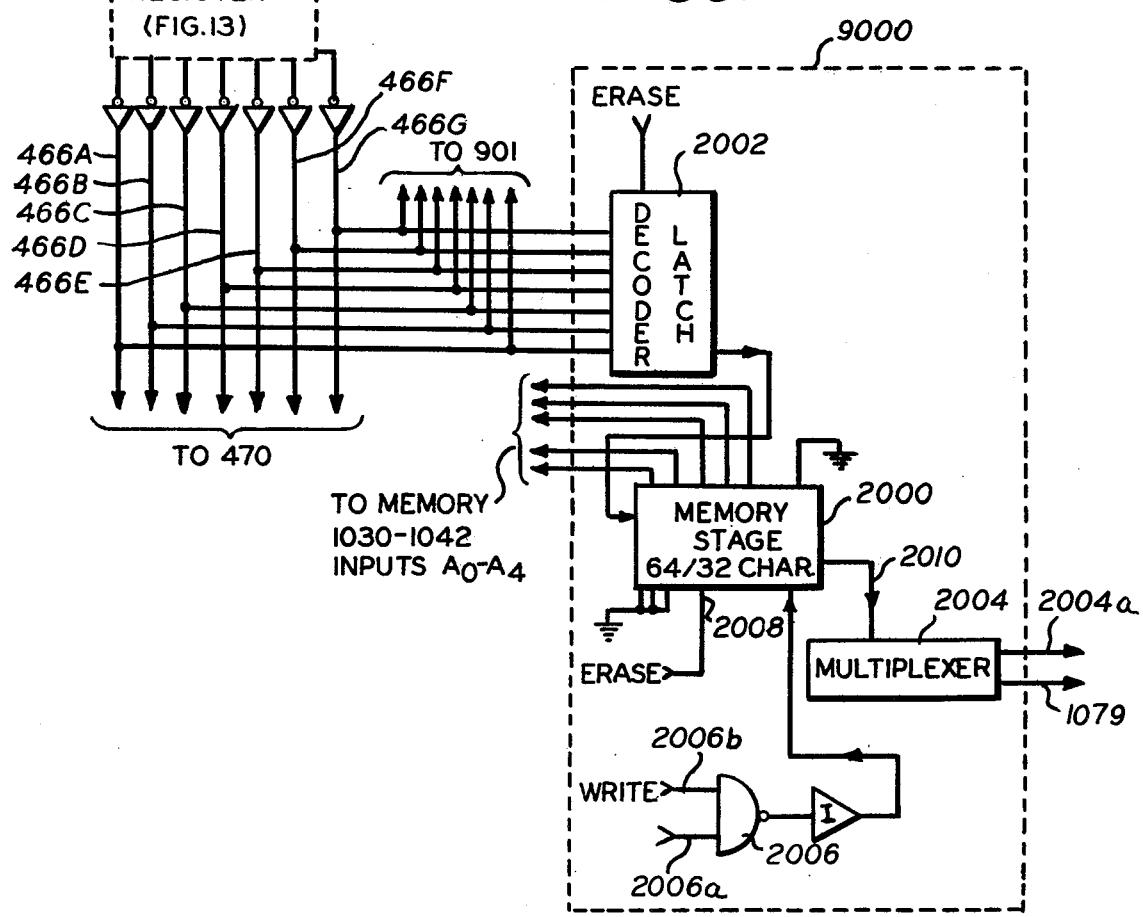
FIG. 30 is a fragmentary block diagram, partially in schematic, of an additional portion of the memory and output processing portion of the receiver illustrated in FIG. 13 for providing 32 and/or 64 character selection.

Lastly, referring now to FIGS. 29 and 30, with FIG. 30 being a modification to a portion of FIG. 13, a preferred circuit 9000 for providing a row-by-row determination of 64 character or 32 character display of a row in the system of the present invention shall be described. This circuit 9000 may be omitted without departing from the spirit and scope of the present invention if such row-by-row determination of 64 or 32 character display is not desired. As shown and preferred in FIG. 29, assuming such a 64 or 32 character row-by-row determination is desired, the display screen for the display device 2013 is preferably considered as comprising two half screen widths with the left hand half of the screen preferably displaying even rows which are rows 0 through 62, and with the right hand half of the screen preferably displaying odd rows, which are rows 1 through 63. It should be noted that during normal display as previously described, a row is defined as being contained in the full screen width; however, in the instance of a row-by-row determination of 64 or 32 character display, it is preferable to consider half of the screen as comprising a row with each row in this instance comprising half a message for the pseudo video scan line. Preferably, in determining whether to provide a 32 or 64 character display for a given row, if 32 characters are contained in the even row, that is rows 0, 2, 4, 6, etc., up to row 62, then only the even row is displayed for the full screen width irrespective of the presence of an odd row in memory. If, however, there are 64 characters contained in the even row, then both the odd and the even row are displayed. In the preferred circuit arrangement 9000, no weight is given to the presence of a 64 or 32 character bit in the odd row, only the presence of this bit in the even row being considered. As will further be explained in greater detail, the control of the clock rate determines whether a 32 character or 64 character row is displayed, the memory being read twice as fast for display of a 64 character row as for a normal 32 character row, although the write speed for both a 32 and a 64 character row is the same because of the same speed of transmission in the preferred system of the present invention which receives row-by-row or pseudo video scan line-by-pseudo video scan line. In the system described in our previous U.S. Pat. No. 3,889,054, the 32 or 64 character determination was based on a page-by-page basis and each row had to have a 32 character or 64 character bit according to the page sent or the display screen would flash between 32 character and a 64 character display effecting the readability of the display. As shown and preferred in FIG. 30, the memory 1030 through 1042 preferably includes another memory stage 2000 for purposes of determining whether the row is to be a 64 or 32 character row display, memory 2000 only looking at the row position and not at the character position. Preferably, the even row message which is contained in row 0, 2, etc., through row 62, includes the 64/32 character bit. When the characters are loaded into memory 1030 through 1042 for the even row, from shift register 466 (FIG. 13), a decoder latch 2002 preferably decodes the 64/32 character bit which is then loaded or written into memory stage 2000. The row position in memory stage 2000 is determined by row latch 470 through multiplexer 1020. The character position of memory stage 2000 is preferably ignored. On read out, the 64/32 character bit from memory stage 2000 is then preferably read into multiplexer 2004 which then makes a switch connection to gate 1090 (FIG. 14) via path 2004a (FIG. 14) and to divide-by-eight counter 1080 via path 1079 (FIG. 14) to double the clock frequency of the prime clock to provide for the 64 character row by proper timing. For a 32 character row, multiplexer switch 2004 is left in the normal position with no output being provided via 2004a and 1079 which, as shown in FIG. 14, are in the 32 character position, so that only the prime clock non-doubled output is provided for 32 character row timing.

Now describing the adjacent odd row message gating although if desired, the odd row gating can be omitted if the odd row is not transmitted with a 32/64 character bit. Furthermore, the 32/64 character bit in the odd row message can be discarded in other conventional ways than to be described hereinafter if desired. As shown and preferred, when the odd bit of row latch 470 through multiplexer 1020 is on, indicating the presence of an odd row, which information is provided via path 2006a to a two input NAND gate 2006, and the system is loading or writing into memory 1030 through 1042 and stage 2000, as indicated by the presence of a write signal via path 2006b to gate 2006, the memory location for the odd row in memory stage 2000 is preferably changed to an unused memory location and the output of memory stage 2000 to multiplexer switch 2004 remains the same as for the previous even row message in that line. The ignoring of the first bit in the digital output of multiplexer 1020 (FIG. 13) will always provide the even row input to memory stage 2000. This is accomplished by preferably grounding the first bit row input to memory stage 2000 from multiplexer 1020. In order to ignore the 64/32 character bit when reading the odd row, then when writing the odd row, the 32/64 character bit is preferably put in an unused location by enabling this unused location in memory stage 2000 through gate 2006 whose input is the first bit position from row latch register 470, which is always preferably a 1 for the odd numbers and a 0 for the even numbers. Therefore, gate 2006 is enabled only when the input provided via path 2006a is a 1 and the write mode, also indicated by a 1, is provided via 2006b or, in other words, only for an odd row.

Lastly, discussing erase of memory stage 2000, when the normal erase is provided to the memory 1030 through 1042, preferably a common space character is put in all positions of the memory. When the 64 character row is erased, in order to insure that this row remains a 64 character row or, similarly, for a 32 character row, in order to insure it remains a 32 character row, in erasing the memory location in memory stage 2000 this memory location is positioned to an unused location without erasing the previously loaded memory bit 2010 from memory stage 2000, the erase signal via path 2008 together with the row input determining the location in memory 2000.

It should be noted that the description of the balance of the circuitry disclosed herein relating to the row grabbing system 10 which is common to our previous U.S. Pat. No. 3,889,054, and which has not been repeated herein, is specifically incorporated by reference herein and the identical reference numerals therefor are utilized herein for clarity. Furthermore, any other disclosed circuitry not specifically described in detail herein is conventional and readily understandable by one of ordinary skill in the art without further explanation and, accordingly, will not be described in further detail. In addition, it is to be understood that all logic described herein is conventional unless otherwise specified.

By utilizing the improved row grabbing system of the present invention in which grabbed frames may be updated on a row-by-row basis, conventional television transmission techniques and distribution equipment can be utilized for transmission and reception of data which has been packed into pseudo video scan lines which look like a conventional TV scan line to television equipment but contain a complete packet of information suitable for display of an entire row of video information with enhanced noise immunity to any jitter or noise present on each received pseudo video scan line being processed as well as clock phase correction for the receiver terminal on every data transition of the received pseudo video scan line whereby the received information will be essentially noise insensitive. Furthermore, by utilizing the preferred distortion compensation circuit of the present invention, both zero-to-one and one-to-zero transition signal distortions in which the zeroes and/or ones of an input digital signal, such as a pseudo video scan line, do not always return to the same level, can be compensated for to provide a compensated output digital signal in which all ones and all zeroes are of the same respective levels.

It is to be understood that the above described embodiments of the invention are merely illustrative of the principles thereof and that numerous modifications and embodiments of the invention may be derived within the spirit and scope thereof.

What is claimed is:

1. A phase locked loop apparatus for providing a continuous output digital clock signal having first and second states which is continuously phase locked to a reference digital data signal, said digital data signal comprising at least one data transition, said apparatus comprising variable voltage controlled oscillator means having a predetermined variable nominal frequency, said voltage controlled oscillator means having an input and an output and providing said output digital clock signal at said output thereof; bistable phase detection means having a pair of inputs for varying the state of said bistable phase detection means between a first and second state, said bistable means having a first control signal output in said first state thereof and a second control signal output in a second state thereof, one input of said bistable means being connected in parallel to said voltage controlled oscillator means output for detecting said clock signal output, the other input of said bistable means being connected to substantially simultaneously detect said reference digital data signal, said bistable phase detection means being responsive to said state of said clock signal and the occurrence of said at least one data transition in said substantially simultaneously detected digital data signal for varying said bistable means state, said bistable means being in said first state in response to the substantially simultaneous detection of said clock signal first state and said digital data transition and in said second state in response to the substantially simultaneous detection of said clock signal second state and said digital data transition for providing a change in said bistable means control signal output only when the phasing of said clock signal changes with respect to the phasing of said data signal, said first bistable means output control signal being indicative of a phase lead condition between said clock signal and said data signal and said second bistable means output control signal being indicative of a phase lag condition between said clock signal and said data signal, and means operatively connected between said bistable means first and second control signal outputs and said oscillator means input for providing a control voltage signal to said oscillator means input to vary said nominal frequency thereof in response to said bistable means provided control signal output for maintaining said continuous phase lock, said control voltage signal providing means comprising a capacitive means having a variable voltage signal output therefrom, said capactive means being responsive to one of said control signal outputs for charging to increase said capacitive means voltage signal output in response thereto and being responsive to said other one of said control signal outputs for discharging to decrease said capacitive means voltage signal output in response thereto, said respective charging and discharging of said capacitive means to vary said voltage signal output thereof occurring as long as said phase condition associated with said respective control signal output remains, said voltage signal output comprising said control voltage signal, said control signal providing means further comprising diode means operatively connected between said capacitive means and said bistable means control signal outputs for providing respective charge and discharge paths for said capacitive means in response to said respective first and second control signal outputs.

2. A phase locked loop apparatus in accordance with claim 1 wherein said digital data signal has a valid data duration during which valid data is transmitted, said apparatus further comprising gating means operatively connected between said bistable means control signal outputs and said diode means for gating said respective bistable means first and second control signal outputs to said diode means only during said valid data duration.

3. A phase locked loop apparatus in accordance with claim 1 wherein said phase differential varies between a relatively small leading angle and a relatively small lagging angle sufficient to maintain a substantially constant voltage on said capacitive means, said apparatus further comprising amplifier means operatively connected between said capacitive means voltage signal output and said oscillator means input for providing said amplified voltage signal output to said oscillator means at said control signal voltage.

4. A phase locked loop apparatus for providing a continuous output digital clock signal having first and second states which is continuously phase locked to a reference digital data signal, said digital data signal comprising a plurality of data transitions, said apparatus comprising variable voltage controlled oscillator means having a predetermined variable nominal frequency, said voltage controlled oscillator means having an input and an output and providing said output digital clock signal at said output thereof; bistable phase detection means having a pair of inputs for varying the state of said bistable phase detection means between a first and second state, said bistable means having a first control signal output in said first state thereof and a second control signal output in a second state thereof, one input of said bistable means being connected in parallel to said voltage controlled oscillator means output for detecting said clock signal output, the other input of said bistable means being connected to substantially simultaneously detect said reference digital data signal, said bistable phase detection means being responsive to said state of said clock signal and the occurrence of every data transition in said plurality thereof in said substantially simultaneously detected digital data signal for varying said bistable means state and providing said respective first or second control signal outputs in response to the respective substantially simultaneous detection of each of said data transitions and said clock signal state, whereby said apparatus utilizes every data transition to continuously correct said clock phase, said bistable means being in said first state in response to the substantially simultaneous detection of said clock signal first state and said digital data transition and in said second state in response to the substantially simultaneous detection of said clock signal second state and said digital data transition for providing a change in said bistable means control signal output only when the phasing of said clock signal changes with respect to the phasing of said data signal, said first bistable means output control signal being indicative of a phase lead condition between said clock signal and said data signal and said second bistable means output control signal being indicative of a phase lag condition between said clock signal and said data signal, and means operatively connected between said bistable means first and second control signal outputs and said oscillator means input for providing a control voltage signal to said oscillator means input to vary said nominal frequency thereof in response to said bistable means provided control signal output for maintaining said continuous phase lock.

5. A phase locked loop apparatus for providing a continuous output digital clock signal having first and second states which is continuously phase locked to a reference digital data signal, said digital data signal comprising at least one data transition, said apparatus comprising variable voltage controlled oscillator means having a predetermined variable nominal frequency, said voltage controlled oscillator means having an input and an output and providing said output digital clock signal at said output thereof; bistable phase detection means having a pair of inputs for varying the state of said bistable phase detection means between a first and second state, said bistable means having a first control signal output in said first state thereof and a second control signal output in a second state thereof, one input of said bistable means being connected in parallel to said voltage controlled oscillator means output for detecting said clock signal output, the other input of said bistable means being connected to substantially simultaneously detect said reference digital data signal, said bistable phase detection means being responsive to said state of said clock signal and the occurrence of at least one zero-to-one data transition in said substantially simultaneously detected digital data signal for varying said bistable means state, said bistable means being in said first state in response to the substantially simultaneous detection of said clock signal first state and said digital data transition and in said second state in response to the substantially simultaneous detection of said clock signal second state and said digital data transition for providing a change in said bistable means control signal output only when the phasing of said clock signal changes with respect to the phasing of said data signal, said first bistable means output control signal being indicative of a phase lead condition between said clock signal and said data signal and said second bistable means output control signal being indicative of a phase lag condition between said clock signal and said data signal, and means operatively connected between said bistable means first and second control signal outputs and said oscillator means input for providing a control voltage signal to said oscillator means input to vary said nominal frequency thereof in response to said bistable means provided control signal output for maintaining said continuous phase lock.

6. A phase locked loop apparatus for providing a continuous output digital clock signal having first and second states which is continuously phase locked to a reference digital data signal, said digital data signal comprising at least one data transition, said apparatus comprising variable voltage controlled oscillator means having a predetermined variable nominal frequency, said voltage controlled oscillator means having an input and an output and providing said output digital clock signal at said output thereof; bistable phase detection means having a pair of inputs for varying the state of said bistable phase detection means between a first and second state, said bistable means comprising flip-flop means having a first control signal output in said first state thereof and a second control signal output in a second state thereof, one input of said bistable means being connected in parallel to said voltage controlled oscillator means output for detecting said clock signal output, the other input of said bistable means being connected to substantially simultaneously detect said reference digital data signal, said bistable phase detection means being responsive to said state of said clock signal and the occurrence of said at least one data transition in said substantially simultaneously detected digital data signal for varying said bistable means state, said bistable means being in said first state in response to the substantially simultaneous detection of said clock signal first state and said digital data transition and in said second state in response to the substantially simultaneous detection of said clock signal second state and said digital data transition for providing a change in said bistable means control signal output only when the phasing of said clock signal changes with respect to the phasing of said data signal, said first bistable means output control signal being indicative of a phase lead condition between said clock signal and said data signal and said second bistable means output control signal being indicative of a phase lag condition between said clock signal and said data signal, and means operatively connected between said bistable means first and second control signal outputs and said oscillator means input for providing a control voltage signal to said oscillator means input to vary said nominal frequency thereof in response to said bistable means provided control signal output for maintaining said continuous phase lock.

7. A phase locked loop apparatus in accordance with claim 6 wherein said flip-flop means has a set state and a reset state, said set state being said first state and said reset state being said second state thereof.

8. A phase locked loop apparatus in accordance with claim 7 wherein said flip-flop means comprises a D-type flip-flop means having a D input, a clock input, a set state output and a reset state output, said D and clock inputs comprising said pair of inputs, said first control signal output being provided from said set state output, said second control signal output being provided from said reset state output, said oscillator means output being connected in parallel to said D input and said clock input being connected to substantially simultaneously detect said digital data signal.

9. A phase locked loop apparatus for providing a continuous output digital clock signal having first and second states which is continuously phase locked to a reference digital data signal, said digital data signal comprising a digital video signal having at least one data transition, said apparatus comprising variable voltage controlled oscillator means having a predetermined variable nominal frequency, said voltage controlled oscillator means having an input and an output and providing said output digital clock signal at said output thereof; bistable phase detection means having a pair of inputs for varying the state of said bistable phase detection means between a first and second state, said bistable means having a first control signal output in said first state thereof and a second control signal output in a second state thereof, one input of said bistable means being connected in parallel to said voltage controlled oscillator means output for detecting said clock signal output, the other input of said bistable means being connected to substantially simultaneously detect said reference digital data signal, said bistable phase detection means being responsive to said state of said clock signal and the occurrence of said at least one data transition in said substantially simultaneously detected digital data signal for varying said bistable means state, said bistable means being in said first state in response to the substantially simultaneous detection of said clock signal first state and said digital data transition and in said second state in response to the substantially simultaneous detection of said clock signal second state and said digital data transition for providing a change in said bistable means control signal output only when the phasing of said clock signal changes with respect to the phasing of said data signal, said first bistable means output control signal being indicative of a phase lead condition betweem said clock signal and said data signal and said second bistable means output control signal being indicative of a phase lag condition between said clock signal and said data signal, and means operatively connected between said bistable means first and second control signal outputs and said oscillator means input for providing a control voltage signal to said oscillator means input to vary said nominal frequency thereof in response to said bistable means provided control signal output for maintaining said continuous phase lock.

10. A phase locked loop apparatus in accordance with claim 9 wherein said digital video signal comprises a pseudo video scan line having a television video scan line format and capable of comprising a complete self-contained packet of digital information sufficient to provide an entire displayable row of video data characters on a video display means, said psuedo video scan line having an associated transmisson time equivalent to said television video scan line, said packet of digital information comprising at least address information for said displayable row and data information for said displayable characters in said displayable row, said pseudo video scan lines further comprising a horizontal sync signal at the beginning thereof and a start bit pulse between said horizontal sync signal and said packet of digital information, said horizontal sync signal providing a record separator between adjacent pseudo video scan lines provided to said apparatus, said start bit comprising said data transition, whereby said apparatus will make at least a single phase correction each pseudo video scan line utilizing said start bit to insure that phase lock exists at the beginning of the first pseudo video scan line containing said data information.

11. A phase locked loop apparatus in accordance with claim 9 wherein said digital video signal comprises a pseudo video scan line having a television video scan line format and capable of comprising a complete self-contained packet of digital information sufficient to provide an entire displayable row of video data characters on a video display means, said pseudo video scan line having an associated transmission time equivalent to said television video scan line, said packet of digital information comprising at least address information for said displayable row and data information for said displayable characters in said displayable row, said data information comprising a plurality of said data transitions, said bistable means being responsive to every data transition in said plurality thereof for providing said respective first or second control signal outputs in response to the respective substantially simultaneous detection of each of said data transitions and said clock signal state, whereby said apparatus utilizes every data transition to continuously correct said clock phase.

12. A phase locked loop apparatus in accordance with claim 11 wherein said pseudo video scan line further comprises a horizontal sync signal at the beginning thereof for providing a record separator between adjacent pseudo video scan lines provided to said apparatus, said pseudo video scan line having a valid data duration during which valid data information is transmitted, said duration being said associated transmission time and being initiated at said horizontal sync signal, said apparatus further comprising gating means operatively connected between said bistable means control signal outputs and said control voltage signal providing means for gating said respective bistable means first and second control signal outputs to said control voltage signal providing means only during said valid data duration.

13. In a real time frame grabbing video display terminal for substantially instantaneously providing a continuous direct video display of a selectable predetermined video frame of information on a video display means from continuously receivable information remotely provided over a transmission media, said continuously receivable information comprising a plurality of pseudo video scan lines, each of said pseudo video scan lines having a television video scan line format and capable of comprising a complete self-contained packet of digital information sufficient to provide an entire displayable row of video data characters, said pseudo video scan line having an associated transmission time equivalent to said television video scan line, said packet of digital information comprising at least address information for said displayable row and data information for said displayable characters in said displayable row, said pseudo video scan line being a composite video signal, said terminal comprising microcomputer means for controlling the operation thereof, said microcomputer means being operatively connected to said transmission media for receiving said continuously receivable information and selection means operatively connected to said microcomputer means for variably selecting said predetermined video frame to be continuously displayed; the improvement comprising a phase locked loop apparatus for providing a continuous output digital clock signal having first and second states which is continuously phase locked to a reference digital data signal, said pseudo video scan line comprising said digital data signal, said pseudo video scan line comprising at least one data transition, said apparatus comprising variable voltage controlled oscillator means having a predetermined variable nominal frequency, said voltage controlled oscillator means having an input and an output and providing said output digital clock signal at said output thereof; bistable phase detection means having a pair of inputs of varying the state of said bistable phase detection means between a first and a second state, said bistable means having a first control signal output in said first state thereof and a second control signal output in a second state thereof, one input of said bistable means being connected in parallel to said voltage controlled oscillator means output for detecting said clock signal output, the other input of said bistable means being connected to substantially simultaneously detect said pseudo video scan line, said bistable phase detection means being responsive to said state of said clock signal and the occurrence of said at least one data transition in said substantially simultaneously detected pseudo video scan line for varying said bistable means state, said bistable means being in said first state in response to the substantially simultaneous detection of said clock signal first state and said data transition and in said second state in response to the substantially simultaneous detection of said clock signal second state and said data transition for providing a change in said bistable means control signal output only when the phasing of said clock signal changes with respect to the phasing of said pseudo video scan line, said first bistable means output control signal being indicative of a phase lead condition between said clock signal and said pseudo video scan line and said second bistable means output control signal being indicative of a phase lag condition between said clock signal and said pseudo video scan line; and means operatively connected between said bistable means first and second control signal outputs and said oscillator means input for providing a control voltage signal to said oscillator means input to vary said nominal frequency thereof in response to said bistable means provided control signal output for maintaining said continuous phase lock.

14. An improved terminal in accordance with claim 13 wherein each of said pseudo video scan lines further comprises a horizontal sync signal at the beginning thereof and a start bit pulse between said horizontal sync signal and said packet of digital information, said horizontal sync signal providing a record separator between adjacent pseudo video scan lines provided to said apparatus, said start bit comprising said data transition, whereby said apparatus will make at least a single phase correction each pseudo video scan line utilizing said start bit to insure that phase lock exists at the beginning of the first pseudo video scan line containing said data information.

15. A phase locked loop apparatus in accordance with claim 13 wherein said data information comprises a plurality of said data transitions, said bistable means being responsive to every data transition in said plurality thereof for providing said respective first or second control signal outputs in response to the respective substantially simultaneous detection of each of said data transitions and said clock signal state, whereby said apparatus utilizes every data transition to continuously correct said clock phase.

16. A phase locked loop apparatus in accordance with claim 15 wherein said pseudo video scan line further comprises a horizontal sync signal at the beginning thereof for providing a record separator between adjacent pseudo video scan lines provided to said apparatus, said pseudo video scan line having a valid data duration during which valid data information is transmitted, said duration being said associated transmission time and being initiated at said horizontal sync signal, said apparatus further comprising gating means operatively connected between said bistable means control signal outputs and said control voltage signal providing means for gating said respective bistable means first and second control signal outputs to said control voltage signal providing means only during said valid data duration.

17. In a real time frame grabbing system for substantially instantaneously providing a continuous video display of a selectable predetermined video frame of information on a video display means from continuously transmittable video information comprising means for transmitting said video information as a plurality of pseudo video scan lines, each of said pseudo video scan lines having a television video scan line format and capable of comprising a complete self-contained packet of digital information sufficient to provide an entire displayable row of video data characters, said pseudo video scan line having an associated transmission time equivalent to said television video scan line, said packet of digital information comprising at least address information for said displayable row and data information for said displayable characters in said displayable row, each of said pseudo video scan lines further comprising a horizontal sync signal at the beginning thereof, said horizontal sync signal providing a record separator between adjacent pseudo video scan lines, said transmitting means further comprising means for providing a vertical sync signal after a predetermined plurality of pseudo video scan lines have been transmitted, said pseudo video scan line being a composite video signal, said system further comprising television signal distribution means for distributing said transmitted composite pseudo video scan line signals to said video display means for providing said continuous video display and receiver means operatively connected between said television signal distribution means and said video display means for processing said distributed composite pseudo video scan line signals and capable of providing a displayable video row signal to said video display means from each of said pseudo video scan line signals pertaining to said selected frame for providing said continuous video display; the improvement comprising a phase locked loop apparatus for providing a continuous output digital clock signal having first and second states which is continuously phase locked to a reference digital data signal, said receiver means comprising said phase locked loop apparatus, said pseudo video scan line comprising said digital data signal, said pseudo video scan line comprising at least one data transition, said apparatus comprising variable voltage controlled oscillator means having a predetermined variable nominal frequency, said voltage controlled oscillator means having an input and an output and providing said output digital clock signal at said output thereof; bistable phase detection means having a pair of inputs for varying the state of said bistable phase detection means between a first and a second state, said bistable means having a first control signal output in said first state thereof and a second control signal output in a second state thereof, one input of said bistable means being connected in parallel to said voltage controlled oscillator means output for detecting said clock signal output, the other input of said bistable means being connected to substantially simultaneously detect said pseudo video scan line, said bistable phase detection means being responsive to said state of said clock signal and the occurrence of said at least one data transition in said substantially simultaneously detected pseudo video scan line for varying said bistable means state, said bistable means being in said first state in response to the substantially simultaneous detection of said clock signal first state and said data transition and in said second state in response to the substantially simultaneous detection of said clock signal second state and said data transition for providing a change in said bistable means control signal output only when the phasing of said clock signal changes with respect to the phasing of said pseudo video scan line, said first bistable means output control signal being indicative of a phase lead condition between said clock signal and said pseudo video scan line and said second bistable means output control signal being indicative of a phase lag condition between said clock signal and said pseudo video scan line; and means operatively connected between said bistable means first and second control signal outputs and said oscillator means input for providing a control voltage signal to said oscillator means input to vary said nominal frequency thereof in response to said bistable means provided control signal output for maintaining said continuous phase lock.

18. An improved system in accordance with claim 17 wherein each of said pseudo video scan lines further comprises a horizontal sync signal at the beginning thereof and a start bit pulse between said horizontal sync signal and said packet of digital information, said horizontal sync signal providing a record separator between adjacent pseudo video scan lines provided to said apparatus, said start bit comprising said data transition, whereby said apparatus will make at least a single phase correction each pseudo video scan line utilizing said start bit to insure that phase lock exists at the beginning of the first pseudo video scan line containing said data information.

19. A phase locked loop apparatus in accordance with claim 17 wherein said data information comprises a plurality of said data transition, said bistable means being responsive to every data transition in said plurality thereof for providing said respective first or second control signal outputs in response to the respective substantially simultaneous detection of each of said data transitions and said clock signal state, whereby said apparatus utilizes every data transition to continuously correct said clock phase.

20. A phase locked loop apparatus in accordance with claim 19 wherein said pseudo video scan line further comprises a horizontal sync signal at the beginning thereof for providing a record separator between adjacent pseudo video scan lines provided to said apparatus, said pseudo video scan line having a valid data duration during which valid data information is transmitted, said duration being said associated transmission time and being initiated at said horizontal sync signal, said apparatus further comprising gating means operatively connected between said bistable means control signal outputs and said control voltage signal providing means for gating said respective bistable means first and second control signal outputs to said control voltage signal providing means only during said valid data duration.

* * * * *